(12) United States Patent
Lopata et al.

(10) Patent No.: US 9,536,938 B1
(45) Date of Patent: *Jan. 3, 2017

(54) SEMICONDUCTOR DEVICE INCLUDING A RESISTOR METALLIC LAYER AND METHOD OF FORMING THE SAME

(71) Applicant: Altera Corporation, San Jose, CA (US)

(72) Inventors: Douglas Dean Lopata, Boyertown, NJ (US); Jeffrey Demski, Orefield, PA (US); Jay Norton, Wind Gap, PA (US); Miguel Rojas-Gonzales, Bedminster, NJ (US)

(73) Assignee: Altera Corporation, San Jose, CA (US)

(*) Notice: Subject to any disclaimer, the term of this patent is extended or adjusted under 35 U.S.C. 154(b) by 10 days.

This patent is subject to a terminal disclaimer.

(21) Appl. No.: 14/671,956

(22) Filed: Mar. 27, 2015

Related U.S. Application Data

(63) Continuation-in-part of application No. 14/227,666, filed on Mar. 27, 2014, and a continuation-in-part of application No. 14/091,739, filed on Nov. 27, 2013.

(60) Provisional application No. 61/971,719, filed on Mar. 28, 2014.

(51) Int. Cl.
*H01L 27/06* (2006.01)
*H01L 49/02* (2006.01)

(52) U.S. Cl.
CPC ........... *H01L 28/20* (2013.01); *H01L 27/0629* (2013.01)

(58) Field of Classification Search
CPC .............. H01L 27/0207; H01L 23/528; H01L 23/5228; H01L 29/4238; H01L 29/42316; H01L 27/0629; H01L 27/0688; H01L 27/101; H01L 28/20
See application file for complete search history.

(56) References Cited

U.S. PATENT DOCUMENTS

| 4,761,725 A | 8/1988 | Henze |
| 4,918,026 A | 4/1990 | Kosiak et al. |
| 4,922,327 A | 5/1990 | Mena et al. |
| 4,947,192 A | 8/1990 | Hawkins et al. |

(Continued)

FOREIGN PATENT DOCUMENTS

| CN | 10409281 A | 4/2009 |
| EP | 2278345 A | 1/2011 |

(Continued)

OTHER PUBLICATIONS

Betancourt-Zamora, R.J. et al., "A 1.5 mW, 200 MHz CMOS VCO for Wireless Biotelemetry," First International Workshop on Design of Mixed-Mode Integrated Circuits and Applications, Cancun, Mexico, pp. 72-74, Jul. 1997.

(Continued)

*Primary Examiner* — Jose R Diaz
(74) *Attorney, Agent, or Firm* — Fletcher Yoder, P.C.

(57) ABSTRACT

A semiconductor device including a resistor metallic layer and method forming the same. In one embodiment, the semiconductor device includes a source region and a drain region of a semiconductor switch on a substrate. The semiconductor device also includes the resistor metallic layer over the source region and the drain region of the semiconductor switch. The resistor metallic layer includes a first resistor with a first resistor metallic strip coupled between a first cross member and a second cross member of the resistor metallic layer.

20 Claims, 38 Drawing Sheets

(56) References Cited

U.S. PATENT DOCUMENTS

| | | | |
|---|---|---|---|
| 4,982,353 A | 1/1991 | Jacob et al. | |
| 5,014,098 A | 5/1991 | Schlais et al. | |
| 5,029,283 A | 7/1991 | Ellsworth et al. | |
| 5,047,358 A | 9/1991 | Kosiak et al. | |
| 5,156,989 A | 10/1992 | Williams et al. | |
| 5,169,794 A | 12/1992 | Iranmanesh | |
| 5,264,782 A | 11/1993 | Newton | |
| 5,285,369 A | 2/1994 | Balakrishnan | |
| 5,321,319 A | 6/1994 | Mahmood | |
| 5,366,916 A | 11/1994 | Summe et al. | |
| 5,405,791 A | 4/1995 | Ahmad et al. | |
| 5,407,844 A | 4/1995 | Smayling et al. | |
| 5,469,334 A | 11/1995 | Balakrishnan | |
| 5,485,027 A | 1/1996 | Williams et al. | |
| 5,504,450 A | 4/1996 | McPartland | |
| 5,594,324 A | 1/1997 | Canter et al. | |
| 5,610,421 A | 3/1997 | Coneiero et al. | |
| 5,644,266 A | 7/1997 | Chen et al. | |
| 5,668,024 A | 9/1997 | Tsai | |
| 5,689,213 A | 11/1997 | Sher | |
| 5,710,054 A | 1/1998 | Gardner et al. | |
| 5,757,045 A | 5/1998 | Tsai et al. | |
| 5,833,585 A | 11/1998 | Jones et al. | |
| 5,859,606 A | 1/1999 | Schrader et al. | |
| 5,877,611 A | 3/1999 | Brkovic | |
| 5,888,861 A | 3/1999 | Chien et al. | |
| 5,889,315 A | 3/1999 | Farrenkopf et al. | |
| 5,899,732 A | 5/1999 | Gardner et al. | |
| 5,930,642 A | 7/1999 | Moore et al. | |
| 5,982,645 A | 11/1999 | Levran et al. | |
| 6,005,377 A | 12/1999 | Chen et al. | |
| 6,022,778 A | 2/2000 | Contiero et al. | |
| 6,118,351 A | 9/2000 | Kossives et al. | |
| 6,166,989 A | 12/2000 | Hamamoto et al. | |
| 6,204,542 B1 | 3/2001 | Kinoshita et al. | |
| 6,255,714 B1 | 7/2001 | Kossives | |
| 6,262,564 B1 | 7/2001 | Kanamori | |
| 6,271,063 B1 | 8/2001 | Chan et al. | |
| 6,285,539 B1 | 9/2001 | Kashimoto et al. | |
| 6,288,424 B1 | 9/2001 | Ludikhuize | |
| 6,297,108 B1 | 10/2001 | Chu | |
| 6,320,449 B1 | 11/2001 | Capici et al. | |
| 6,333,217 B1 | 12/2001 | Umimoto et al. | |
| 6,365,475 B1 | 4/2002 | Cheng et al. | |
| 6,380,004 B2 | 4/2002 | Boden, Jr. et al. | |
| 6,384,447 B2 | 5/2002 | Mihnea et al. | |
| 6,384,643 B1 | 5/2002 | Grose et al. | |
| 6,388,468 B1 | 5/2002 | Li | |
| 6,392,275 B1 | 5/2002 | Jang | |
| 6,407,579 B1 | 6/2002 | Goswick | |
| 6,413,806 B1 | 7/2002 | Sicard et al. | |
| 6,420,771 B2 | 7/2002 | Gregory | |
| 6,477,065 B2 | 11/2002 | Parks | |
| 6,495,019 B1 | 12/2002 | Filas et al. | |
| 6,521,960 B2 | 2/2003 | Lee | |
| 6,541,819 B2 | 4/2003 | Lotfi et al. | |
| 6,545,360 B1 | 4/2003 | Ohkubo et al. | |
| 6,550,666 B2 | 4/2003 | Chew et al. | |
| 6,573,694 B2 | 6/2003 | Pulkin et al. | |
| 6,650,169 B2 | 11/2003 | Faye et al. | |
| 6,653,174 B1 | 11/2003 | Cho et al. | |
| 6,688,985 B2 | 2/2004 | Weiss et al. | |
| 6,730,962 B2 | 5/2004 | Wu | |
| 6,744,676 B2 | 6/2004 | Leung et al. | |
| 6,765,272 B2 | 7/2004 | Natsume | |
| 6,791,305 B2 | 9/2004 | Imai et al. | |
| 6,822,882 B1 | 11/2004 | Jacobs et al. | |
| 6,833,585 B2 | 12/2004 | Kim et al. | |
| 6,855,985 B2 | 2/2005 | Williams et al. | |
| 6,873,017 B2 | 3/2005 | Cai et al. | |
| 6,879,137 B2 | 4/2005 | Sase | |
| 6,900,101 B2 | 5/2005 | Lin | |
| 6,900,482 B2 * | 5/2005 | Aoki | H01L 29/0692 257/256 |
| 6,911,694 B2 | 6/2005 | Negro et al. | |
| 6,958,522 B2 * | 10/2005 | Clevenger | H01C 7/005 257/296 |
| 6,960,512 B2 | 11/2005 | Cheng et al. | |
| 6,998,674 B2 | 2/2006 | Osada et al. | |
| 7,012,792 B2 | 3/2006 | Yoshida | |
| 7,015,544 B2 | 3/2006 | Lotfi et al. | |
| 7,019,505 B2 | 3/2006 | Dwarakanath et al. | |
| 7,038,438 B2 | 5/2006 | Dwarakanath et al. | |
| 7,071,044 B1 | 7/2006 | Krishnan et al. | |
| 7,074,684 B2 | 7/2006 | Roy et al. | |
| 7,129,143 B2 | 10/2006 | Park | |
| 7,186,606 B2 | 3/2007 | Lotfi et al. | |
| 7,190,026 B2 | 3/2007 | Lotfi et al. | |
| 7,195,981 B2 | 3/2007 | Lotfi et al. | |
| 7,211,516 B2 | 5/2007 | Chen et al | |
| 7,214,985 B2 | 5/2007 | Lotfi et al. | |
| 7,229,886 B2 | 6/2007 | Lotfi et al. | |
| 7,230,302 B2 | 6/2007 | Lotfi et al. | |
| 7,230,316 B2 | 6/2007 | Yamazaki et al. | |
| 7,232,733 B2 | 6/2007 | Lotfi et al. | |
| 7,232,762 B2 | 6/2007 | Chang et al. | |
| 7,244,994 B2 | 7/2007 | Lotfi et al. | |
| 7,256,674 B2 | 8/2007 | Lotfi et al. | |
| 7,262,476 B2 | 8/2007 | Bude et al. | |
| 7,276,998 B2 | 10/2007 | Lotfi et al. | |
| 7,330,017 B2 | 2/2008 | Dwarakanath et al. | |
| 7,335,948 B2 | 2/2008 | Lotfi et al. | |
| 7,344,985 B2 | 3/2008 | Chen et al. | |
| 7,355,217 B1 | 4/2008 | Brand | |
| 7,355,255 B2 | 4/2008 | Chen et al. | |
| 7,365,402 B2 | 4/2008 | Ma | |
| 7,391,080 B2 | 6/2008 | Arnborg et al. | |
| 7,408,211 B2 | 8/2008 | Kao | |
| 7,420,247 B2 | 9/2008 | Xu et al. | |
| 7,422,967 B2 | 9/2008 | DeLoach et al. | |
| 7,422,968 B2 | 9/2008 | Lu et al. | |
| 7,426,780 B2 | 9/2008 | Lotfi et al. | |
| 7,462,317 B2 | 12/2008 | Lotfi et al. | |
| 7,489,007 B2 | 2/2009 | Williams et al. | |
| 7,511,350 B2 | 3/2009 | Chen et al. | |
| 7,544,558 B2 | 6/2009 | Ren et al. | |
| 7,544,995 B2 | 6/2009 | Lotfi et al. | |
| 7,557,413 B2 * | 7/2009 | Chen | H01L 23/5228 257/355 |
| 7,598,606 B2 | 10/2009 | Chow et al. | |
| 7,605,428 B2 | 10/2009 | Williams et al. | |
| 7,626,233 B2 | 12/2009 | Tornblad et al. | |
| 7,679,342 B2 | 3/2010 | Lopata et al. | |
| 7,683,426 B2 | 3/2010 | Williams et al. | |
| 7,683,453 B2 | 3/2010 | Williams et al. | |
| 7,719,054 B2 | 5/2010 | Williams et al. | |
| 7,759,184 B2 | 7/2010 | Lotfi et al. | |
| 7,812,393 B2 | 10/2010 | Williams | |
| 7,876,080 B2 | 1/2011 | Dwarakanath et al. | |
| 7,892,931 B2 | 2/2011 | Sridhar et al. | |
| 7,952,459 B2 | 5/2011 | Lotfi et al. | |
| 7,964,484 B2 | 6/2011 | Osada et al. | |
| 8,101,479 B2 | 1/2012 | Parker | |
| 8,212,315 B2 | 7/2012 | Lotfi et al. | |
| 8,212,316 B2 | 7/2012 | Lotfi et al. | |
| 8,212,317 B2 | 7/2012 | Lotfi et al. | |
| 8,253,195 B2 | 8/2012 | Lotfi et al. | |
| 8,253,196 B2 | 8/2012 | Lotfi et al. | |
| 8,253,197 B2 | 8/2012 | Lotfi et al. | |
| 8,258,575 B2 | 9/2012 | Williams et al. | |
| 8,520,402 B1 | 8/2013 | Sivasubramaniam | |
| 8,618,580 B2 | 12/2013 | Lin et al. | |
| 8,633,540 B2 | 1/2014 | Lotfi et al. | |
| 8,716,790 B2 | 5/2014 | Lotfi et al. | |
| 8,987,815 B2 | 3/2015 | Lotfi et al. | |
| 2002/0164844 A1 | 11/2002 | Cai et al. | |
| 2002/0175366 A1 | 11/2002 | Lotfi et al. | |
| 2002/0185681 A1 | 12/2002 | Nakano et al. | |
| 2003/0085428 A1 * | 5/2003 | Nelson | H01L 23/4824 257/368 |
| 2003/0109112 A1 | 6/2003 | Wu | |
| 2003/0147286 A1 | 8/2003 | Nakamura et al. | |
| 2004/0094806 A1 | 5/2004 | Schillaci et al. | |
| 2004/0121547 A1 | 6/2004 | Lee et al. | |

(56) References Cited

U.S. PATENT DOCUMENTS

| | | |
|---|---|---|
| 2004/0227190 A1 | 11/2004 | Cai et al. |
| 2005/0110080 A1 | 5/2005 | Arnborg et al. |
| 2005/0112822 A1 | 5/2005 | Litwin |
| 2005/0116257 A1* | 6/2005 | Oakes ............... H01L 23/4824 257/213 |
| 2005/0167756 A1 | 8/2005 | Lotfi et al. |
| 2005/0168203 A1 | 8/2005 | Dwarakanath et al. |
| 2005/0168205 A1 | 8/2005 | Dwarakanath et al. |
| 2005/0169024 A1 | 8/2005 | Dwarakanath et al. |
| 2005/0179084 A1 | 8/2005 | Robb et al. |
| 2005/0179472 A1 | 8/2005 | Nakamura et al. |
| 2005/0194639 A1 | 9/2005 | Negoro et al. |
| 2006/0027864 A1 | 2/2006 | Negoro et al. |
| 2006/0038225 A1 | 2/2006 | Lotfi et al. |
| 2006/0038237 A1 | 2/2006 | Lotfi et al. |
| 2006/0038238 A1 | 2/2006 | Lotfi et al. |
| 2006/0039224 A1 | 2/2006 | Lotfi et al. |
| 2006/0040441 A1 | 2/2006 | Lotfi et al. |
| 2006/0040449 A1 | 2/2006 | Lotfi et al. |
| 2006/0040451 A1 | 2/2006 | Lotfi et al. |
| 2006/0040452 A1 | 2/2006 | Lotfi et al. |
| 2006/0081937 A1 | 4/2006 | Lotfi et al. |
| 2006/0145250 A1 | 7/2006 | Ma |
| 2006/0278931 A1 | 12/2006 | Lee et al. |
| 2007/0224752 A1 | 9/2007 | Lotfi et al. |
| 2007/0284658 A1 | 12/2007 | Lotfi et al. |
| 2008/0001233 A1 | 1/2008 | Kapoor et al. |
| 2008/0061368 A1 | 3/2008 | Williams et al. |
| 2008/0061400 A1 | 3/2008 | Williams et al. |
| 2008/0067585 A1 | 3/2008 | Williams et al. |
| 2008/0067586 A1 | 3/2008 | Williams et al. |
| 2008/0067588 A1 | 3/2008 | Williams et al. |
| 2008/0080111 A1 | 4/2008 | Lin et al. |
| 2008/0142899 A1 | 6/2008 | Morris et al. |
| 2008/0153221 A1 | 6/2008 | Sridhar et al. |
| 2008/0199999 A1 | 8/2008 | Weijtmans et al. |
| 2008/0242032 A1 | 10/2008 | Chakravarthi et al. |
| 2008/0301929 A1 | 12/2008 | Lotfi et al. |
| 2009/0065964 A1 | 3/2009 | Lotfi et al. |
| 2009/0096435 A1 | 4/2009 | Ueunten |
| 2009/0096511 A1 | 4/2009 | Ueunten |
| 2009/0167267 A1 | 7/2009 | Dwarakanath et al. |
| 2009/0212751 A1 | 8/2009 | Cervera et al. |
| 2009/0261791 A1 | 10/2009 | Lopata et al. |
| 2009/0269899 A1 | 10/2009 | Osada et al. |
| 2009/0296310 A1 | 12/2009 | Chikara |
| 2010/0044789 A1 | 2/2010 | Lotfi et al. |
| 2010/0052050 A1 | 3/2010 | Lotfi et al. |
| 2010/0052051 A1 | 3/2010 | Lotfi et al. |
| 2010/0052052 A1 | 3/2010 | Lotfi et al. |
| 2010/0156374 A1 | 6/2010 | Lopata et al. |
| 2010/0164449 A1 | 7/2010 | Dwarakanath et al. |
| 2010/0164650 A1 | 7/2010 | Abou-Alfotouh et al. |
| 2010/0244106 A1 | 9/2010 | Parker et al. |
| 2010/0244152 A1 | 9/2010 | Bahl |
| 2010/0301496 A1 | 12/2010 | Koduri |
| 2011/0006763 A1 | 1/2011 | Bakker |
| 2011/0031947 A1 | 2/2011 | You |
| 2011/0049621 A1 | 3/2011 | Lotfi et al. |
| 2011/0074498 A1 | 3/2011 | Thompson et al. |
| 2011/0095742 A1 | 4/2011 | Lopata et al. |
| 2011/0101933 A1 | 5/2011 | Lopata et al. |
| 2011/0101934 A1 | 5/2011 | Lopata et al. |
| 2011/0101948 A1 | 5/2011 | Lopata et al. |
| 2011/0101949 A1 | 5/2011 | Lopata et al. |
| 2011/0215414 A1 | 9/2011 | Osada et al. |
| 2011/0221000 A1 | 9/2011 | Shima |
| 2011/0316053 A1 | 12/2011 | Brand |
| 2015/0280558 A1 | 10/2015 | Lopata et al. |

FOREIGN PATENT DOCUMENTS

| | | |
|---|---|---|
| TW | 200816374 A | 4/2008 |
| TW | 200847330 A | 12/2008 |
| TW | 201120459 A | 6/2011 |
| TW | 201225298 A | 6/2012 |

OTHER PUBLICATIONS

Goodman, J. et al., "An Energy/Security Scalable Encryp-tion Processor Using an Embedded Variable Voltage DC/DC Converter," IEEE Journal of Solid-State Circuits, vol. 33, No. 11 (Nov. 1998), pp. 1799-1809.

Horowitz, P., et al., "The Art of Electronics," Second Edi-tion, 1989, pp. 288-291, Cambridge University Press, Cambridge, MA, 6 pgs.

Lotfi, A.W., et al., "Issues and Advances in High-Frequency Mag-netics for Switching Power Supplies," Proceedings of the IEEE, Jun. 2001, vol. 89, No. 6, pp. 833-845.

Ludikhuize, A.W., "A Review of RESURF Technology," Proceed-ings of IEEE ISPSD 2000, May 22, 2000, pp. 11-18.

High Efficiency Single Inductor Buck-Boost Converter, Power MOSFET Polysilicon and Metallization Layout Images, Analysis Performed 2016, pp. 1-10.

\* cited by examiner

SEMICONDUCTOR DEVICE INCLUDING A RESISTOR METALLIC LAYER AND METHOD OF FORMING THE SAME

This application claims the benefit of U.S. Provisional Application Ser. No. 61/971,719, entitled "Semiconductor Device including an Integrated Current Replicator," filed on Mar. 28, 2014, and is a continuation-in-part of U.S. patent application Ser. No. 14/227,666, entitled "Integrated Current Replicator and Method of Operating the same," filed on Mar. 27, 2014, and is a continuation-in-part of U.S. patent application Ser. No. 14/091,739, entitled "Semiconductor Device including Alternating Source and Drain Regions, and Respective Source and Drain Metallic Strips," filed on Nov. 27, 2013, which are incorporated herein by reference.

TECHNICAL FIELD

The present invention is directed, in general, to semiconductor devices and, in particular, to a semiconductor device including a resistor metallic layer and method of forming the same.

BACKGROUND

A current in a power converter or other electronic devices is often an important operating characteristic that should be replicated or sensed with a signal, generally with little delay (i.e., with wide bandwidth). A signal that accurately replicates a current provides an indicator that the power converter or other electronic device is operating at or near peak performance. The signal can also be employed to prevent component damage when an over-current event or a short circuit is encountered.

Conventional arrangements to provide a signal that replicates a current generally operate in a single quadrant (i.e., a current is sensed in only one direction and with a positive voltage). Sensing a current in power converters such as dc-dc power converters is usually performed in a two-quadrant mode (i.e., a signal is produced that senses a bidirectional current and with a positive voltage). If two-quadrant sensing is necessary, a conventional arrangement duplicates the circuit that provides the current-replicating signal, thereby increasing the cost, component count and circuit area.

Producing a signal that replicates a current is often completed using a current sense resistor external to a high-gain operational amplifier. Separation of the current sense resistor from the operational amplifier leads to inaccuracy and temperature-dependent results due to mismatching of component characteristics. Some integrated current sensing solutions employ a scaled version of switches coupled in parallel with the power switches to sense current therein. This approach can be accurate, but involves complex and often duplicated circuitry, and is still sensitive to component mismatching and manufacturing process variations.

There is often a need to sense a current in a power converter that is divided between two circuit components such as two alternately-conducting power switches employed in a buck power converter topology. The current sensing should be performed at each of the two circuit components rather than in the circuit before or after division of the circuit between the two circuit components. There is a further challenge to sense divided currents when there is a substantial dc bias between the two circuit components.

Thus, there is an unanswered need to provide a circuit structure and method to provide a signal that accurately replicates a current that is conducted by two circuit components in a power converter or other electronic device, which can be a bidirectional current. The resulting circuit structure should be substantially insensitive to an operating temperature and manufacturing variations. There is also a need to incorporate at least portions of the resulting circuit into a semiconductor device. Accordingly, what is needed in the art is a circuit structure and a semiconductor device with a circuit structure that overcomes the deficiencies of current designs.

SUMMARY OF THE INVENTION

These and other problems are generally solved or circumvented, and technical advantages are generally achieved, by advantageous embodiments of the present invention, including a semiconductor device including a resistor metallic layer, and method of forming the same. In one embodiment, the semiconductor device includes a source region and a drain region of a semiconductor switch on a substrate. The semiconductor device also includes the resistor metallic layer over the source region and the drain region of the semiconductor switch. The resistor metallic layer includes a first resistor with a first resistor metallic strip coupled between a first cross member and a second cross member of the resistor metallic layer.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale

DETAILED DESCRIPTION OF ILLUSTRATIVE EMBODIMENTS

The making and using of the presently preferred embodiments are discussed in detail below. It should be appreciated, however, that the embodiments provide many applicable inventive concepts that can be embodied in a wide variety of specific contexts. The specific embodiments discussed are merely illustrative of specific ways to make and use the invention, and do not limit the scope of the invention.

Embodiments will be described in a specific context, namely, a semiconductor device including a resistor metallic layer and an integrated current replicator for a power converter and methods of operating and forming the same. While the principles of the present invention will be described in the environment of a power converter embodied in a semiconductor device employing alternately conducting power switches, any application or related electronic devices that may benefit from an integrated current replicator that can enable temperature-independent replication of a current is well within the broad scope of the present invention.

Figure 1:
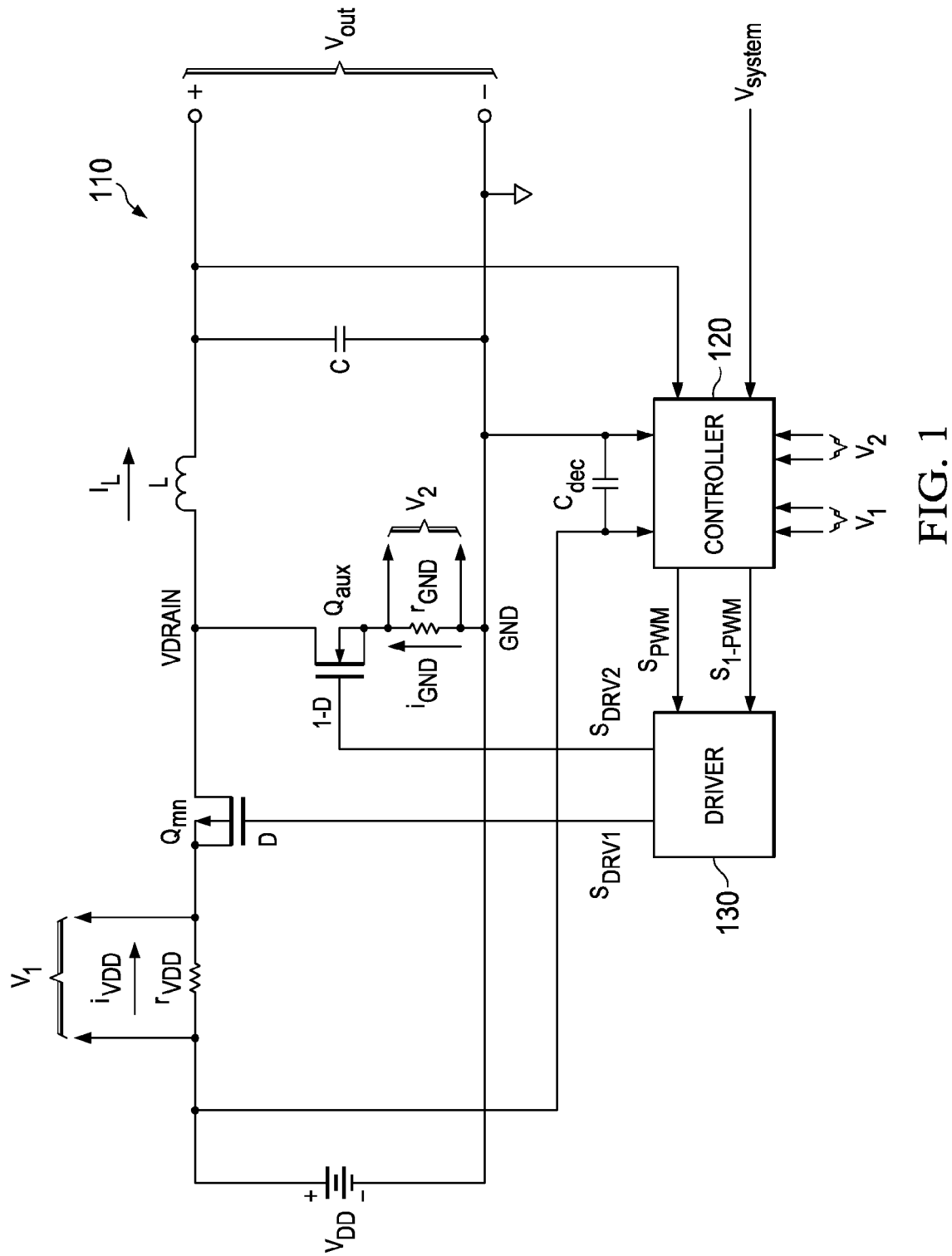
FIG. 1 illustrates a schematic diagram of an embodiment of a power converter including power conversion circuitry.

Referring initially to FIG. 1, illustrated is a schematic diagram of an embodiment of a power converter including power conversion circuitry formed with main and auxiliary power switches $Q_{mn}$, $Q_{aux}$. The power converter includes a power train 110, a controller 120 and a driver 130 including control circuit elements, and provides power to a system/load such as a microprocessor. While in the illustrated embodiment, the power train 110 employs a buck converter topology, those skilled in the art should understand that other converter topologies such as a forward converter topology are well within the broad scope of the present invention.

The power train 110 receives an input voltage VDD from a source of electrical power (represented by a battery) at an input thereof and provides a regulated output voltage $V_{out}$ to power, for instance, a microprocessor coupled to an output thereof. In keeping with the principles of a buck converter topology, the output voltage $V_{out}$ is generally less than the input voltage VDD such that a switching operation of the power converter can regulate the output voltage $V_{out}$. An active element such as a semiconductor switch (e.g., a main power semiconductor switch or main power switch $Q_{mn}$) is enabled to conduct for a primary portion (or interval) of a duty cycle associated with the power converter (generally co-existent with a primary duty cycle "D" of the main power switch $Q_{mn}$) and couples the input voltage VDD to an output filter inductor L. During the primary interval, an inductor current $I_L$ flowing through the output filter inductor L increases as a first input current $i_{VDD}$ flows from the input through a first current sense resistor $r_{VDD}$ to the output of the power train 110. The first input current $i_{VDD}$ that flows from the input through the first current sense resistor $r_{VDD}$ during the primary interval produces a first current sense voltage $V_1$. A portion of the inductor current $I_L$ is filtered by an output filter capacitor C.

During a complementary portion (or interval) of a duty cycle associated with the power converter (generally co-existent with a complementary duty cycle "1-D" of the main power switch $Q_{mn}$), the main power switch $Q_{mn}$ is transitioned to a non-conducting state and another active element such as another semiconductor switch (e.g., an auxiliary power semiconductor switch or auxiliary power switch $Q_{aux}$) is enabled to conduct. The auxiliary power switch $Q_{aux}$ provides a path to maintain a continuity of the inductor current $I_L$ flowing through the output filter inductor L. During the complementary interval, the inductor current $I_L$ flows through a second current sense resistor $r_{GND}$ as a second input current $i_{GND}$, and the inductor current $I_L$ that flows through the output filter inductor L decreases. The second input current $i_{GND}$ that flows from local circuit ground through the second current sense resistor $r_{GND}$ during the complementary interval produces a second current sense voltage $V_2$. In general, the respective duty cycle of the main and auxiliary power switches $Q_{mn}$, $Q_{aux}$ may be adjusted to maintain a regulation of the output voltage $V_{out}$ of the power converter. Those skilled in the art should understand, however, that the conduction periods for the main and auxiliary power switches $Q_{mn}$, $Q_{aux}$ may be separated by a small time interval to avoid cross conduction therebetween and beneficially to reduce the switching losses associated with the power converter. A drain terminal VDRAIN (also referred to as a "switched terminal" and a "common node") with respect to the main and auxiliary power switches $Q_{mn}$, $Q_{aux}$ and a ground terminal GND of the power converter are also designated in FIG. 1.

The controller 120 receives a desired characteristic such as a desired system voltage $V_{system}$ from an internal or external source associated with the microprocessor, and the output voltage $V_{out}$ of the power converter. The controller 120 is also coupled to the input voltage VDD of the power converter and a return lead of the source of electrical power (again, represented by a battery) to provide a ground connection therefor. A decoupling capacitor $C_{dec}$ is coupled to the path from the input voltage VDD to the controller 120. The decoupling capacitor $C_{dec}$ is configured to absorb high frequency noise signals associated with the source of electrical power to protect the controller 120. In an embodiment, the first and second current sense resistors $r_{VDD}$, $r_{GND}$ are formed as circuit elements of an integrated current replicator as described below. The integrated current replicator in turn is an element of the controller 120.

In accordance with the aforementioned characteristics, the controller 120 provides a signal (e.g., a pulse width modulated ("PWM") signal $S_{PWM}$) to control the duty cycle and a frequency of the main and auxiliary power switches $Q_{mn}$, $Q_{aux}$ of the power train 110 to regulate the output voltage $V_{out}$ thereof. The controller 120 may also provide a complement of the signal (e.g., a complementary pulse width modulated signal $S_{1-PWM}$) in accordance with the aforementioned characteristics. Any controller adapted to control at least one semiconductor switch of the power converter is well within the broad scope of the present invention. As an example, a controller employing digital circuitry is disclosed in U.S. Pat. No. 7,038,438, entitled "Controller for a Power Converter and a Method of Controlling a Switch Thereof," to Dwarakanath, et al. and U.S. Pat. No. 7,019,505, entitled "Digital Controller for a Power Converter Employing Selectable Phases of a Clock Signal," to Dwarakanath, et al., which are incorporated herein by reference.

The power converter also includes the driver 130 configured to provide drive signals (e.g., gate drive signals) $S_{DRV1}$, $S_{DRV2}$ to the main and auxiliary power switches $Q_{mn}$, $Q_{aux}$, respectively, based on the PWM and complementary PWM signals $S_{PWM}$, $S_{1-PWM}$ provided by the controller 120. There are a number of viable alternatives to implement a driver 130 that include techniques to provide sufficient signal delays to prevent crosscurrents when controlling multiple power semiconductor switches in the power converter. The driver 130 typically includes active elements such as switching circuitry incorporating a plurality of driver switches that cooperate to provide the drive signals $S_{DRV1}$, $S_{DRV2}$ to the main and auxiliary power switches $Q_{mn}$, $Q_{aux}$. Of course, any driver 130 capable of providing the drive signals $S_{DRV1}$, $S_{DRV2}$ to control a semiconductor switch is well within the broad scope of the present invention. As an example, a driver is disclosed in U.S. Pat. No. 7,330,017, entitled "Driver for a Power Converter and Method of Driving a Switch Thereof," to Dwarakanath, et al., which is incorporated herein by reference. Also, an embodiment of a semiconductor device that may embody portions of the power conversion circuitry is disclosed in U.S. Pat. No. 7,230,302, entitled "Laterally Diffused Metal Oxide Semiconductor Device and Method of Forming the Same," to Lotfi, et al., and U.S. patent application Ser. No. 14/091,739, entitled "Semiconductor Device including Alternating Source and Drain Regions, and Respective Source and Drain Metallic Strips," to Lotfi, et al., which are incorporated herein by reference, and an embodiment of an integrated circuit embodying power conversion circuitry, or portions thereof, is disclosed in U.S. Pat. No. 7,015,544, entitled "Integrated Circuit Employable with a Power Converter," to Lotfi, et al., which is incorporated by reference.

A circuit structure and semiconductor device are introduced to sum two currents in a power converter employing an integrated current replicator. The two currents are combined in a common circuit element, e.g., an output filter inductor or output inductor L of the power converter. In an embodiment, each of the currents flows in a respective power switch (e.g., a metal-oxide semiconductor field-effect transistor "MOSFET") including current that may flow through a respective body diode thereof. The drains of the power switches are coupled together to enable the summed current to flow through the output inductor L. Current replication of the currents flowing through the power switches is provided with high accuracy and temperature independence for two-quadrant operation in power converters employing, for instance, a single external resistor to provide a programmable gain. Current replication generally refers to producing a signal with a known proportionality to one or more currents.

Figure 2:
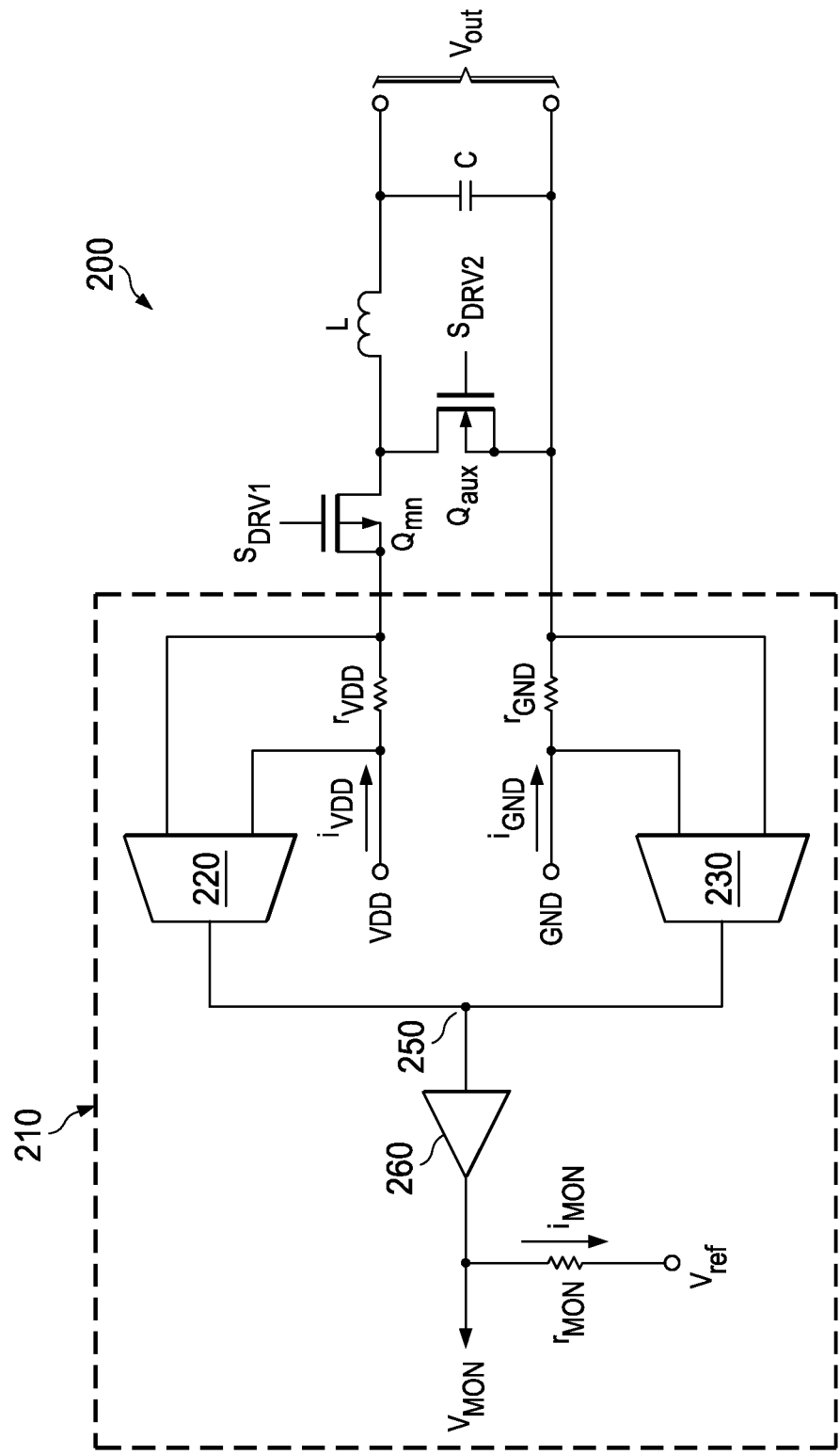
FIGS. 2 and 3 illustrate simplified schematic diagrams of embodiments of power converters formed with an integrated current replicator.

Turning now to FIG. 2, illustrated is a simplified schematic diagram of an embodiment of a power converter 200 formed with an integrated current replicator 210 coupled to main and auxiliary power switches $Q_{mn}$, $Q_{aux}$. The main and auxiliary power switches $Q_{mn}$, $Q_{aux}$, in turn, are coupled to an output filter formed with output filter inductor L and output filter capacitor C. The integrated current replicator 210 is formed with a first current sense resistor $r_{VDD}$ coupled to a first transconductance amplifier 220 and a second current sense resistor $r_{GND}$ coupled to a second transconductance amplifier 230 to replicate currents flowing through the main and auxiliary power switches $Q_{mn}$, $Q_{aux}$ with high accuracy, high bandwidth, and substantial temperature independence. The output of the first transconductance amplifier 220 and the output of the second transconductance amplifier 230 are coupled together at a common node 250 at an input to an amplifier 260. An output of the amplifier 260 produces a current $i_{MON}$ through a current sense monitoring resistor $r_{MON}$ that in turn produces a voltage (a current replicator output voltage) $v_{MON}$ that replicates first and second input currents $i_{VDD}$, $i_{GND}$ that flow respectively through the first current sense resistor $r_{VDD}$ and the second current sense resistor $r_{GND}$.

Figure 3:
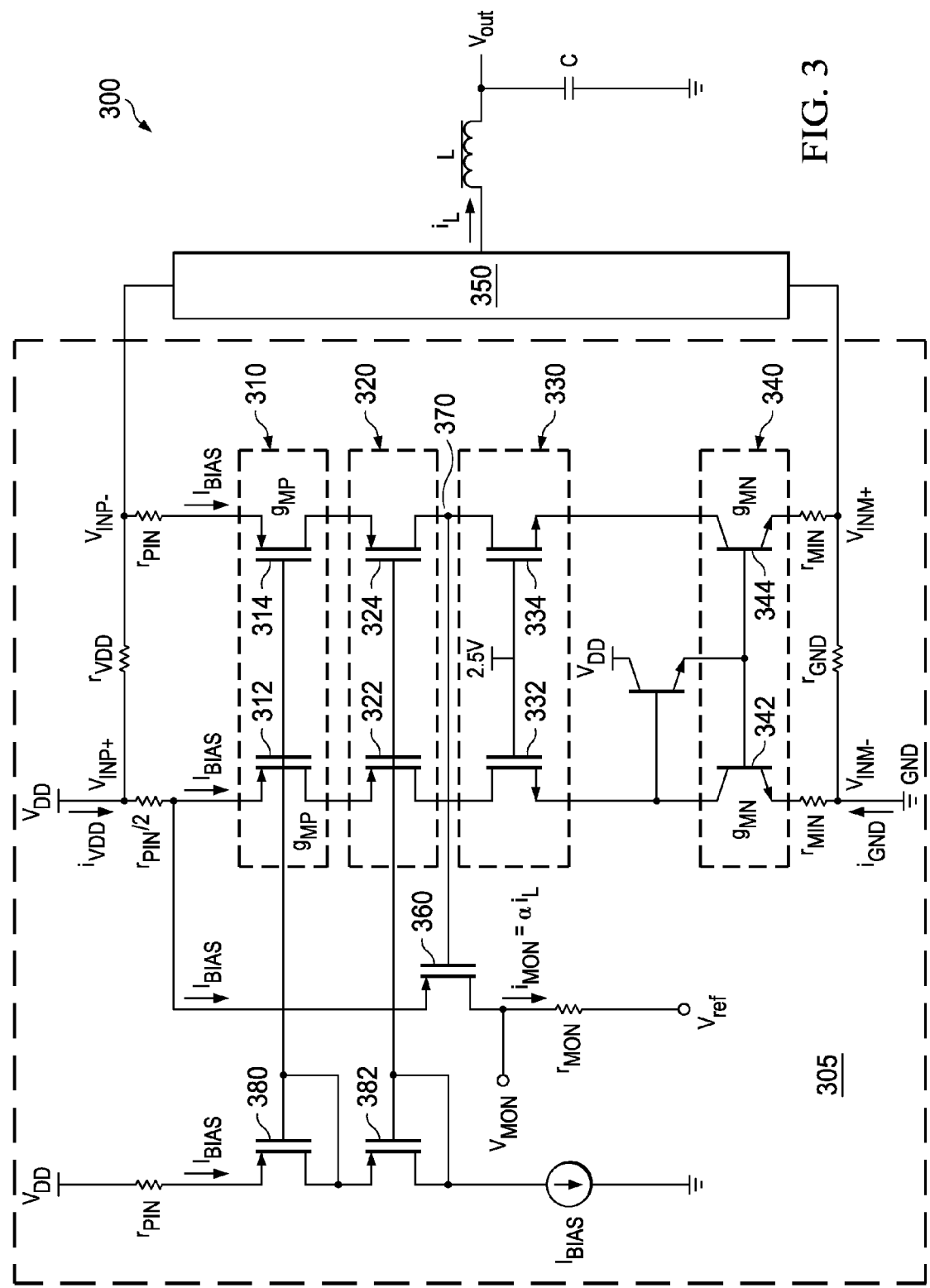

Turning now to FIG. 3, illustrated is a simplified schematic diagram of an embodiment of a power converter 300 formed with an integrated current replicator 305 coupled to power switches 350. The power switches 350 (e.g., the main and auxiliary power switches illustrated and described hereinabove with reference to FIG. 1) are coupled to an input voltage source VDD and to an output filter formed with an output filter inductor L and an output filter capacitor C to produce a dc output voltage $V_{out}$. The integrated current replicator 305 is configured to replicate a first input current $i_{VDD}$ that flows through the output filter inductor L from the input voltage source VDD during a primary portion (D) of a duty cycle of the power converter 300, and a second input current $i_{GND}$ that flows through the output filter inductor L from local circuit ground GND during a complementary portion (1-D) of the duty cycle. The integrated current replicator 305 produces a corresponding voltage (a current replicator output voltage) $V_{MON}$ replicating the first input current $i_{VDD}$ and the second input current $i_{GND}$.

An inductor current $i_L$ is the sum of the first input current $i_{VDD}$ that flows from the input voltage source VDD during the primary portion of the duty cycle of the power converter 300, and the second input current $i_{GND}$ that flows from local circuit ground GND during the complementary portion of the duty cycle. During the primary portion of the duty cycle, a first transconductance amplifier 310 (a common-gate transconductance amplifier with transconductance gain $g_{MP}$) coupled in cascade with a first series amplifier 320 produces the voltage $V_{MON}$ at the output of an amplifier 360 given by the equation:

$$v_{MON} = i_L \times r_{VDD}(r_{MON}/r_{PIN}),$$

where the parameters $r_{VDD}$, $r_{PIN}$, and $r_{MON}$ are the resistances of the respective resistors illustrated in FIG. 3. In a similar way, the second transconductance/common-base amplifier 340 (with transconductance gain $g_{MN}$) coupled in cascade with a second series amplifier 330 operates during the complementary portion of the duty cycle, and produces the voltage $V_{MON}$ at the output of the amplifier 360 given by the equation:

$$v_{MON} = i_L \times r_{GND}(r_{MON}/r_{MIN}),$$

where the parameters $r_{GND}$, $r_{MIN}$ and $r_{MON}$ are the resistances of the respective resistors illustrated in FIG. 3. In order to have substantially identical gains between sensing/replicating the first input current $i_{VDD}$ and sensing/replicating the second input current $i_{GND}$, the following condition is satisfied:

$$r_{VDD}/r_{PIN} = r_{GND}/r_{MIN}.$$

The integrated current replicator 305 is substantially insensitive to temperature variations therein because the thermal coefficients of the first and second current sense resistors $r_{VDD}$, $r_{GND}$ and the gain resistor pairs (a first input resistor (or resistor pair) $r_{PIN}, r_{PIN}/2$ to the first transconductance amplifier 310 and a second input resistor (or resistor pair) $r_{MIN}$ to the second transconductance amplifier 340) are formed as metallic paths of the same or similar material and are located in the same integrated semiconductor device. As a result, overall changes in temperature cancel each other's proportional variation of resistance. A current sense monitoring resistor $r_{MON}$ is preferably selected as an external resistor with a substantially zero thermal coefficient of resistance so that the integrated current replicator 305 is substantially insensitive to temperature variations. The current sense monitoring resistor $r_{MON}$ is coupled to an internal or external reference voltage source $V_{ref}$ that can be a fixed voltage reference source. The integrated current replicator 305 is substantially insensitive to process variations because its gain is based on resistor ratios of similarly constructed circuit elements rather than absolute values. The gain of the integrated current replicator 305 can be adjusted by changing the current sense monitoring resistor $r_{MON}$, which, as noted, can be an external resistor. The integrated current replicator 305 operates in a two-quadrant mode because it is capable of replicating both positive and negative currents that flow through the first and second current sense resistors $r_{VDD}$, $r_{GND}$.

The integrated current replicator 305 is formed with a dual common-gate/base amplifier structure to reduce parasitic capacitances to provide a high amplifier bandwidth and low input voltage offset. The integrated current replicator 305 includes the first transconductance amplifier 310 configured as a common-gate transconductance amplifier and is coupled in cascade for higher voltage gain to the first series amplifier 320. The second transconductance amplifier 340 is configured as a common-base transconductance amplifier and is coupled in cascade for higher voltage gain to the second series amplifier 330. The first transconductance amplifier 310 is formed as an integrated circuit with matched p-channel metal-oxide semiconductor ("PMOS") transistors 312, 314, and the second transconductance amplifier 340 is formed with matched npn transistors 342, 344. It would be preferable to use matched pnp transistors for the matched PMOS transistors 312, 314 because bipolar transistors can generally be formed with better matching than paired MOS transistors. It is also generally recognized that it is more economical at the present time of technology development to obtain matched PMOS transistors than it is to obtain matched pnp transistors. Accordingly, in an embodiment, the first transconductance amplifier 310 is formed with the matched PMOS transistors 312, 314. The first series amplifier 320 is also formed with matched PMOS transistors 322, 324 and the second series amplifier 330 is formed with matched n-channel metal-oxide semiconductor ("NMOS") transistors 332, 334.

Control elements (i.e., gates and bases) of each of the first and second series amplifiers 320, 330 and the first and second transconductance amplifiers 310, 340 are coupled to respective local bias voltage sources, characteristic of which such as voltages can be set with current mirrors to set a current level through the first and second transconductance amplifiers 310, 340. The local gate-bias voltage sources that provide voltages for the gates/bases of the first and second transconductance amplifiers 310, 340 are arranged to provide appropriate bias voltage levels for the respective stage or transconductance amplifier. In particular, the MOSFETs 380, 382 are arranged in a current-mirror configuration with the respective first transconductance amplifier 310 and the first series amplifier 320 to provide a desired bias current $I_{BIAS}$. The gates of the second series amplifier 330 are set to an example internal bias voltage level of 2.5 volts ("V").

The first transconductance amplifier 310 senses a voltage difference $(V_{INP+})-(V_{INP-})$ (the first current sense voltage $V_1$ illustrated in FIG. 1) formed by the first input current $i_{VDD}$ that flows through the first current sense resistor $r_{VDD}$, and the second transconductance amplifier 340 senses a voltage difference $(V_{INM-})-(V_{INM+})$ (the second current sense voltage V2 illustrated in FIG. 1) formed by the second input current $i_{GND}$ that flows through the second current sense resistor $r_{GND}$. In response thereto, the first transconductance amplifier 310 in cascade with the first series amplifier 320 produces a first voltage at a common node 370 and the second transconductance amplifier 340 in cascade with the second series amplifier 330 produces a second voltage at the common node 370. The source of the amplifier (e.g., a PMOS transistor) 360 is coupled to one input of the first transconductance amplifier 310, and the gate of the amplifier 360 is coupled to the common node 370 to provide negative feedback to produce a current $i_{MON}$ that is proportional to the inductor current $i_L$ that flows through the output filter inductor L with a desired proportionality constant α:

$$i_{MON} = \alpha \cdot i_L.$$

The current $i_{MON}$ flows through the amplifier 360. The result of this arrangement produces the current $i_{MON}$ that is proportional to the first input current $i_{VDD}$ that flows through the first current sense resistor $r_{VDD}$. Similarly, the current $i_{MON}$ is produced through the amplifier 360 that is also proportional to the second input current $i_{GND}$ that flows through the second current sense resistor $r_{GND}$. The current $i_{MON}$ produces the voltage (a current replicator output voltage) $V_{MON}$ through the current sense monitoring resistor $r_{MON}$ that is proportional to the respective first and second input currents $i_{VDD}$, $i_{GND}$ that flow through the first and second current sense resistors $r_{VDD}$, $r_{GND}$.

As mentioned above, ones of the circuit elements of the integrated current replicator 305 may be integrated with selected circuit elements of a power converter (see FIG. 1) within a common semiconductor device to provide a high level of thermal cross coupling among the circuit elements. To provide a high level of thermal cross coupling between the first current sense resistor $r_{VDD}$ and the main power switch $Q_{mn}$, and between the second current sense resistor $r_{GND}$ and the auxiliary power switch $Q_{aux}$, the first current sense resistor $r_{VDD}$ is formed within the common semiconductor device substantially over the main power switch $Q_{mn}$, and the second current sense resistor $r_{GND}$ is formed within the common semiconductor device substantially over the auxiliary power switch $Q_{aux}$. The resulting high level of thermal cross coupling enables substantially proportionately identical resistance value changes among the circuit elements, which substantially eliminates a gain change in sensing respective currents that are summed to produce a signal that replicates the sensed currents.

Figure 4:
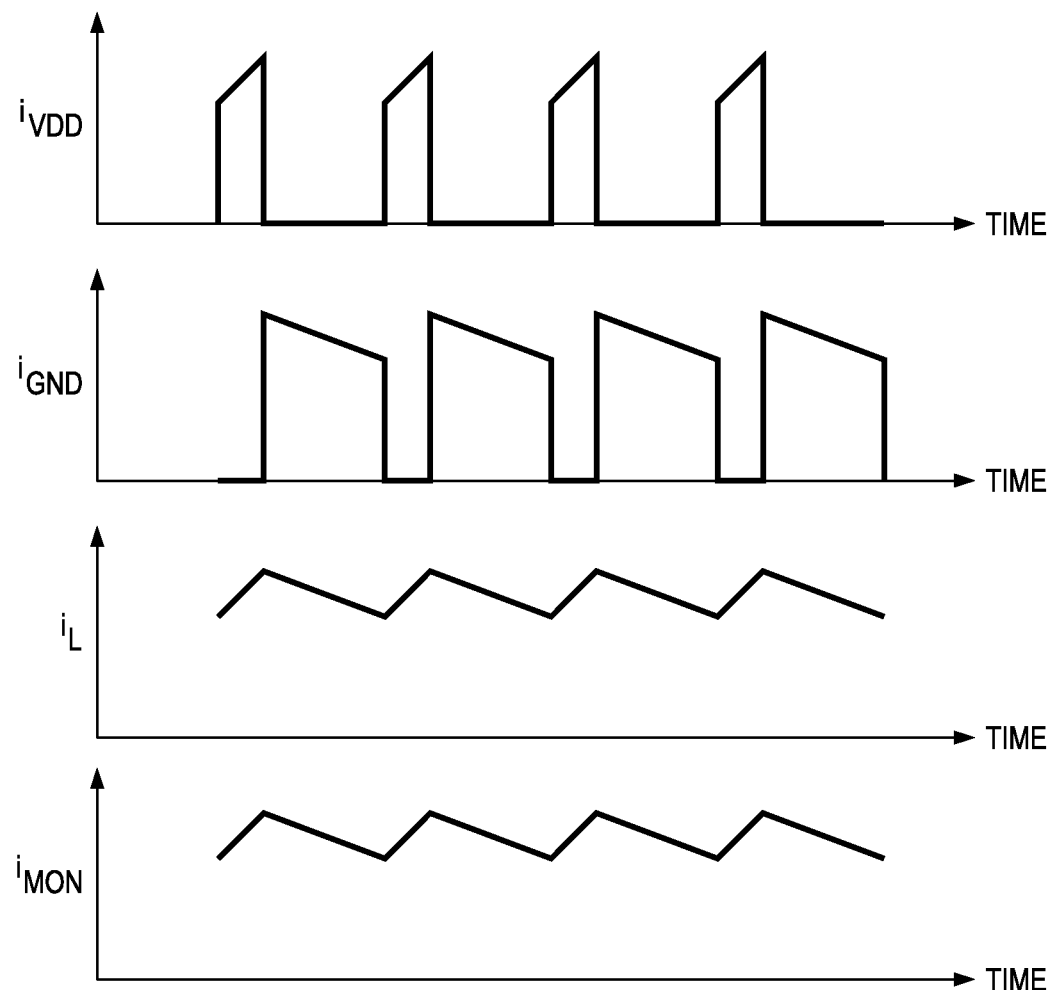
FIG. 4 illustrates current waveforms over time produced by the power converter of FIG. 3.

Turning now to FIG. 4, illustrated are current waveforms over time produced by the power converter 300 formed with the integrated current replicator 305 of FIG. 3. In the top waveform of FIG. 4, illustrated is the first input current $i_{VDD}$ that flows through the first current sense resistor $r_{VDD}$ during the primary portion of the duty cycle. In the next lower waveform of FIG. 4, illustrated is the second input current $i_{GND}$ that flows through the second current sense resistor $r_{GND}$ during the complementary portion of the duty cycle. The inductor current $i_L$ illustrated in the next lower waveform of FIG. 4 is the sum of the first and second input currents $i_{GND}$, $i_{VDD}$. In the bottom waveform of FIG. 4, illustrated is the current $i_{MON}$ that is proportional to the first and second input currents $i_{VDD}$, $i_{GND}$ that flow through the first and second current sense resistors $r_{VDD}$, $r_{GND}$. Thus, the integrated current replicator 305 produces a substantially temperature-independent current replicator output voltage $V_{MON}$ that is proportional to the inductor current $i_L$ that flows through the output filter inductor L with high bandwidth and small offsets by sensing the first and second input currents $i_{VDD}$, $i_{GND}$ that flow through the first and second current sense resistors $r_{VDD}$, $r_{GND}$, respectively. The current replicator output voltage $V_{MON}$ is also substantially insensitive to manufacturing process variations.

Figure 5:
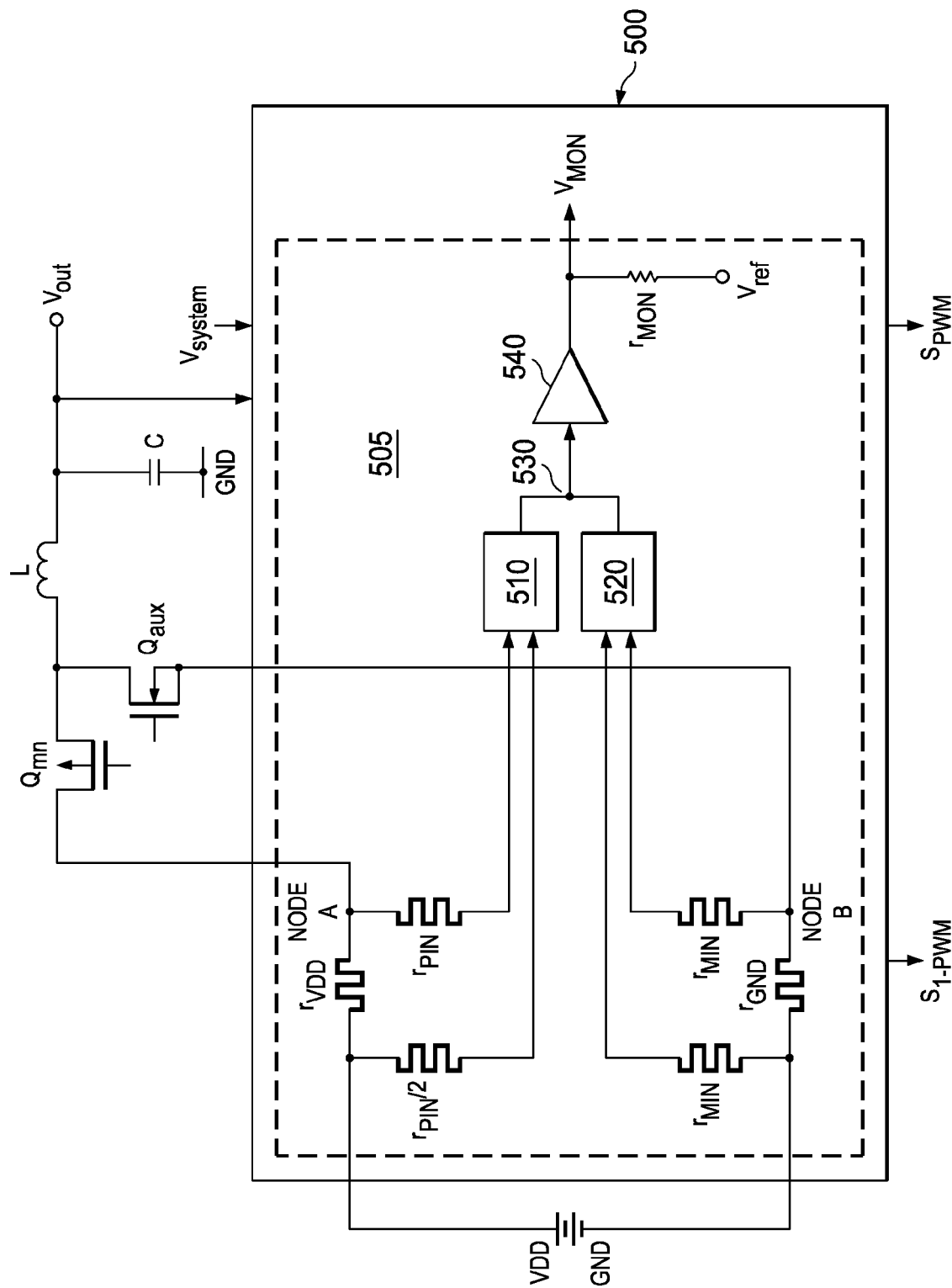
FIG. 5 illustrates a simplified schematic diagram of an embodiment of a power converter controlled by a controller that is formed with an integrated current replicator.

Turning now to FIG. 5, illustrated is a simplified schematic diagram of an embodiment of a power converter controlled by a controller 500 that is formed with an integrated current replicator 505 coupled to main and auxiliary power switches $Q_{mn}$, $Q_{aux}$. The controller 500 produces the PWM signals $S_{PWM}$, $S_{1-PWM}$ described previously hereinabove with reference to FIG. 1. The integrated current replicator 505 is formed with first and second transconductance amplifiers 510, 520, outputs of which are coupled together at the common node 530 that is coupled to the input of an amplifier 540. The output of amplifier 540 is coupled to a current sense monitoring resistor $r_{MON}$ to produce the current replicator output voltage $V_{MON}$.

FIG. 5 illustrates an example structure of the first and second current sense resistors $r_{VDD}$, $r_{GND}$, the pair of first input resistors $r_{PIN}$, $r_{PIN}/2$ (to the first transconductance amplifier 510), and the pair of second input resistors $r_{MIN}$ (to the second transconductance amplifier 520). The aforementioned resistors may be formed as metallic paths of the same or similar material and are located in the same integrated semiconductor device. The first and second current sense resistors $r_{VDD}$, $r_{GND}$ are generally formed with substantially the same layout geometry, and the pair of first and second input resistors $r_{PIN}$, $r_{PIN}/2$, $r_{MIN}$, are also generally formed with the same or similar layout geometry. As a result, changes in temperature substantially proportionally cancel each other's variation of resistance. For reasons that will become more apparent, a node A is illustrated at a junction between the first current sense resistor $r_{VDD}$ and the main power switch $Q_{mn}$, and a node B is illustrated at a junction between the second current sense resistor $r_{VDD}$ and the auxiliary power switch $Q_{aux}$.

Figure 6:
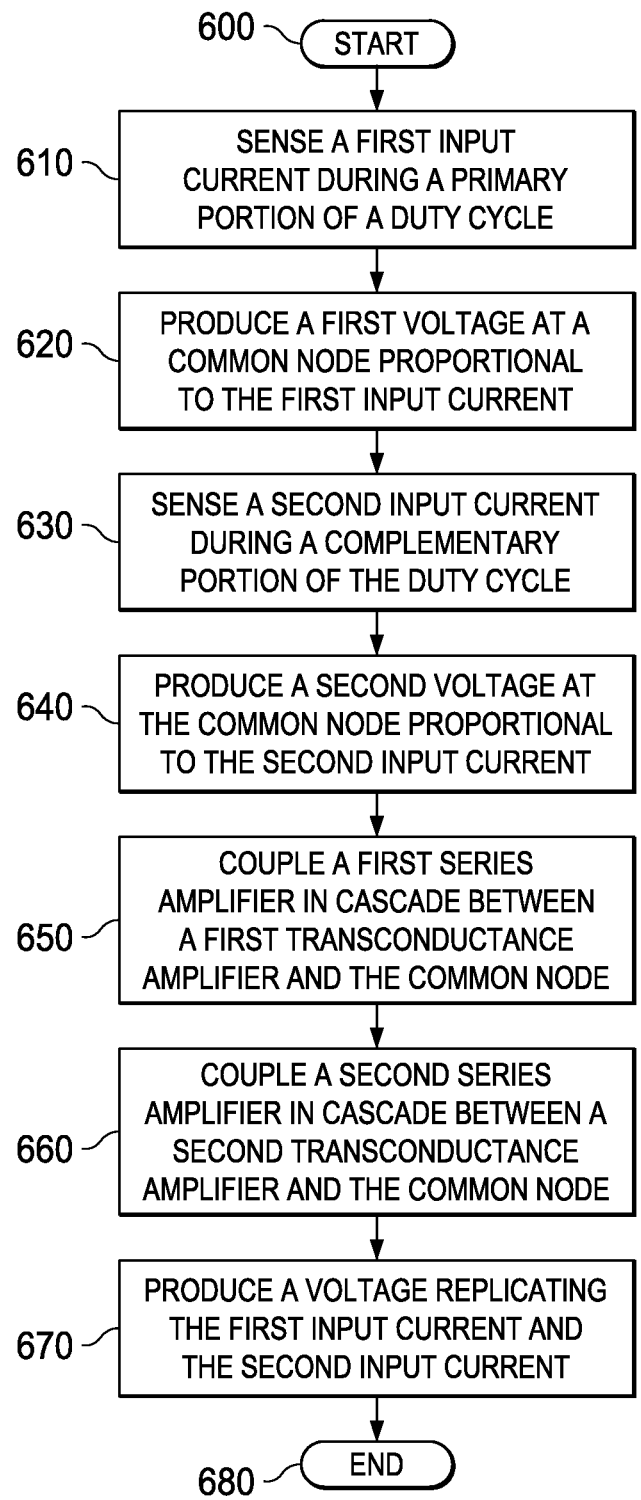
FIG. 6 illustrates a flow diagram of an embodiment of a method of operating an integrated current replicator for a power converter.

Turning now to FIG. 6, illustrated is a flow diagram of an embodiment of a method of operating an integrated current replicator for a power converter. The method begins in a start step or module 600. At a step or module 610, a first input current to the power converter is sensed with a first current sense resistor during a primary portion of a duty cycle of the power converter. At a step or module 620, a first transconductance amplifier is coupled to the first current sense resistor to produce a first voltage at a common node of the integrated current replicator proportional to the first input current during the primary portion of the duty cycle. At a step or module 630, a second input current to the power converter is sensed with a second current sense resistor during a complementary portion of the duty cycle. At a step or module 640, a second transconductance amplifier is coupled to the second current sense resistor to produce a second voltage at the common node proportional to the second input current during the complementary portion of the duty cycle. At a step or module 650, a first series amplifier is coupled in cascade between the first transconductance amplifier and the common node. At a step or module 660, a second series amplifier is coupled in cascade between the second transconductance amplifier and the common node. At a step or module 670, an input of an amplifier is coupled to the common node to produce a voltage replicating the first input current and the second input current at an output of the amplifier from the first voltage and the second voltage. The method ends at step or module 680.

In an embodiment, the voltage replicating the first input current and the second input current is proportional to a first ratio of a resistance of the first current sense resistor to a resistance of a first input resistor to the first transconductance amplifier. The voltage replicating the first input current and the second input current is proportional to a product of the first ratio and a resistance of a current sense monitoring resistor. The voltage replicating the first input current and the second input current may also be proportional to a second ratio of a resistance of the second current sense resistor to a resistance of a second input resistor to the second transconductance amplifier. The first ratio is substantially equal to the second ratio.

The first input resistor and the second input resistor may be formed in the integrated current replicator with substantially identical semiconductor doping and geometries. The first current sense resistor and the second current sense resistor may also be formed as metallic paths in the integrated current replicator. In an embodiment, the first transconductance amplifier includes a common gate amplifier topology formed with matched p-channel metal-oxide semiconductor ("PMOS") transistors. The second transconductance amplifier includes a common base amplifier topology formed with matched N-type bipolar transistors. The common node provides a negative feedback input to the amplifier. In an embodiment, the first input current flows through a first power semiconductor switch of the power converter, and the second input current flows through second power semiconductor switch of the power converter. The first input current and the second input current flow through an inductor (an output filter inductor) of the power converter. Thus, an integrated current replicator for a power converter formed with first and second transconductance amplifiers coupled respectively to first and second current sense resistors to produce a voltage replicating first and second input currents is introduced that provides highly accurate, temperature-independent sensing of first and second input currents with wide bandwidth.

Figure 7:
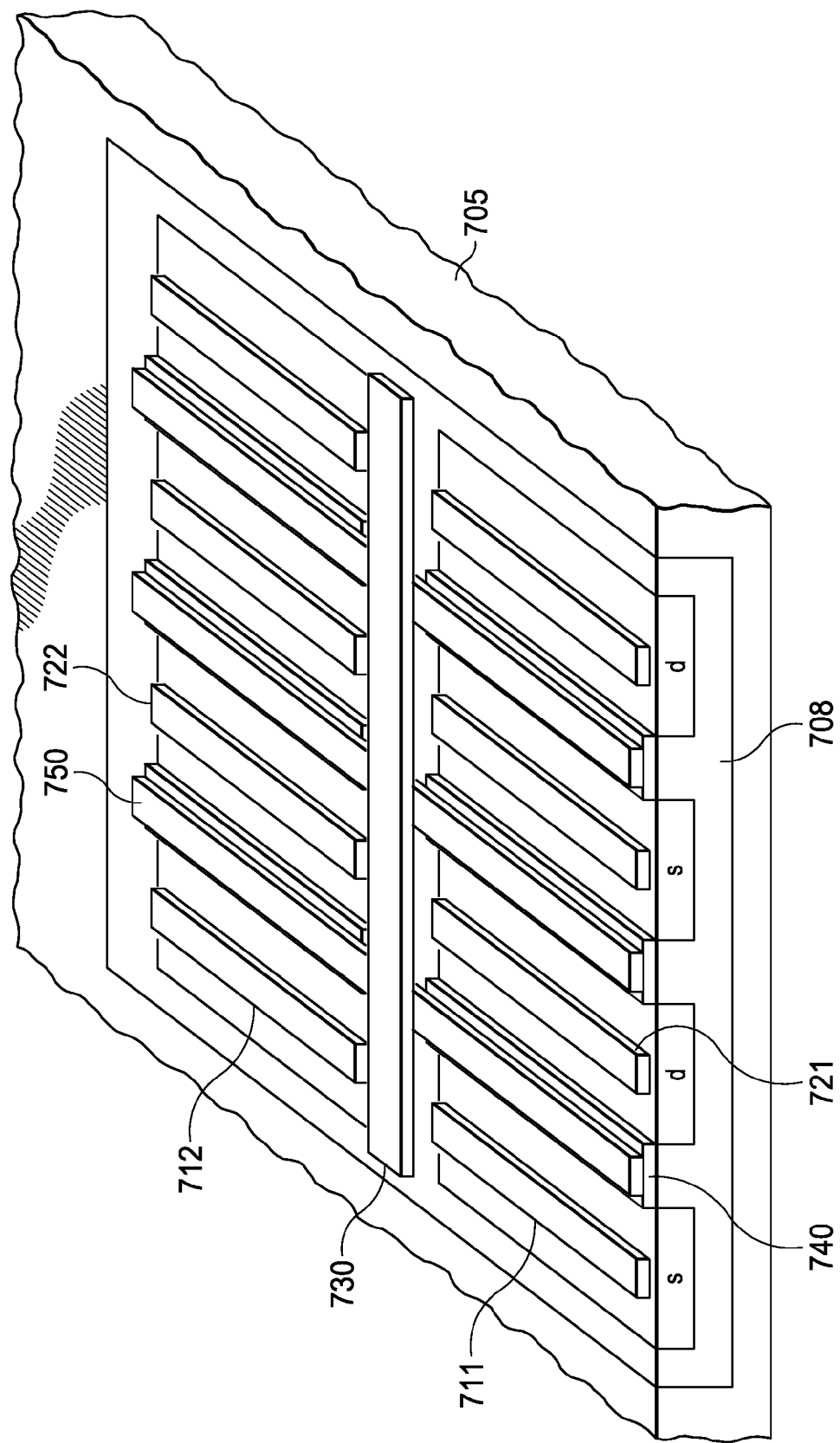
FIG. 7 illustrates a simplified three-dimensional view of an embodiment of a portion of a partially constructed N-type laterally diffused metal oxide semiconductor ("N-LDMOS") device embodied in a semiconductor device, or portions thereof.

Turning now to FIG. 7, illustrated is a simplified three-dimensional view of an embodiment of a portion of a partially constructed N-LDMOS device embodied in a semiconductor device, or portions thereof. The N-LDMOS device is formed in a semiconductor die including a lightly doped P substrate 705 and a P-well 708 implanted in the lightly doped P substrate 705. The P-well 708 includes a sequence of doped source regions "s" and drain regions "d" in an alternating pattern, laid out as parallel strips in the P-well 708 or directly on the lightly doped P substrate 705 when the optional P-well 708 is not implanted. Source metallic (e.g., aluminum) strips (ones of which are designated 711, 712) are formed in a substantially planar first metallic (e.g., aluminum) layer M1 and lie over and electrically contact the doped source regions "s," but not to each other. Correspondingly, drain metallic (e.g., aluminum) strips (ones of which are designated 721, 722) are also formed in the first metallic layer M1 and lie over and electrically contact the doped drain regions "d," but not to each other.

A plurality of alternating source and drain metallic strips (e.g., 711, 721, are formed in the first metallic layer M1 above the lightly doped P substrate 705 and parallel to and forming an electrical contact with respective ones of a plurality of source and drain regions. Gate oxide strips (one of which is designated 740) isolate gate polysilicon strips (one of which is designated 750) from the underlying P-well 708 or from the lightly doped P substrate 705 when the optional P-well 708 is not implanted. Thus, a plurality of gate polysilicon strips 750 are formed over the lightly doped P substrate 705 between and parallel to ones of the plurality of source and drain regions and oriented parallel to the plurality of alternating source and drain metallic strips. Not shown in FIG. 7 are additional and differently doped strips formed in the P-well 708 or in the lightly doped P substrate 705 that lie between and separate the doped source regions "s" and the doped drain regions "d". A gate metallic (e.g., aluminum) strip 730 in the first metallic layer M1 is positioned over, aligned perpendicular to, and is electrically coupled to the gate polysilicon strips 750.

Figure 8:
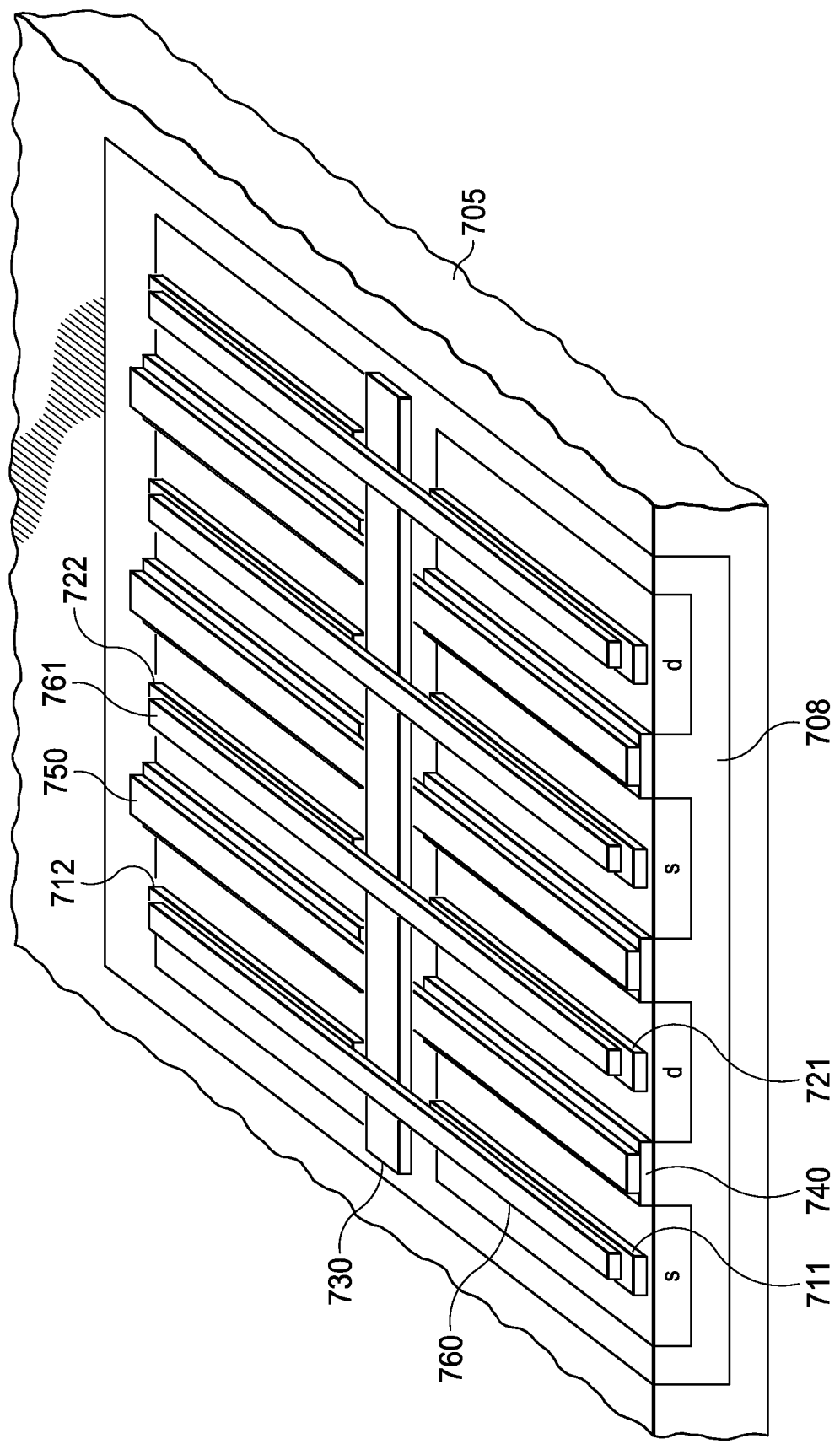
FIG. 8 illustrates a simplified three-dimensional view of a portion of the partially constructed N-LDMOS device after formation of a substantially planar second metallic layer.

Turning now to FIG. 8, illustrated is a simplified three-dimensional view of a portion of the partially constructed N-LDMOS device after formation of a substantially planar second metallic (e.g., aluminum) layer M2. The second metallic layer M2 is formed in strips such as source metallic (e.g., aluminum) strips (one of which is designated 760) and drain metallic (e.g., aluminum) strips (one of which is designated 761) that lie over respective source metallic strips 711, 712 and drain metallic strips 721, 722 formed in the first metallic layer M1. An isolation or insulating layer of silicon oxynitride (see, e.g., FIG. 19) separates and electrically isolates the first metallic layer M1 from the second metallic layer M2. The source metallic strips 760 in the second metallic layer M2 layer that lie over the source metallic strips 711, 712 in the first metallic layer M1 are coupled thereto by electrically conductive vias. Similarly, the drain metallic strips 761 in the second metallic layer M2 layer that lie over the drain metallic strips 721, 722 in the first metallic layer M1 are coupled thereto by electrically conductive vias. Thus, a second plurality of alternating source and drain metallic strips are formed in the second metallic layer M2 above the first metallic layer M1 overlying and parallel to ones of the first plurality of alternating source and drain metallic strips. The first plurality of source and drain metallic strips are electrically coupled by vias to the respective second plurality of alternating source and drain metallic strips. The source and drain metallic strips 760, 761 in the second metallic layer M2 are not coupled to the gate metallic strip 730 in the first metallic layer M1 that intersects and is electrically coupled to the gate polysilicon strips 750.

Figure 9:
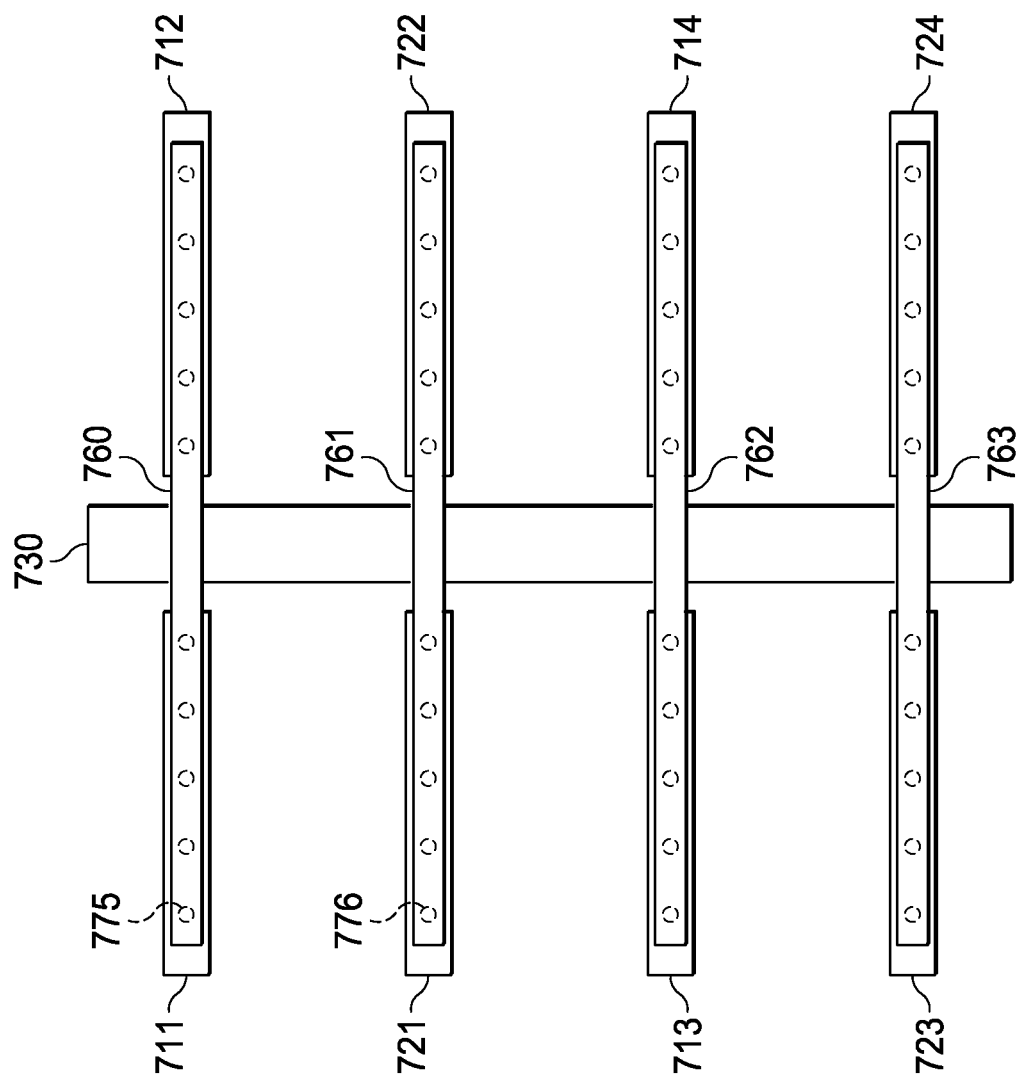
FIG. 9 illustrates a simplified plan view of a portion of the partially constructed N-LDMOS device after formation of the second-metallic layer.

Turning now to FIG. 9, illustrated is a simplified plan view of a portion of the partially constructed N-LDMOS device after formation of the second-metallic layer M2. FIG. 9 illustrates vias (one of which is designated 775) that electrically couple source metallic strips 711, 712, 713, 714 in the first metallic layer M1 to source metallic strips 760, 762 in the second metallic layer M2. Similarly, vias (one of which is designated 776) electrically couple drain metallic strips 721, 722, 723, 724 in the first metallic layer M1 to drain metallic strips 761, 763 in the second metallic layer M2. The vias 775, 776 penetrate an isolation or insulating layer (see, e.g., insulating layer 1915 in FIG. 19) that separates and electrically isolates (insulates) the first metallic layer M1 from the second metallic layer M2. It is noted that, in an embodiment, vias do not electrically couple the gate metallic strip 730 in the first metallic layer M1 to either the source metallic strips 760, 762 or the drain metallic strips 761, 763 in the second metallic layer M2.

Figure 10:
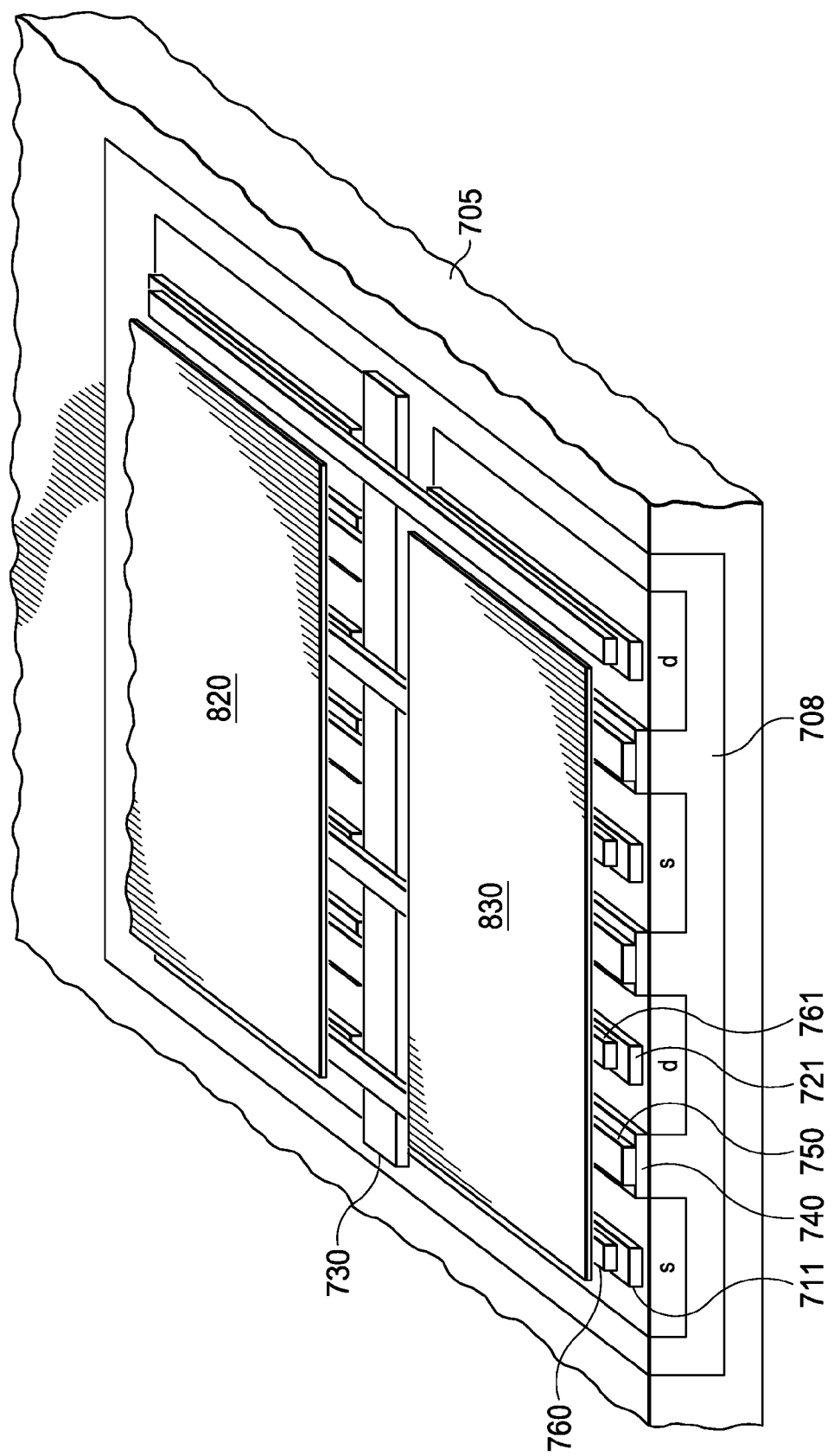
FIG. 10 illustrates a simplified three-dimensional view of a portion of the partially constructed N-LDMOS device after formation of a substantially planar third metallic layer.

Turning now to FIG. 10, illustrated is a simplified three-dimensional view of a portion of the partially constructed N-LDMOS device after formation of a substantially planar third metallic (e.g., aluminum) layer M3. The third metallic layer M3 overlies the second metallic layer M2. FIG. 10 illustrates N-LDMOS device source contact 830 formed in the third metallic layer M3, and N-LDMOS device drain contact 820, also formed in the third metallic layer M3. An isolation or insulating layer of silicon oxynitride (see, e.g., FIG. 19) separates and electrically isolates the second metallic layer M2 from the third metallic layer M3. The N-LDMOS device drain contact 820 is shared with a P-LDMOS device drain contact formed on the same die (also referred to as an "N-LDMOS/P-LDMOS device drain contact" 820). The N-LDMOS device source contact 830 is electrically coupled to the source metallic strips (one of which is designated 760) in the second metallic layer M2 by vias (e.g., aluminum vias, not shown in FIG. 10). The N-LDMOS/P-LDMOS device drain contact 820 is electrically coupled to the drain metallic strips (one of which is designated 761) in the second metallic layer M2 by vias (e.g., aluminum vias not shown in FIG. 10). Thus, the source and drain contacts formed in the third metallic layer M3 are electrically coupled by vias to ones of the second plurality of alternating source and drain metallic strips in the second metallic layer M2 and substantially cover the plurality of source and drain regions.

Figure 11:
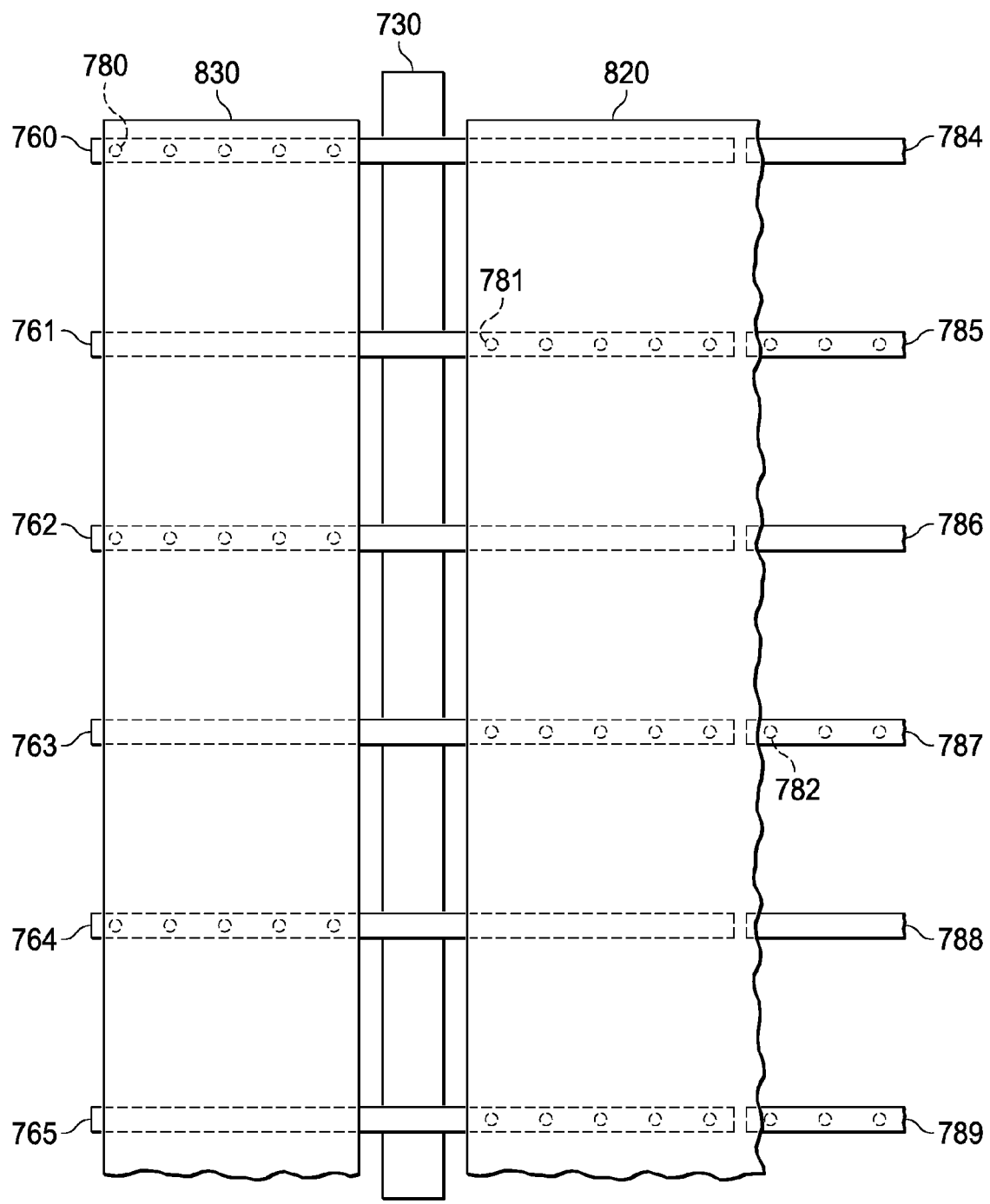
FIG. 11 illustrates a simplified plan view of a portion of the partially constructed N-LDMOS device after formation of the third metallic layer.

Turning now to FIG. 11, illustrated is a simplified plan view of a portion of the partially constructed N-LDMOS device after formation of the third metallic layer M3. FIG. 11 illustrates vias (one of which is designated 780) that electrically couple the N-LDMOS device source contact 830 formed in the third metallic layer M3 to the source metallic strips 760, 762, 764 in the second metallic layer M2. Also illustrated in FIG. 11 are vias (one of which is designated 781) that electrically couple the N-LDMOS/P-LDMOS device drain contact 820 formed in the third metallic layer M3 to drain metallic strips 761, 763, 765 in the second metallic layer M2. Also shown are vias (one of which is designated 782) that electrically couple the N-LDMOS/P-LDMOS device drain contact 820 formed in the third metallic layer M3 to P-LDMOS device drain metallic strips 785, 787, 789 in the second metallic layer M2 of a P-LDMOS device. P-LDMOS device source metallic strips 784, 786, 788 in the second metallic layer M2 of the P-LDMOS device are electrically coupled by vias to P-LDMOS device source contact 810 in the third metallic layer M3 (see FIG. 13). The vias 780, 781, 782 penetrate an isolation or insulating layer (see, e.g., insulating layers 1915 shown in FIG. 19) that separates and electrically isolates (insulates) the second metallic layer M2 from the third metallic layer M3. Also illustrated in FIG. 11 is the gate metallic strip 730 in the first metallic layer M1 that intersects and is electrically coupled to the gate polysilicon strips 750 (see, e.g., FIG. 8).

Figure 12:
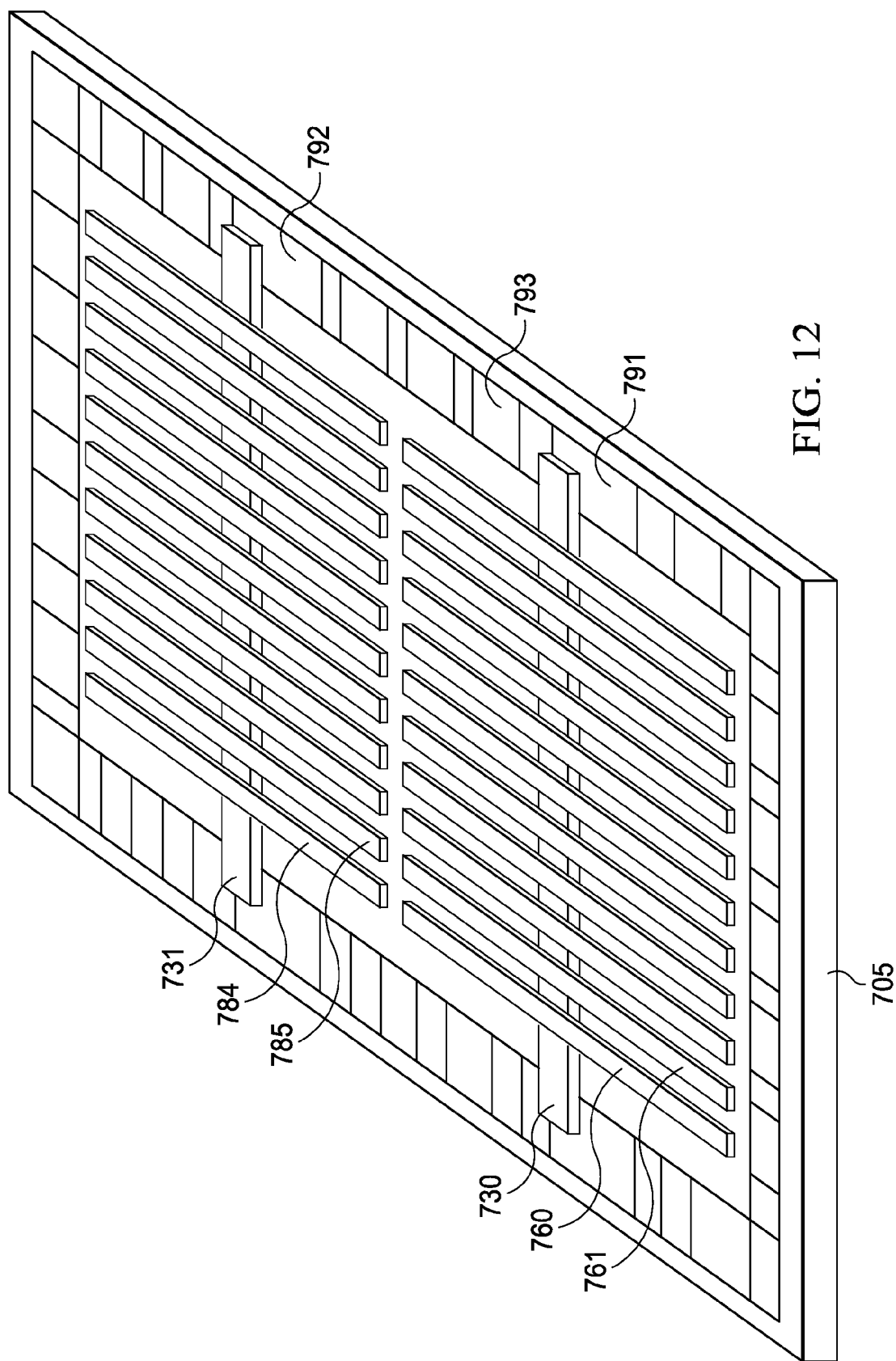
FIG. 12 illustrates a simplified three-dimensional view of an embodiment of a partially constructed semiconductor device including N-LDMOS and P-LDMOS devices, illustrating geometry of the source metallic strips and the drain metallic strips in the second metallic layer thereof.

Turning now to FIG. 12, illustrated is a simplified three-dimensional view of an embodiment of a partially constructed semiconductor device including N-LDMOS and P-LDMOS devices, illustrating geometry of the source metallic strips and the drain metallic strips in the second metallic layer M2 thereof. FIG. 12 illustrates gate drivers at the periphery of the semiconductor die coupled to the N-LDMOS and P-LDMOS devices such as an N-gate driver 791 and P-gate driver 792. Thus, the N-LDMOS device has a plurality of N-gate drivers (such as N-gate driver 791) and P-LDMOS device has a plurality of P-gate drivers (such as P-gate driver 792) around the periphery of the semiconductor die. Also illustrated in FIG. 12 are logic circuit elements located at the periphery of the semiconductor die such as logic circuit element 793. The metallizations on the second metallic layer M2 overlie and are electrically coupled to respective metallizations on the first metallic layer M1 by vias as previously described hereinabove. For simplicity of illustration, portions of the first metallic layer M1 underlying the second metallic layer M2 are not illustrated in FIG. 12. Also shown in FIG. 12 are gate metallic strips 730, 731 in the first metallic layer M1 that intersect and are electrically coupled to the gate polysilicon strips (not shown) of the N-LDMOS and P-LDMOS devices. For purposes of consistency with the previous FIGUREs, particularly FIG. 11, the source metallic strip 760 and the drain metallic strip 761 in the second metallic layer M2 of the N-LDMOS device and the source metallic strip 784 and the drain metallic strip 785 in the second metallic layer M2 of the P-LDMOS device are designated in FIG. 12.

Figure 13:
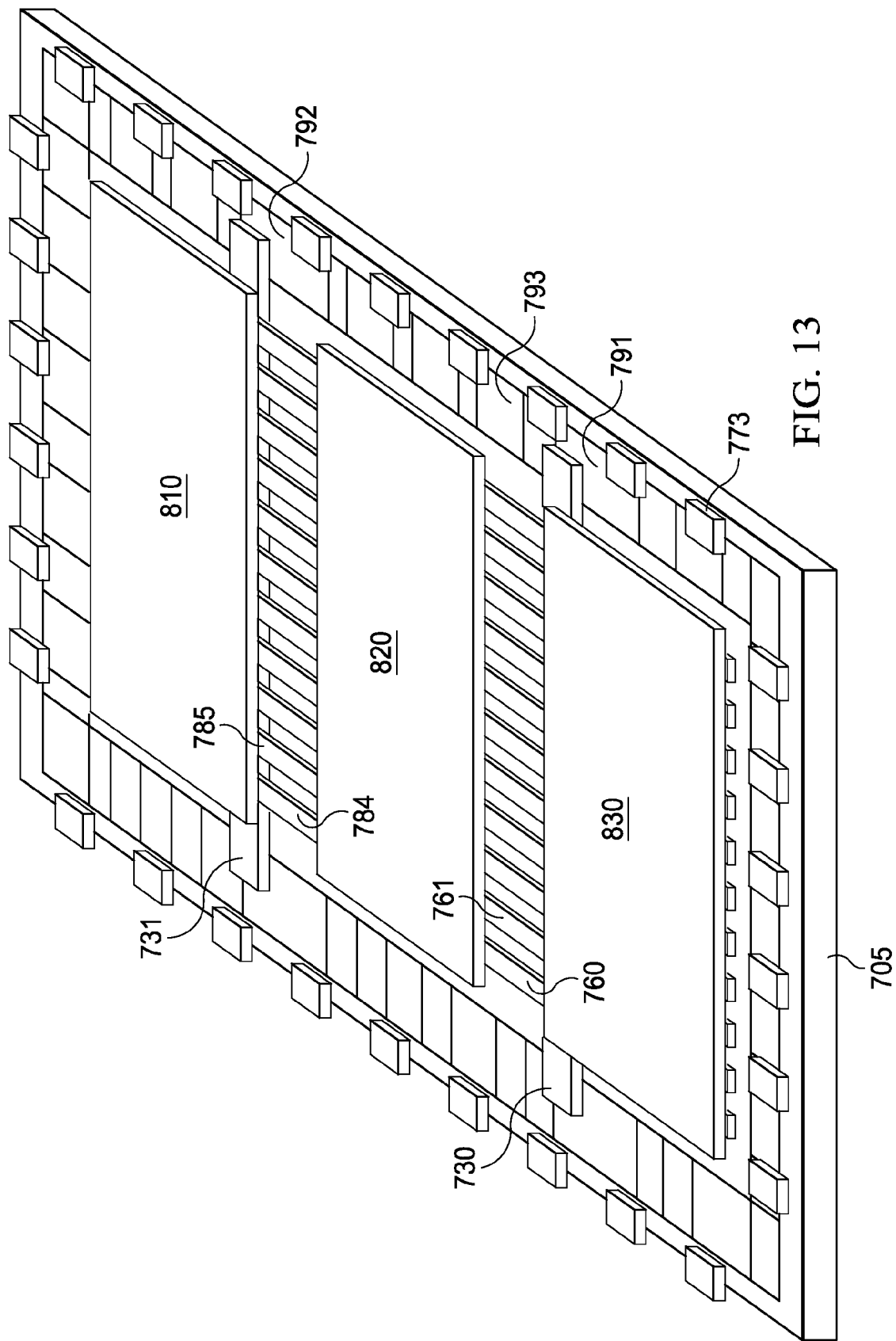
FIG. 13 illustrates a simplified three-dimensional view of the partially constructed semiconductor device including N-LDMOS and P-LDMOS devices illustrating a geometry of source and drain contacts in the third metallic layer.

Turning now to FIG. 13, illustrated is a simplified three-dimensional view of the partially constructed semiconductor device including N-LDMOS and P-LDMOS devices illustrating a geometry of source and drain contacts (i.e., conductive regions) in the third metallic layer M3. The lightly P-doped substrate 705 is illustrated in FIG. 13, but the optional P-well located in an upper portion thereof is not shown. The N-LDMOS/P-LDMOS device drain contact 820 is positioned between the N-LDMOS device source contact 830 and a P-LDMOS device source contact 810 in the third metallic layer M3. FIG. 13 also illustrates gate driver and logic circuit element contacts (one of which is designated 773) that are located at the periphery of the semiconductor device in the third metallic layer M3.

Figure 14:
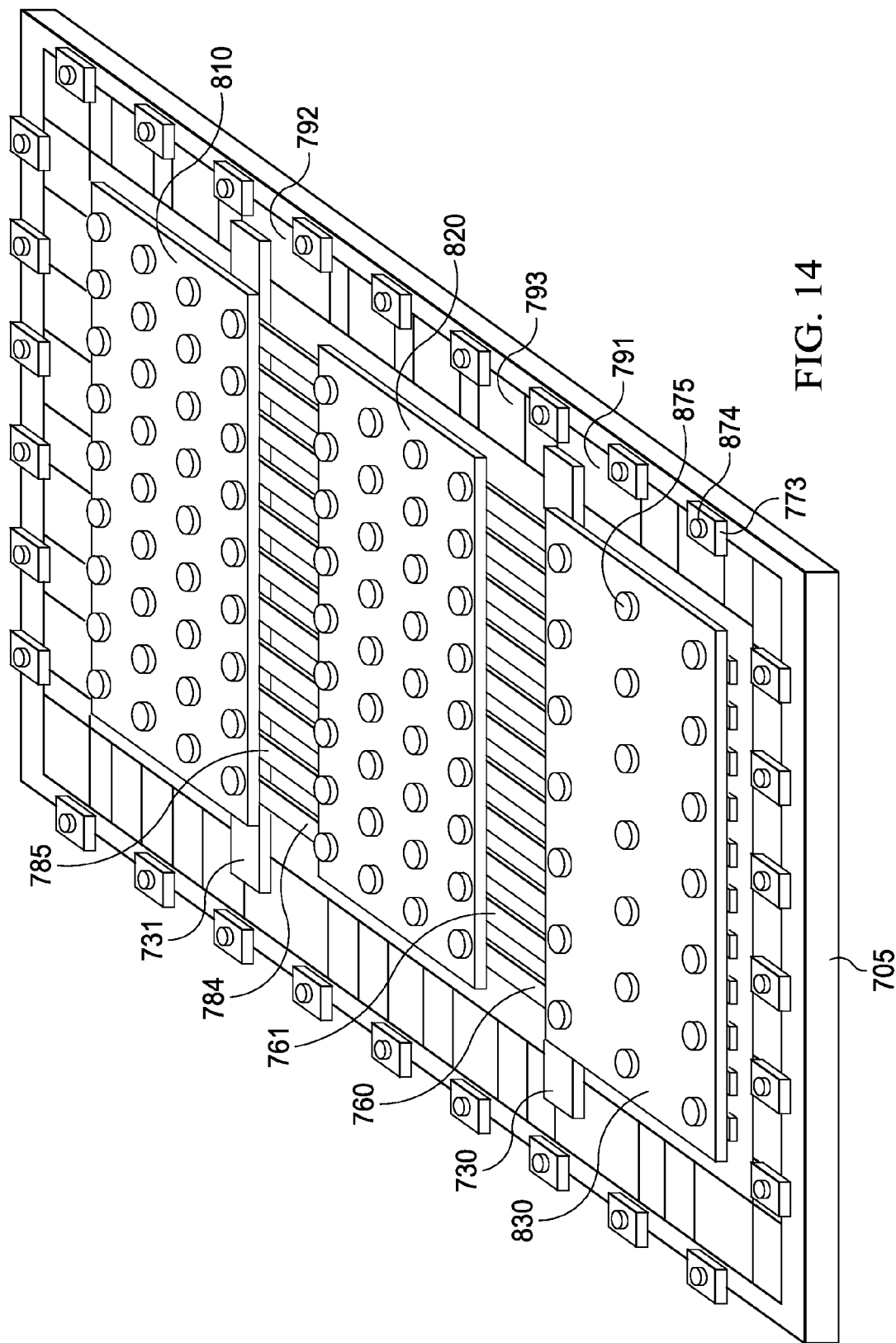
FIG. 14, illustrated is a simplified three-dimensional view of the partially constructed semiconductor device including N-LDMOS and P-LDMOS devices illustrating a geometry of vias for a redistribution layer.

Turning now to FIG. 14, illustrated is a simplified three-dimensional view of the partially constructed semiconductor device including N-LDMOS and P-LDMOS devices illustrating a geometry of vias (e.g., copper vias ones of which are designated 874, 875) for a redistribution layer (e.g., a copper redistribution layer). The copper vias 874, 875 provide electrical contact between the third metallic layer M3 and the redistribution layer. The copper vias 874, 875 penetrate an isolation or insulating layer (see, e.g., first polyimide layer 1935 in FIG. 19) that separate and electrically isolates (insulates) the third metallic layer M3 from the redistribution layer.

Figure 15:
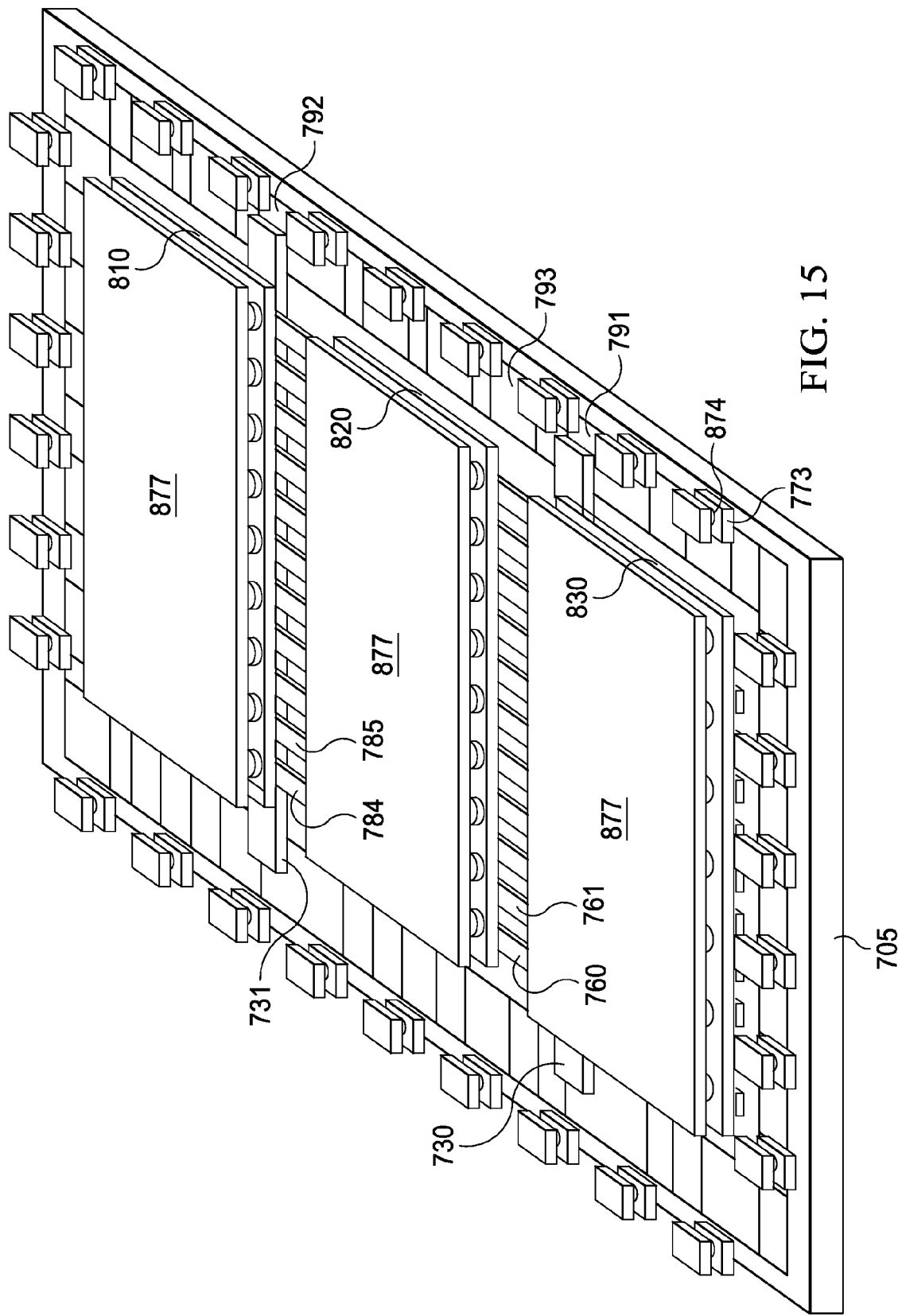
FIG. 15 illustrates a simplified three-dimensional view of the partially constructed semiconductor device including N-LDMOS and P-LDMOS devices illustrating a geometry of a redistribution layer.

Turning now to FIG. 15, illustrated is a simplified three-dimensional view of the partially constructed semiconductor device including N-LDMOS and P-LDMOS devices illustrating a geometry of a redistribution layer (e.g., a copper redistribution layer) 877. The redistribution layer 877 is shown as patterned over respective metallizations on the third metallic layer M3 and electrically coupled to the metallizations on the third metallic layer M3 by the copper vias 874, 875 (see also FIG. 14). Again, the redistribution layer 877 is separated from the third metallic layer M3 by an isolation or insulating layer but coupled to it by vias (see FIG. 19).

Figure 16:
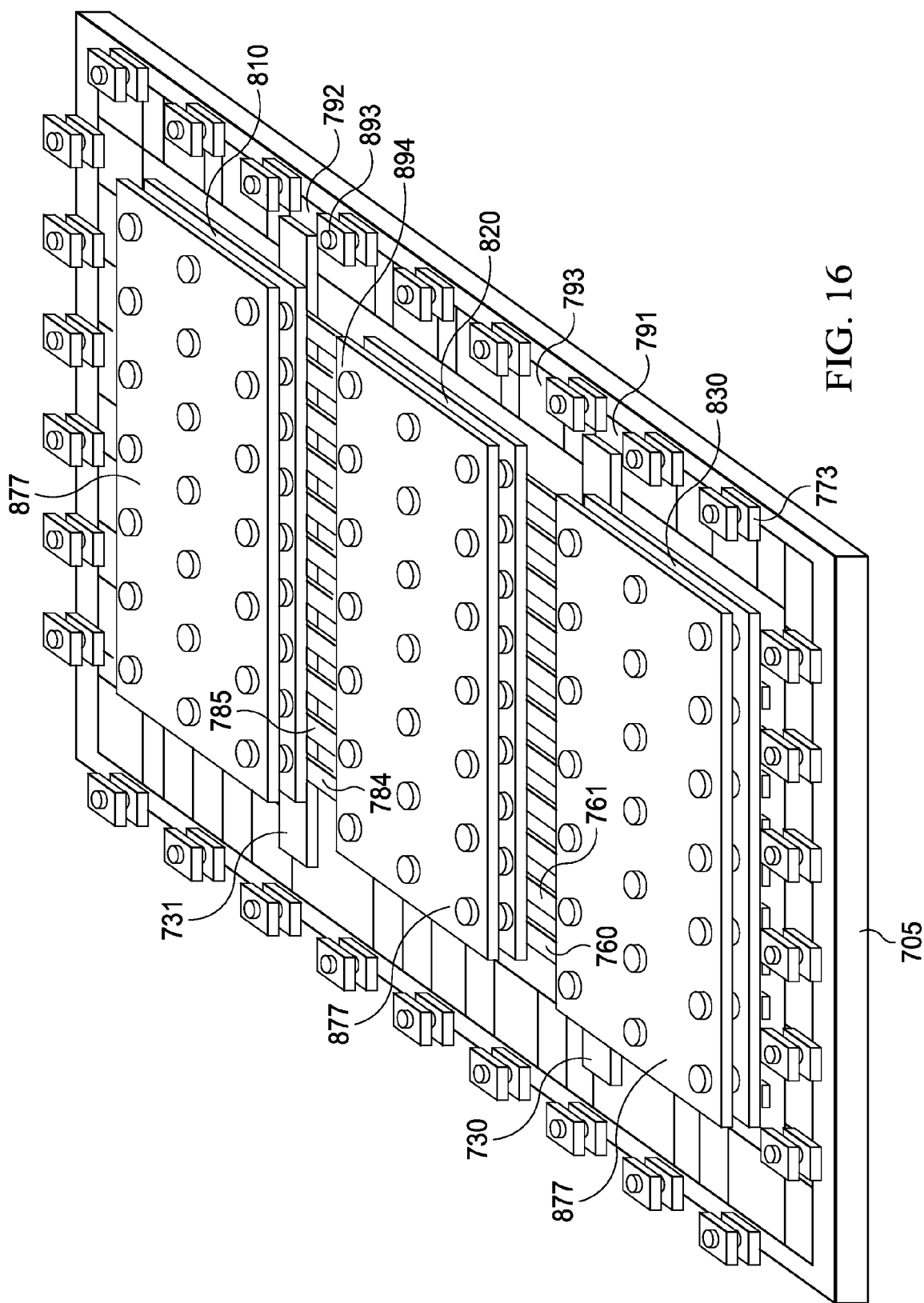
FIG. 16 illustrates a simplified three-dimensional view of the partially constructed semiconductor device including N-LDMOS and P-LDMOS devices illustrating a geometry of pillars for the redistribution layer.

Turning now to FIG. 16, illustrated is a simplified three-dimensional view of the partially constructed semiconductor device including N-LDMOS and P-LDMOS devices illustrating a geometry of pillars (e.g., copper pillars, ones of which are designated 893, 894) for the redistribution layer 877. The copper pillars 893, 894 provide electrical contact between the redistribution layer 877 and a conductive patterned leadframe.

Figure 17:
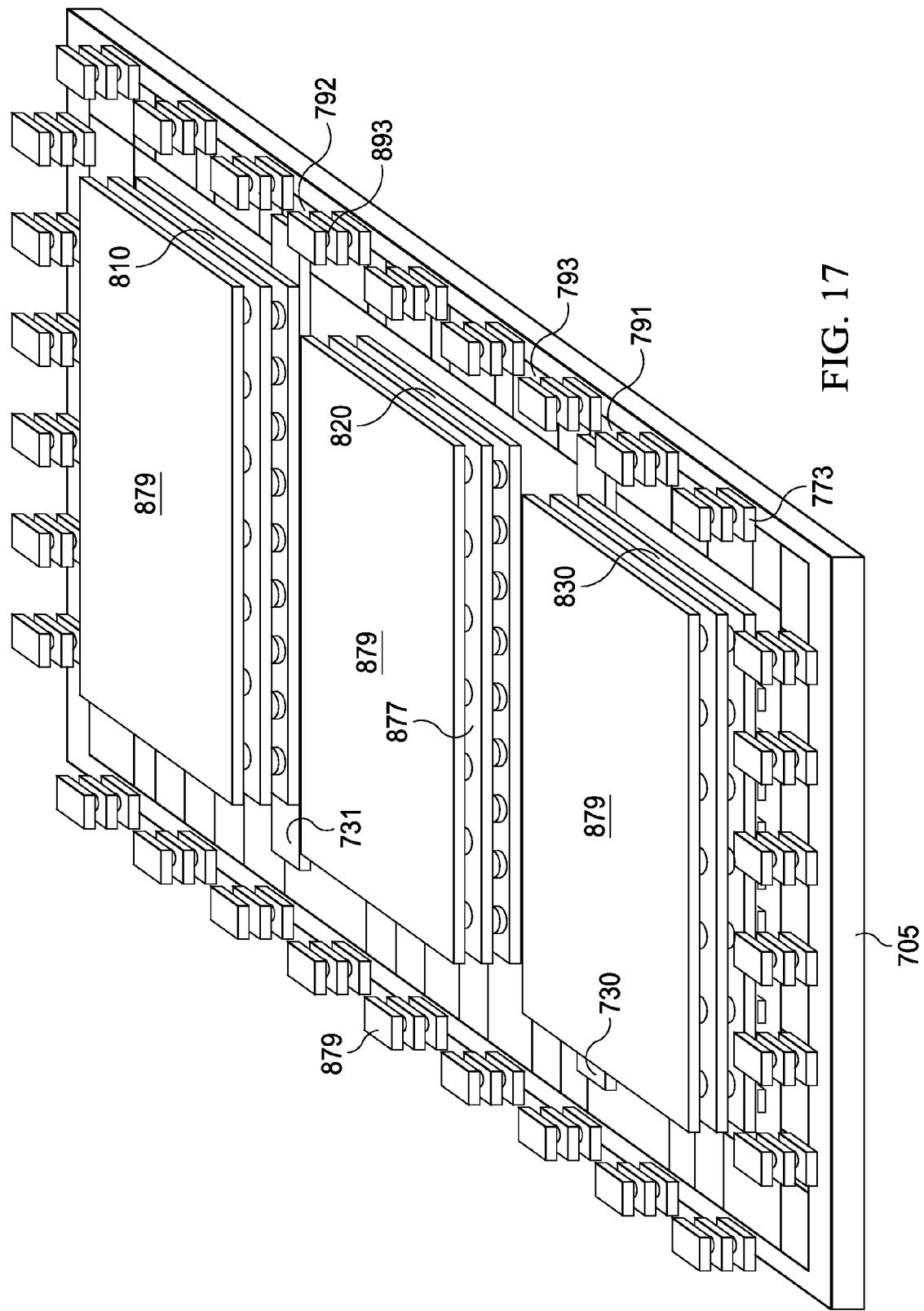
FIG. 17 illustrates a simplified three-dimensional view of the partially constructed semiconductor device including N-LDMOS and P-LDMOS devices illustrating geometry of a conductive patterned leadframe.

Turning now to FIG. 17, illustrated is a simplified three-dimensional view of the partially constructed semiconductor device including N-LDMOS and P-LDMOS devices illustrating geometry of a conductive patterned leadframe 879. The leadframe 879 is shown as patterned over the redistribution layer 877 and electrically coupled to the redistribution layer 877 by the copper pillars 893, 894 (see also FIG. 16).

Figure 18:
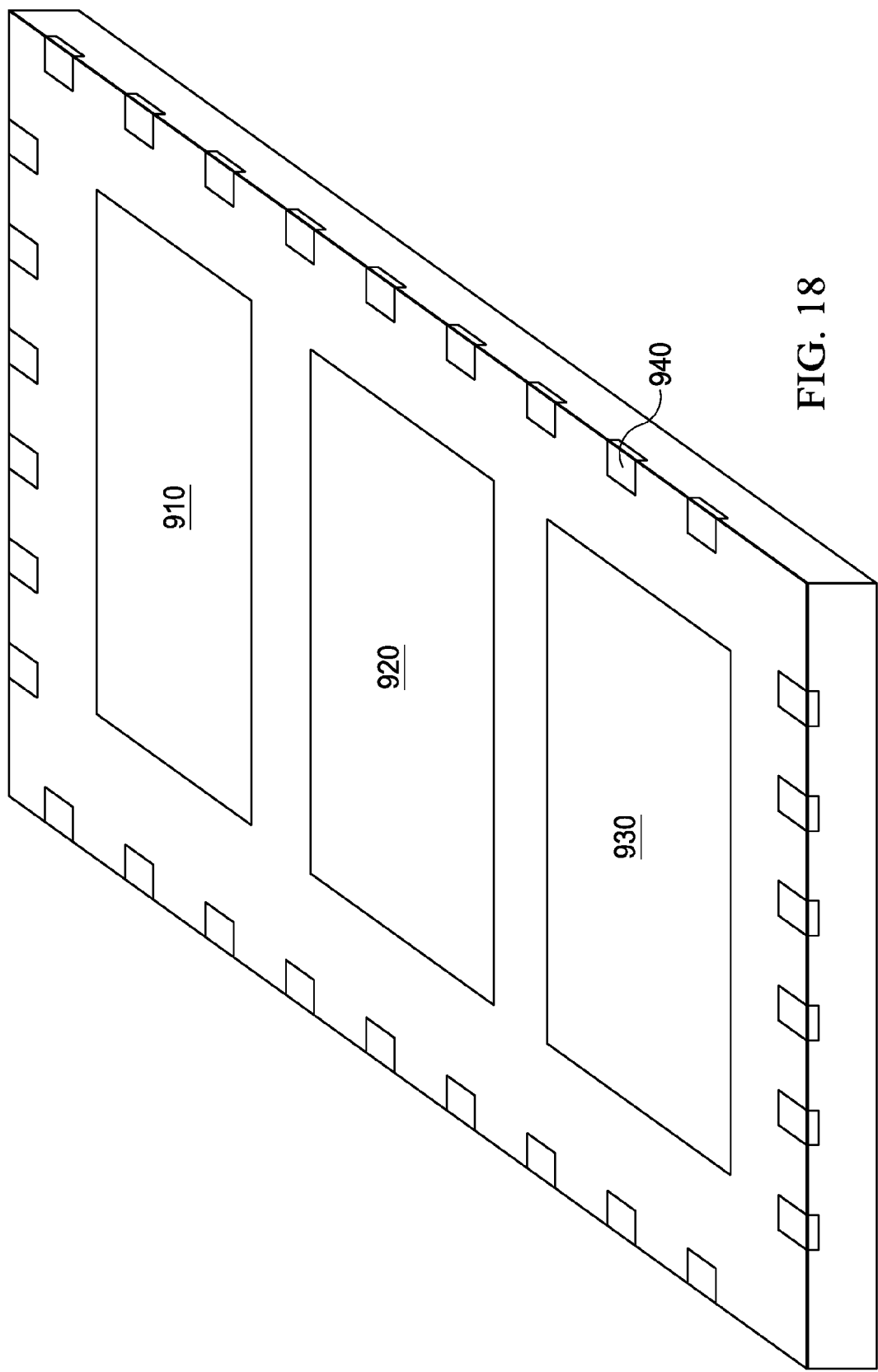
FIG. 18 illustrates a three-dimensional external view of an embodiment of a potted semiconductor device including N-LDMOS and P-LDMOS devices.

Turning now to FIG. 18, illustrated is a three-dimensional external view of an embodiment of a potted semiconductor device (with an encapsulant such as epoxy) including N-LDMOS and P-LDMOS devices. Portions of the leadframe 879 (see FIG. 17) are exposed to serve as external contacts for the semiconductor device. An external N-LDMOS/P-LDMOS device drain contact 920 is positioned between an external N-LDMOS device source contact 930 and an external P-LDMOS device source contact 910, and external gate driver and logic circuit element contacts (one of which is designated 940) are located about a periphery of the semiconductor device. A potting material employable in an embodiment is an encapsulant such as epoxy, but other potting materials including potting materials with enhanced thermal characteristics are contemplated within the broad scope of the present invention. The external electrical contact surfaces of the semiconductor device can be coated with a copper flash/seed layer and then electroplated with copper to form an easily solderable metallic surface. The external surface can also be plated with a thin layer of gold or other inert metal or alloy to provide a further level of passivation for a soldering or other attachment process. The potted or packaged semiconductor device of FIG. 18 may be placed on a printed circuit board proximate a decoupling device to provide the advantages as set forth above.

Figure 19:
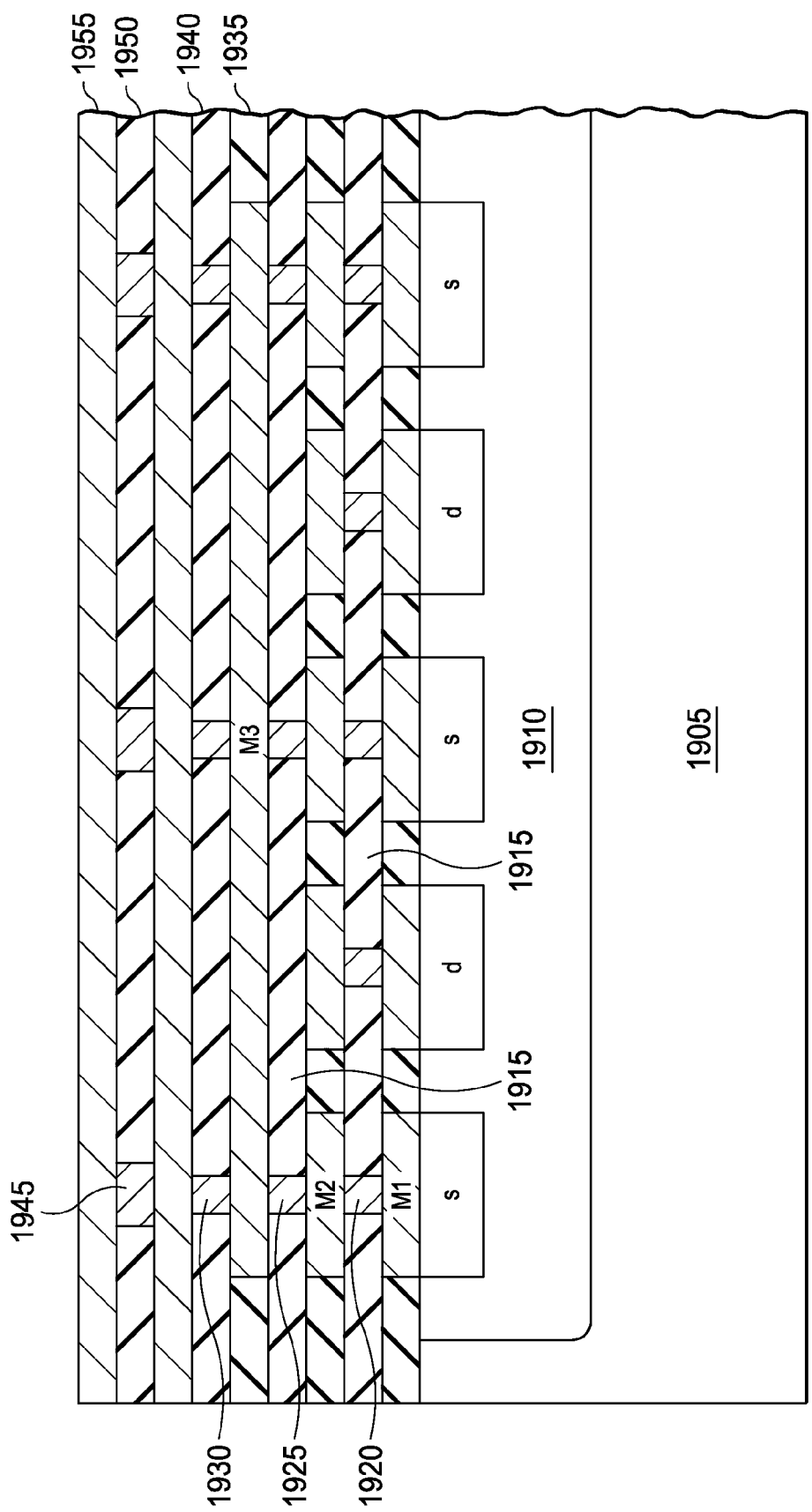
FIG. 19 illustrates an elevational view of an embodiment of a portion of a semiconductor device including N-LDMOS and/or P-LDMOS devices.

Turning now to FIG. 19, illustrated is an elevational view of an embodiment of a portion of a semiconductor device including N-LDMOS and/or P-LDMOS devices. The N-LDMOS and/or P-LDMOS devices are formed in a semiconductor die including a well 1910 located above lightly doped substrate 1905 with the doped source regions "s" and drain regions "d" located therein. First, second and third metallic layers M1, M2, M3 are separated and insulated from one another by silicon oxynitride layers (generally designated 1915) and lie above and are in electrical contact with the doped source regions "s" and doped drain regions "d". Vias (one of which is designated 1920) provide electrical contact between metallizations on the first and second metallic layers M1, M2. Vias (one of which is designated 1925) provide electrical contact between metallizations on the second and third metallic layers M2, M3. Copper vias (one of which is designated 1930) are formed in a first polyimide layer 1935 to provide electrical contact between the third metallic layer M3 and a copper redistribution layer 1940 that is formed above the first polyimide layer 1935. Copper pillars (one of which is designated 1945) are formed in a second polyimide layer 1950 to provide electrical contact between the copper redistribution layer 1940 and a copper leadframe 1955 that is formed above the second polyimide layer 1950. It should be understood that the specified materials for the respective layers are only examples and other materials bearing similar properties may be employed to advantage.

Figure 20:
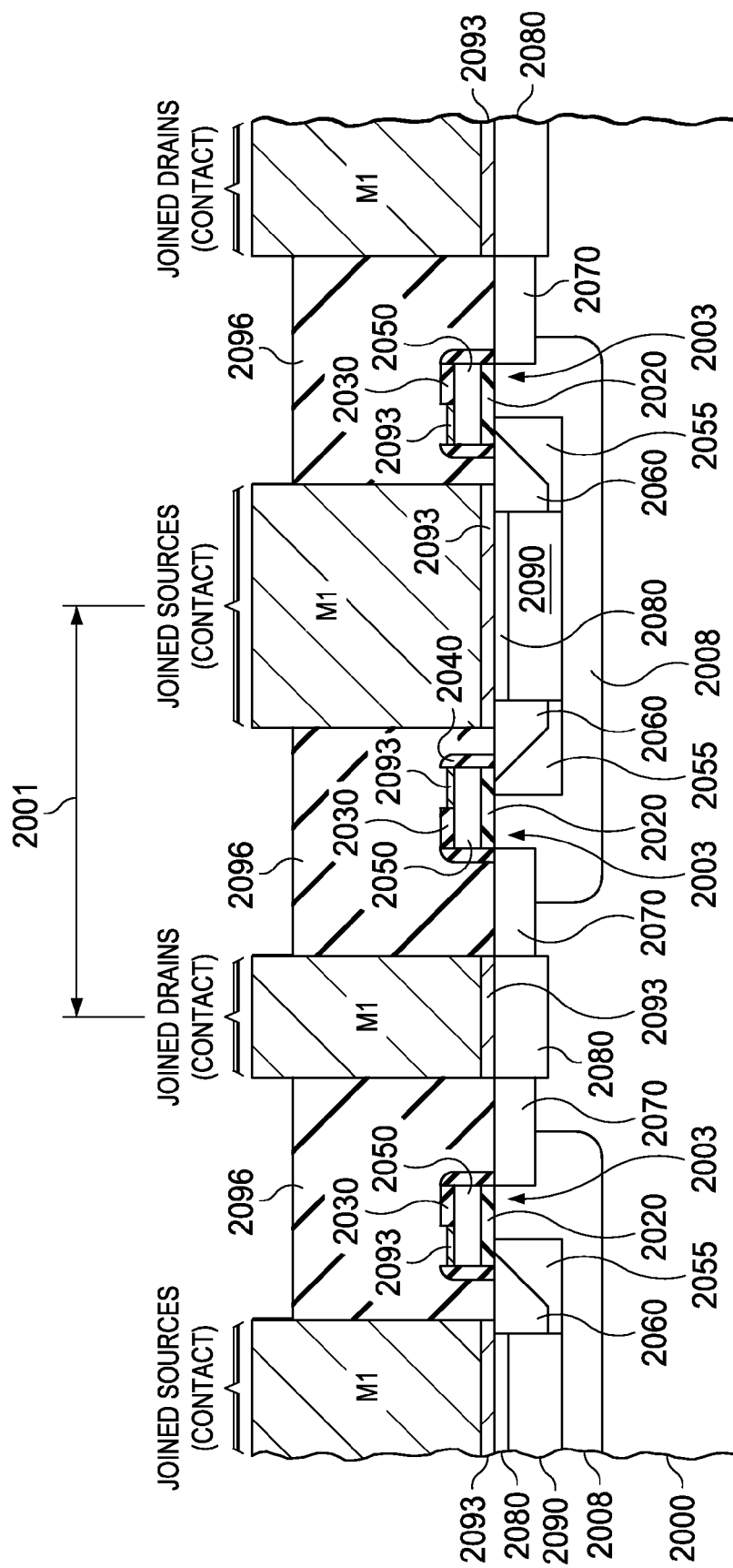
FIG. 20 illustrates a cross-sectional view of an embodiment of an N-LDMOS device embodied in a semiconductor device, or portions thereof.

Turning now to FIG. 20, illustrated is a cross-sectional view of an embodiment of an N-LDMOS device embodied in a semiconductor device, or portions thereof. The N-LDMOS device is formed in a semiconductor die including a P-doped semiconductor substrate (also referred to as a "substrate") 2000 and, on a surface thereof, an optional epitaxial layer can be grown (e.g., a lightly doped P-type epitaxial layer, not shown). Although in the illustrated embodiment the substrate 2000 is a P-type substrate, one skilled in the art understands that the substrate 2000 could be an N-type substrate without departing from the scope of the present invention.

The N-LDMOS device is formed of a plurality of N-LDMOS cells, such as the N-LDMOS cell 2001 illustrated in FIG. 20. The N-LDMOS device includes P-type wells 2008 and heavily doped P-type regions 2090 formed thereover. Heavily doped N-type regions 2060, 2080 are formed on either side of or above the heavily doped P-type regions 2090. The heavily doped N-type regions 2060 are formed with a lower doping density than the heavily doped N-type regions 2080, particularly in a lateral direction away from the heavily doped N-type region 2080. The heavily doped N-type regions 2060, 2080 provide an ohmic junction through a silicide layer 2093 formed thereover. The silicide layer 2093 provides a heavily conductive junction between the heavily doped N-type regions 2060, 2080 and a first metallic (e.g., aluminum) layer M1 to ultimately provide source contacts (designated "joined sources (contact)") for the N-LDMOS device. The heavily doped N-type region 2080 that lies over the heavily doped P-type region 2090 is thin (e.g., about 10 to 100 Å) so that the resulting P-N junction that is thereby formed between the heavily doped N-type region 2080 and the heavily doped P-type region 2090 will be substantially an ohmic junction highly conductive in both directions. Accordingly, the P-N junction formed therebetween will not be operable as a diode. Similarly, the silicide layer 2093 provides a heavily conductive junction between the heavily doped N-type regions 2080 and the first metallic layer M1 to ultimately provide drain contacts (designated "joined drains (contact)") for the N-LDMOS device. The first metallic layers M1 for the sources and drains are separated by an insulating layer such as amorphous silicon oxynitride ("$Si_xO_yN_z$") layers 2096.

P-type regions 2055 are formed adjacent to the heavily doped N-type regions 2060 and the heavily doped P-type regions 2090 within the P-type wells 2008. Channel regions 2003 are formed under the gates between the heavily doped N-type regions 2060 and lightly doped N-type regions 2070. The P-type regions 2055 are formed in the P-type wells 2008 by ion injection at an angle off vertical under the gates that will be formed above the channel regions 2003 and are used to control a threshold voltage of the N-LDMOS device.

The gates are formed with gate polysilicon layers 2050 with underlying and overlying gate oxide layers 2020, 2030 and sidewall spacers (one of which is designated 2040) thereabout. The gate polysilicon layers 2050 above the channel regions 2003 control a level of conductivity therein. The underlying gate oxide layers 2020 form an isolation layer between the gate polysilicon layers 2050 and the P-type wells 2008 and the P-type regions 2055. A portion of the overlying gate oxide layers 2030 is removed over the gate polysilicon layers 2050 and a silicide layer 2093 is formed thereover to reduce gate resistance.

With continuing reference to FIG. 7, the gate polysilicon layers 2050 (with the silicide layers 2093) form the gate polysilicon strips 750 across many N-LDMOS cells of the N-LDMOS device and are coupled to gate metallic strips 730 in the first metallic layer M1. The gate metallic strips 730 are routed to a plurality of gate drivers located at the periphery of the semiconductor device (see, e.g., FIG. 12). A substantially time-aligned switching signal to the gates of the N-LDMOS cells is thereby enabled by coupling the gate metallic strips 730 in the first metallic layer M1, which have a substantially greater electrical conductivity than the gate polysilicon strips 750, to the plurality of gate drivers.

Providing a time-aligned switching signal to the plurality of gates of individual N-LDMOS cells is an important design consideration in view of substantial effective capacitance that is created between the gates and the sources and drains, which requires a substantial gate-drive current to achieve a rapid switching transition. Failure to produce a temporally-aligned gate-drive signal to the gates of the individual N-LDMOS cells can enable some of the N-LDMOS cells to be turned on before others, which forces the early-switched cells to conduct high-current pulses during the temporally misaligned switching transitions. Temporally misaligned high-current pulses expose the N-LDMOS cells to device failure.

The illustrated structures also enable N-LDMOS and P-LDMOS devices to be formed with substantially the same structure in a common semiconductor die, and enable each LDMOS type to be coupled with a low-inductance, high-current path to an external circuit. Each LDMOS is formed with a single, large, source contact, and both with a single, large, and shared drain contact (see, e.g., FIG. 18), which can simplify circuit board layout and attachment issues to an external circuit. The large source and drain contacts are readily overlaid with a copper redistribution layer of substantially the same footprint as the large source and drain contacts (see, e.g., FIG. 15), and ultimately a leadframe (see, e.g., FIG. 17), which provides further improvement in conductivity and coupling a packaged semiconductor device (see, e.g., FIG. 18) to an external circuit. The source contacts and the shared drain contacts overlie substantially the entire active area of the N-LDMOS and P-LDMOS devices, with little die area wasted by high current contacts that do not overlie active switching areas.

With respect to the N-LDMOS cell 2001, the source (or source region) is embodied in at least the heavily doped N-type region 2060 and the drain (or drain region) is embodied in the lightly doped N-type region 2070 (e.g., a lightly doped drain ("LDD") region) and an adjacent heavily doped N-type region 2080 opposite the channel region 2003. The gate resides above the channel region 2003 with the layers as introduced herein. The LDD region provides a higher breakdown voltage for the N-LDMOS devices over conventional designs. These regions are formed in the sequence "heavily doped source region," "gate," "lightly doped drain region," and "heavily doped drain region."

Figure 21:
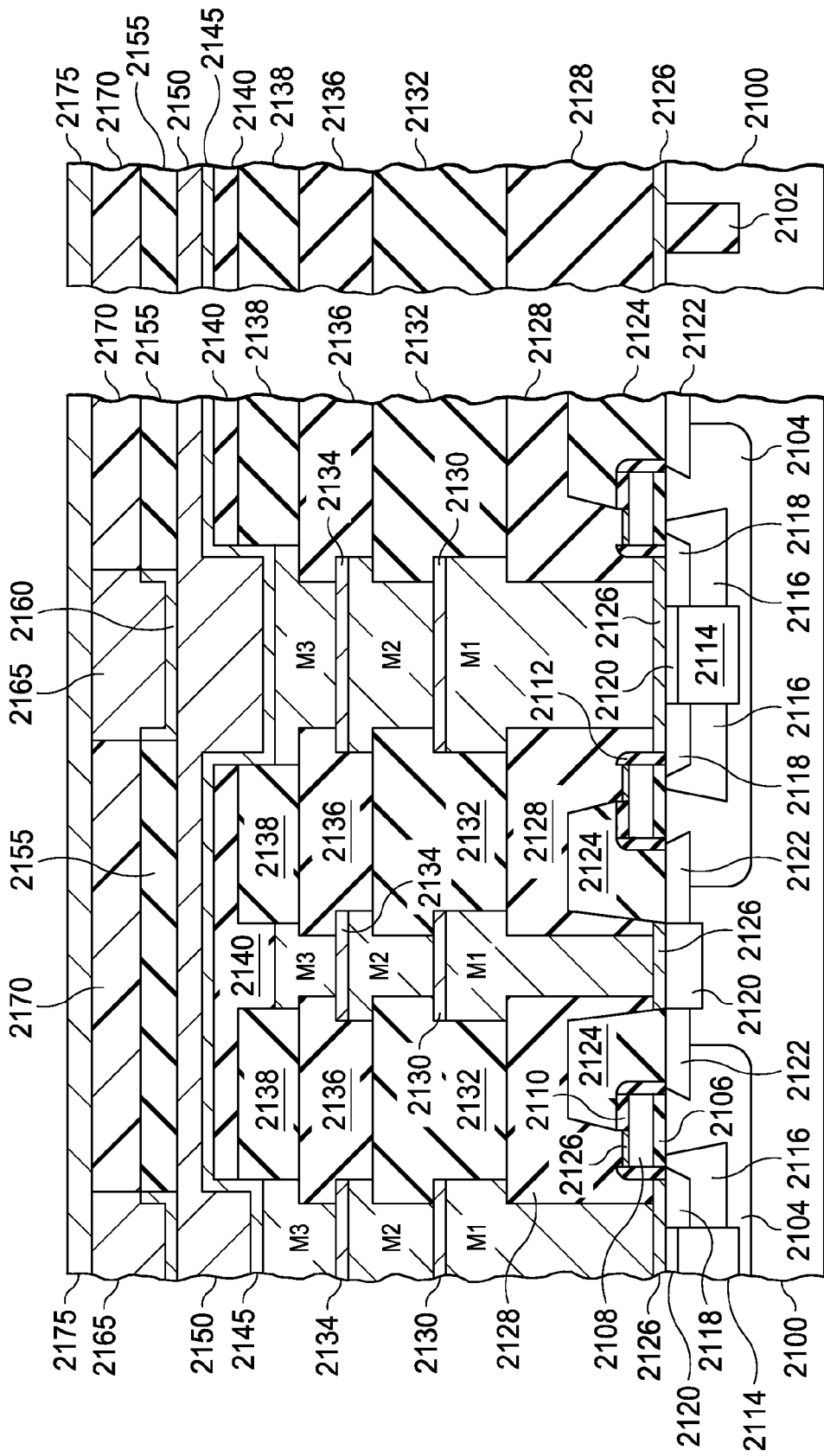
FIG. 21 illustrates a cross-sectional view of an embodiment of an N-LDMOS device embodied in a semiconductor device, or portions thereof.

Turning now to FIG. 21, illustrated is a cross-sectional view of an embodiment of an N-LDMOS device embodied in a semiconductor device, or portions thereof. The N-LDMOS device is formed in a semiconductor die including a P-doped semiconductor substrate (also referred to as a "substrate") 2100 and, on a surface thereof, an optional epitaxial layer can be grown (e.g., a lightly doped P-type epitaxial layer, not shown). The substrate 2100 is preferably lightly P-doped (e.g., with boron) between about $1 \cdot 10^{14}$ and $1 \cdot 10^{16}$ atoms/cm$^3$. The optional epitaxial layer grown on the substrate 2100 may not be needed, particularly if the substrate 2100 is a lightly doped P-type substrate. Although in the illustrated embodiment the substrate 2100 is a P-type substrate, one skilled in the art understands that the substrate 2100 could be an N-type substrate without departing from the scope of the present invention.

The substrate 2100 is formed with isolation regions (e.g., shallow trench isolation regions 2102). The shallow trench isolation regions 2102 may also be formed within a substrate or within an epitaxial layer grown thereon to provide dielectric isolation between devices implemented on the substrate or on the epitaxial layer. The shallow trench isolation regions 2102 are formed by applying, patterning, and etching the substrate 2100 with a photoresist to define the respective regions therein. An example photoresist is an AZ Electronic Materials photoresist. The shallow trench isolation regions 2102 are then etched and backfilled with a dielectric such as silicon dioxide, silicon nitride, a combination thereof, or any other suitable dielectric material. Then the epitaxial layer of the substrate 2100 and the shallow trench isolation regions 2102 are planarized by a lapping process such as a chemical-mechanical planarization ("CMP") lapping process to planarize the device while limiting surface damage to the die. The steps of masking, etching, backfilling with dielectric, and lapping are well known in the art and will not hereinafter be described in further detail.

The P-type substrate 2100 is divided into dielectrically separated areas by the shallow trench isolation regions 2102 to accommodate in the illustrated embodiment a plurality of N-LDMOS and P-LDMOS devices as well as gate drivers and other PMOS and NMOS devices embedded in control circuits located thereon that operate as low-voltage devices. The low-voltage devices are operable within, for instance, a controller of a power converter (e.g., within control and signal-processing devices that may be formed on a surface of the semiconductor device). Additionally, the P-type substrate 2100 can accommodate the N-LDMOS and P-LDMOS devices that operate as higher voltage devices within, for instance, a power train, as well as a driver of a power converter (i.e., power switches and driver switches).

P-type wells 2104 are formed by applying and patterning a photoresist mask (not shown), followed by etching of the photoresist mask to define regions to be occupied by the P-type wells 2104. An example photoresist is AZ Electronic Materials photoresist. The steps of patterning and etching to define horizontal dimensions of the P-type wells 2104 are well known in the art and will not hereinafter be described in further detail. The P-type wells 2104 are formed by an ion-implantation process (e.g., at a controlled energy of about 100 to 300 kiloelectron volts ("keV")) of an appropriate P-type dopant specie such as boron, and results in a light doping concentration profile preferably in a range of about $1 \cdot 10^{17}$ to $2 \cdot 10^{19}$ atoms/cm$^3$.

The gates are formed above a gate oxide layer 2106 (an insulating layer) is formed over the surface of the semiconductor device of a thickness consistent with the intended operating voltage of the gates. The gate oxide layer 2106 is typically silicon dioxide, for instance, formed by placing the wafer on which the silicon device is being formed in an oven and reacting the exposed surface of the wafer with oxygen or other suitable material (such as to produce a high-K (dielectric constant) stack) for 10 to 100 minutes at 500 to 900° C.) with a thickness of about 30 to 50 Angstroms ("Å") for devices employing about 0.25-micrometer ("µm") feature sizes and operating at low gate voltages (e.g., 2.5 volts). Assuming the gate-to-source voltage limit of the N-LDMOS and P-LDMOS devices is limited to a voltage (e.g., of about 2.5 volts), then the gate oxide layer 2106 can be formed with a gate dielectric layer thickness as set forth above. Preferably, the gate oxide layer 2106 is constructed with a uniform thickness to provide a gate-to-source voltage rating for the devices of approximately 2.5 volts that completely or nearly completely saturates the forward-conduction properties of the device. Of course, the aforementioned gate voltage ranges for the devices are provided for illustrative purposes only, and other voltage ranges are contemplated within the broad scope of the present invention.

The gates include a gate polysilicon layer 2108 deposited over a surface of the gate oxide layer 2106 and is doped N-type (or P-type) in a later processing step to obtain a suitable level of conductivity using an appropriate doping specie such as arsenic with a doping density in a range of about $1·10^{19}$ to $5·10^{20}$. The gate polysilicon layer 2108 is annealed in an oven at an elevated temperature (e.g., at a temperature of 800 to 1000 degrees Celsius ("° C.") for 2 to 60 minutes) to properly diffuse and activate the dopant. The gate polysilicon layer 2108 may have a range of thicknesses that may range from about 100 to about 500 nanometers, but may be even smaller or larger depending on an application.

The gates are formed with an overlying gate oxide layer 2110 (an insulating layer) formed over an upper surface of the gate polysilicon layer 2108 by placing the wafer on which the silicon device is being formed in an oven and reacting the exposed surface of the gate polysilicon layer 2108 with oxygen at an elevated temperature (e.g., at a temperature of 500-900° C. for 1 to 60 minutes). The overlying gate oxide layer 2110 can be formed with a thickness of about 50 to 500 Å.

The gate oxide layer 2106, the gate polysilicon layer 2108, and the overlying gate oxide layer 2110 are patterned and etched to define and form horizontal dimensions therefor. A photoresist mask is employed with an etch to define the lateral dimensions of the gate polysilicon layer 2108, and the gate oxide layer 2106 and the overlying gate oxide layer 2110. Only one of the gates is designated with the reference numbers for the gate polysilicon layer 2108 and the gate oxide layers 2106, 2110 in FIG. 21. An example photoresist is AZ Electronic Materials photoresist. The steps of patterning and etching to define and form horizontal dimensions of the gate polysilicon layer 2108 and the gate oxide layers 2106, 2110 are well known in the art and will not hereinafter be described in further detail. In an alternative embodiment, the gate polysilicon layer 2108 can include or otherwise be formed with a wide range of materials including various metals, other doped semiconductors, or other conductive materials. It is noted that the horizontal dimensions of the gate polysilicon layer 2108 and the gate oxide layers 2106, 2110 as well as a number of other structures for both a N-LDMOS and P-LDMOS devices formed on the same silicon can be masked and etched in the same processing steps. Additionally, sidewall spacers (one of which is designated 2112) are formed from an insulating layer such as silicon nitride adjacent to the gate polysilicon layer 2108 and the underlying and overlying oxide layers 2106, 2110 in a self-aligned process without the need to mask and etch a photoresist. It should be noted that a portion (about half a gate width, which is about 0.2 µm) of the overlying gate oxide layer 2110 is removed above the gate polysilicon layer 2108.

Within the P-type wells 2104 are heavily doped P-type regions 2114 formed with ion implantation of, for instance, boron. In an embodiment, the heavily doped P-type regions 2114 are doped to a density of about $1·10^{19}$ to $5·10^{20}$ atoms/cm$^{-3}$, and are implanted at a controlled energy of 5 to 50 keV. About the heavily doped P-type regions 2114 are P-type regions 2116 that are ion-implanted with a suitable atomic species such as boron to achieve a usable gate threshold voltage for the N-LDMOS device that is being formed. The P-type regions 2116 have a doping concentration profile in the range of about $5·10^{17}$ to $1·10^{19}$ atoms/cm3 and are implanted at a controlled energy of about 20 to 100 keV. Above the P-type regions 2116 are heavily doped N-type regions 2118 of N-type ions (e.g., arsenic). The heavily doped N-type regions 2118 are implanted (e.g., at a controlled energy of about 5 to 50 keV) with a doping concentration profile preferably in a range of $5·10^{18}$ to $1·10^{20}$ atoms/cm$^3$ to achieve a low source resistance for the N-LDMOS device that is being formed.

Above the heavily doped P-type regions 2114 (and within other locations within the P-type well 2104) are heavily doped N-type regions 2120 doped, for instance, with arsenic to a density in a range of about $1·10^{19}$ to $5·10^{20}$ atoms/cm$^{-3}$, and implanted at a controlled energy of 10 to 100 keV. The heavily doped N-type regions 2120 above the heavily doped P-type regions 2114 are relatively thin (e.g., about 10 to 100 Å). Also, the gate polysilicon layer 2108 is similarly doped N-type with arsenic with a doping density in a range of about $1·10^{19}$ to $5·10^{20}$ to obtain a suitable level of gate conductivity. About the heavily doped N-type regions 2120 (located within the P-type well 2104) are lightly doped N-type regions 2122 doped, for instance, with arsenic to a density in the range of $1·10^{17}$ to $1·10^{19}$ atoms/cm$^3$, and implanted at a controlled energy of 10 to 200 keV.

Over portions of the gate and the lightly doped N-type regions 2122 are silicon dioxide regions 2124 (an insulating region). Silicide only forms on exposed silicon. In regions where silicon is covered by the silicon dioxide regions 2124, a silicide layer will not be formed. A silicide layer 2126 is then formed over exposed regions of silicon and polysilicon are not substantially reactive to the wet etch and are not removed by the wet etch. An example wet etch is aqua regia, a mixture of nitric and hydrochloric acids. In an embodiment, the silicide layer 2126 that overlies gate polysilicon layer 2108 is electrically coupled to the gate metallic strips e.g., 730 formed in a first metallic layer M1 (see, e.g., FIG. 7). The silicide layer 2126 may be formed with refractory metals such as tungsten, titanium, and cobalt having a thickness preferably in the range of 100-800 Å.

An amorphous silicon oxynitride ("Si$_x$O$_y$N$_z$") layer 2128 (an insulating layer) is deposited and patterned over the gates and silicon dioxide regions 2124. A first metallic (e.g., aluminum) layer M1 is located (e.g., via a vacuum deposition) between the silicon oxynitride layers 2128 down to portions of the silicide layer 2126 in a region for the source and drain contacts. An etch-stop refractory layer 2130 is deposited over the first metallic layer M1. In an embodiment, the etch-stop refractory layer 2130 is titanium nitride, cobalt nitride, or tungsten nitride. Another silicon oxynitride layer 2132 (an insulating layer) is deposited and patterned over the silicon oxynitride layer 2128. The silicon oxynitride layers 2128, 2132 enable formation of low-resistance, metallic, source and drain contacts for the N-LDMOS in a sequence of processing steps. A second metallic (e.g., aluminum) layer M2 is located (e.g., via a vacuum deposition) between the silicon oxynitride layers 2132 down to the etch-stop refractory layers 2130 above the first metallic layers M1 in a region for the source and drain contacts. An etch-stop refractory layer 2134 is deposited over the second metallic layer M2. In an embodiment, the etch-stop refractory layer 2134 is titanium nitride, cobalt nitride, or tungsten nitride.

Another silicon oxynitride layer 2136 (an insulating layer) is deposited and patterned over the silicon oxynitride layer 2132. The silicon oxynitride layers 2128, 2132, 2136 enable formation of low-resistance, metallic, source and drain contacts for the N-LDMOS in a sequence of processing steps. A third metallic (e.g., aluminum) layer M3 is located (e.g., via a vacuum deposition) between the silicon oxynitride layers 2136 down to the etch-stop refractory layers 2134 above the second metallic layers M2 in a region for the source and drain contacts. A final silicon oxynitride layer 2138 (an insulating layer) is deposited and patterned over the silicon oxynitride layer 2136. The silicon oxynitride layers 2128, 2132, 2136, 2138 enable formation of low-resistance, metallic, source and drain contacts for the N-LDMOS in a sequence of processing steps. A polyimide coating 2140 (an insulating layer) is deposited and patterned over the silicon oxynitride layer 2138 and the third metallic layers M3. A refractory barrier layer 2145 (e.g., titanium nitride, tantalum nitride, or cobalt nitride) is deposited over the semiconductor device.

A thin metallic (e.g., copper) seed layer is then deposited of over the refractory barrier layer 2145, which is then electroplated to form an electroplated copper layer 2150. Another polyimide coating 2155 (an insulating layer) is deposited and patterned above the copper layer 2150 in the regions defined by the polyimide coating 2140. Another thin metallic (e.g., copper) seed layer 2160 is deposited and patterned above the electroplated copper layer 2150 between the another polyimide coating 2155 in the regions of the sources of the N-LDMOS device. Deposition of the copper seed layer 2160 is an optional step to produce a fresh surface for later electrodeposition of metallic (e.g., copper) pillars.

Metallic (e.g., copper) pillars 2165 are formed by an electroplating process employing an acid solution and located over the copper seed layer 2160. The copper pillars 2165 serve as low-resistance source contacts to a conductive, patterned leadframe, traces of which terminals of the completed semiconductor device are solderably attached. Corresponding steps can be employed in conjunction with the steps described hereinabove for construction of the source contacts to form low-resistance drain contacts for the N-LDMOS device. Additionally, an encapsulant (e.g., an epoxy) 2170 can be selectively deposited between the copper pillars 2165 and a patterned leadframe 2175 placed thereabove to create external contacts for a packaged semiconductor device (see, e.g., FIG. 18).

Figure 22:
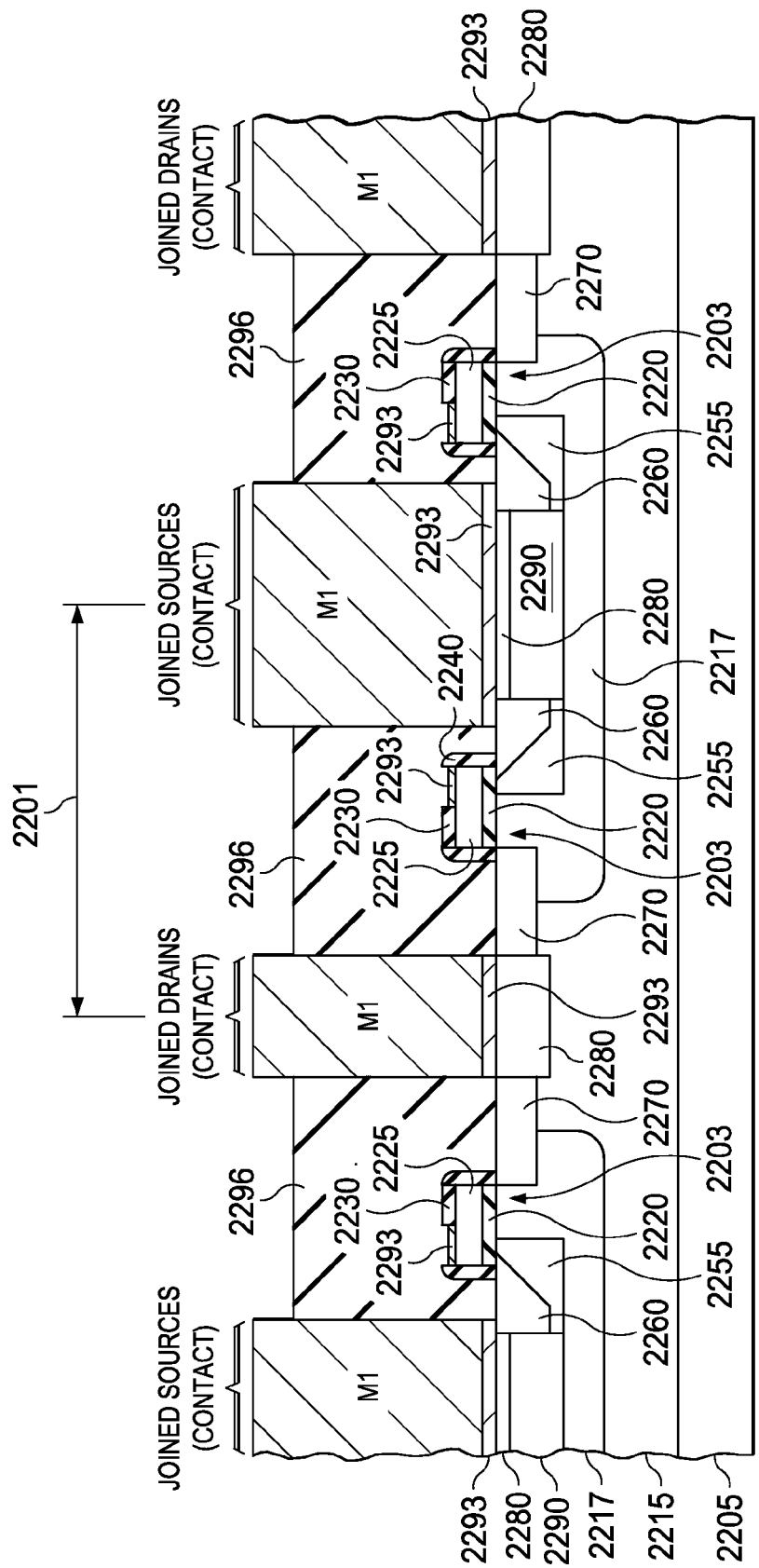
FIG. 22 illustrates a cross-sectional view of an embodiment of a P-LDMOS device embodied in a semiconductor device, or portions thereof.

Turning now to FIG. 22, illustrated is a cross-sectional view of an embodiment of a P-LDMOS device embodied in a semiconductor device, or portions thereof. While some of the layers of the P-LDMOS device will be introduced with respect to FIG. 22, a more detailed explanation of the layers will be described with respect to FIG. 23. Additionally, many of the processing steps to build the semiconductor device including the P-LDMOS device are similar to the processing steps to build the semiconductor device including the N-LDMOS device.

The P-LDMOS device is formed in a semiconductor die including a P-doped semiconductor substrate (also referred to as a "substrate") 2205 and, on a surface thereof, an optional epitaxial layer can be grown (e.g., a lightly doped P-type epitaxial layer, not shown). Although in the illustrated embodiment the substrate 2205 is a P-type substrate, one skilled in the art understands that the substrate 2205 could be an N-type substrate without departing from the scope of the present invention.

The P-LDMOS device is formed of a plurality of P-LDMOS cells, such as P-LDMOS cell 2201 illustrated in FIG. 22. The P-LDMOS device includes a lightly doped N-type well 2215 with N-type wells 2217 formed thereover. Within the N-type wells 2217 are heavily doped N-type regions 2290 formed therein. Heavily doped P-type regions 2260, 2280 are formed on either side of or above the heavily doped N-type regions 2290. The heavily doped P-type regions 2260 are formed with a lower doping density than the heavily doped P-type regions 2280, particularly in a lateral direction away from the heavily doped P-type region 2280. The heavily doped P-type regions 2260, 2280 provide an ohmic junction through a silicide layer 2293 formed thereover. The silicide layer 2293 provides a heavily conductive junction between the heavily doped P-type regions 2260, 2280 and a first metallic (e.g., aluminum) layer M1 to ultimately provide source contacts (designated "joined sources (contact)") for the P-LDMOS device. The heavily doped P-type region 2280 that lies over the heavily doped N-type region 2290 is thin (e.g., about 10 to 100 Å) so that the resulting P-N junction that is thereby formed between the heavily doped P-type region 2280 and the heavily doped N-type region 2290 will be substantially an ohmic junction highly conductive in both directions. Accordingly, the P-N junction formed therebetween will not be operable as a diode. Similarly, the silicide layer 2293 provides a heavily conductive junction between the heavily doped P-type regions 2280 and the first metallic layer M1 to ultimately provide drain contacts (designated "joined drains (contact)") for the P-LDMOS device. The first metallic layers M1 for the sources and drains are separated by insulating layers such as an amorphous silicon oxynitride ("$Si_xO_yN_z$") layers 2296.

N-type regions 2255 are formed adjacent to the heavily doped P-type regions 2260 and the heavily doped N-type regions 2290 within the N-type wells 2217. Channel regions 2203 are formed under the gates between the heavily doped P-type regions 2260 and lightly doped P-type regions 2270. The N-type regions 2255 are formed in the N-type wells 2217 by ion injection at an angle off vertical under the gates that will be formed above the channel regions 2203 and are used to control a threshold voltage of the P-LDMOS device.

The gates are formed with gate polysilicon layers 2225 with underlying and overlying gate oxide layers 2220, 2230 and sidewall spacers (one of which is designated 2240) thereabout. The gate polysilicon layers 2225 above the channel regions 2203 control a level of conductivity therein. The underlying gate oxide layers 2220 form an isolation layer between the gate polysilicon layers 2225 and the N-type wells 2217 and the N-type regions 2255. A portion of the overlying gate oxide layers 2230 is removed over the gate polysilicon layers 2225 and a silicide layer 2293 is formed thereover to reduce gate resistance.

Thus, the gate polysilicon layers 2225 (with the silicide layers 2293) form gate polysilicon strips across many P-LD- MOS cells of the P-LDMOS device and are coupled to gate metallic strips 731 in the first metallic layer M1 (see, e.g., FIG. 12). The gate metallic strips 731 are routed to a plurality of gate drivers located at the periphery of the semiconductor device (see, e.g., FIG. 14). A substantially time-aligned switching signal to the gates of the P-LDMOS cells is thereby enabled by coupling the gate metallic strips 731 in the first metallic layer M1, which have a substantially greater electrical conductivity than the gate polysilicon strips to the plurality of gate drivers.

Providing a time-aligned switching signal to the plurality of gates of individual P-LDMOS cells is an important design consideration in view of substantial effective capacitance that is created between the gates and the sources and drains, which requires a substantial gate-drive current to achieve a rapid switching transition. Failure to produce a temporally-aligned gate-drive signal to the gates of the individual P-LDMOS cells can enable some of the P-LDMOS cells to be turned on before others, which forces the early-switched cells to conduct high-current pulses during the temporally misaligned switching transitions. Temporally misaligned high-current pulses expose the P-LDMOS cells to device failure.

The illustrated structures also enable N-LDMOS and P-LDMOS devices to be formed with substantially the same structure in a common semiconductor die, and enable each LDMOS type to be coupled with a low-inductance, high-current path to an external circuit. Each LDMOS is formed with a single, large, source contact, and both with a single, large, and shared drain contact (see, e.g., FIG. 18), which can simplify circuit board layout and attachment issues to an external circuit. The large source and drain contacts are readily overlaid with a copper redistribution layer of substantially the same footprint as the large source and drain contacts (see, e.g., FIG. 15), and ultimately a leadframe (see, e.g., FIG. 17), which provides further improvement in conductivity and coupling a packaged semiconductor device (see, e.g., FIG. 18) to an external circuit. The source contacts and the shared drain contacts overlie substantially the entire active area of the N-LDMOS and P-LDMOS devices, with little die area wasted by high current contacts that do not overlie active switching areas.

With respect to the P-LDMOS cell 2201, the source (or source region) is embodied in at least the heavily doped P-type region 2260 and the drain (or drain region) is embodied in the lightly doped P-type region 2270 (e.g., a lightly doped drain ("LDD") region) and an adjacent heavily doped P-type region 2280 opposite the channel region 2203. The gate resides above the channel region 2203 with the layers as introduced above. The LDD region provides a higher breakdown voltage for the P-LDMOS devices over conventional designs. These regions are formed in the sequence "heavily doped source region," "gate," "lightly doped drain region," and "heavily doped drain region."

Figure 23:
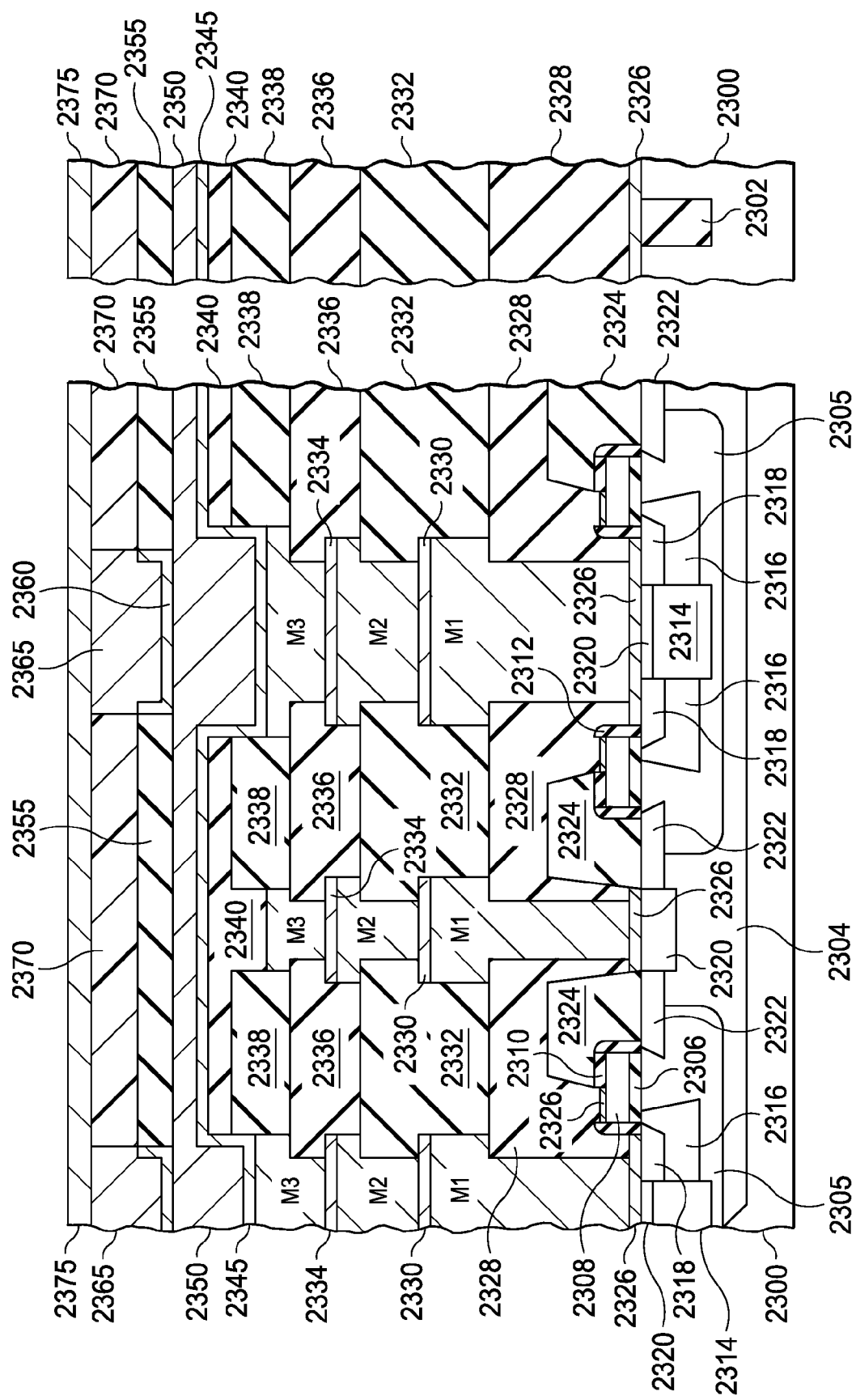
FIG. 23 illustrates a cross-sectional view of an embodiment of a P-LDMOS device embodied in a semiconductor device, or portions thereof.

Turning now to FIG. 23, illustrated is a cross-sectional view of an embodiment of a P-LDMOS device embodied in a semiconductor device, or portions thereof. The P-LDMOS device is formed in a semiconductor die including a P-doped semiconductor substrate (also referred to as a "substrate") 2300 and, on a surface thereof, an optional epitaxial layer can be grown (e.g., a lightly doped P-type epitaxial layer, not shown). The substrate 2300 is preferably lightly P-doped (e.g., with boron) between about $1 \cdot 10^{14}$ and $1 \cdot 10^{16}$ atoms/cm³. The optional epitaxial layer grown on the substrate 2300 may not be needed, particularly if the substrate 2300 is a lightly doped P-type substrate. Although in the illustrated embodiment the substrate 2300 is a P-type substrate, one skilled in the art understands that the substrate 2300 could be an N-type substrate without departing from the scope of the present invention.

The substrate 2300 is formed with isolation regions (e.g., shallow trench isolation regions 2302). The shallow trench isolation regions 2302 may also be formed within a substrate or within an epitaxial layer grown thereon to provide dielectric isolation between devices implemented on the substrate or on the epitaxial layer. The shallow trench isolation regions 2302 are formed by applying, patterning, and etching the substrate 2300 with a photoresist to define the respective regions therein. An example photoresist is an AZ Electronic Materials photoresist. The shallow trench isolation regions 2302 are then etched and backfilled with a dielectric such as silicon dioxide, silicon nitride, a combination thereof, or any other suitable dielectric material. Then the epitaxial layer of the substrate 2300 and the shallow trench isolation regions 2302 are planarized by a lapping process such as a chemical-mechanical planarization ("CMP") lapping process to planarize the device while limiting surface damage to the die. The steps of masking, etching, backfilling with dielectric, and lapping are well known in the art and will not hereinafter be described in further detail.

The P-type substrate 2300 is divided into dielectrically separated areas by the shallow trench isolation regions 2302 to accommodate in the illustrated embodiment a plurality of N-LDMOS and P-LDMOS devices as well as gate drivers and other PMOS and NMOS devices embedded in control circuits located thereon that operate as low-voltage devices. The low-voltage devices are operable within, for instance, a controller of a power converter (e.g., within control and signal-processing devices that may be formed on a surface of the semiconductor device). Additionally, the P-type substrate 2300 can accommodate the N-LDMOS and P-LDMOS devices that operate as higher voltage devices within, for instance, a power train, as well as a driver of a power converter (i.e., power switches and driver switches).

A lightly doped N-type well 2304 is formed by applying and patterning a photoresist mask (not shown), followed by etching of the photoresist mask to define regions to be occupied by the lightly doped N-type well 2304. An example photoresist is AZ Electronic Materials photoresist. The steps of patterning and etching to define horizontal dimensions of the lightly doped N-type well 2304 are well known in the art and will not hereinafter be described in further detail. The lightly doped N-type well 2304 is formed by an ion-implantation process (e.g., at a controlled energy of about 100 to 300 keV) of an appropriate N-type dopant specie such as arsenic, and results in a light doping concentration profile preferably in a range of about $1 \cdot 10^{14}$ to $1 \cdot 10^{16}$ atoms/cm³.

N-type wells 2305 are formed in the lightly doped N-type well 2304 by applying and patterning a photoresist mask (not shown), followed by etching of the mask to define regions to be occupied by the N-type wells 2305. The N-type wells 2305 are formed by an ion-implantation process (e.g., at a controlled energy of about 100 to 300 keV) of an appropriate N-type dopant specie such as phosphorus, and results in a doping concentration profile preferably in a range of about $1 \cdot 10^{17}$ to $2 \cdot 10^{19}$ atoms/cm³.

The gates are formed above a gate oxide layer 2306 (an insulating layer) is formed over the surface of the semiconductor device of a thickness consistent with the intended operating voltage of the gates. The gate oxide layer 2306 is typically silicon dioxide, for instance, formed by placing the wafer on which the silicon device is being formed in an oven and reacting the exposed surface of the wafer with oxygen or other suitable material (such as to produce a high-K (dielectric constant) stack) for 10 to 100 minutes at 500 to 900° C.) with a thickness of about 30 to 50 Angstroms ("Å") for devices employing about 0.25-micrometer ("µm") feature sizes and operating at low gate voltages (e.g., 2.5 volts). Assuming the gate-to-source voltage limit of the N-LDMOS and P-LDMOS devices is limited to a voltage (e.g., of about 2.5 volts), then the gate oxide layer 2306 can be formed with a gate dielectric layer thickness as set forth above. Preferably, the gate oxide layer 2306 is constructed with a uniform thickness to provide a gate-to-source voltage rating for the devices of approximately 2.5 volts that completely or nearly completely saturates the forward-conduction properties of the device. Of course, the aforementioned gate voltage ranges for the devices are provided for illustrative purposes only, and other voltage ranges are contemplated within the broad scope of the present invention.

The gates include a gate polysilicon layer 2308 deposited over a surface of the gate oxide layer 2306 and is doped N-type (or P-type) in a later processing step to obtain a suitable level of conductivity using an appropriate doping specie such as arsenic with a doping density in a range of about $1 \cdot 10^{19}$ to $5 \cdot 10^{20}$. The gate polysilicon layer 2308 is annealed in an oven at an elevated temperature (e.g., at a temperature of 800 to 1000 degrees Celsius ("° C.") for 2 to 60 minutes) to properly diffuse and activate the dopant. The gate polysilicon layer 2308 may have a range of thicknesses that may range from about 100 to about 500 nanometers, but may be even smaller or larger depending on an application.

The gates are formed with an overlying gate oxide layer 2310 (an insulating layer) is formed over an upper surface of the gate polysilicon layer 2308 by placing the wafer on which the silicon device is being formed in an oven and reacting the exposed surface of the gate polysilicon layer 2308 with oxygen at an elevated temperature (e.g., at a temperature of 500-900° C. for 1 to 60 minutes). The overlying gate oxide layer 2310 can be formed with a thickness of about 50 to 500 Å.

The gate oxide layer 2306, the gate polysilicon layer 2308, and the overlying gate oxide layer 2310 are patterned and etched to define and form horizontal dimensions therefor. A photoresist mask is employed with an etch to define the lateral dimensions of the gate polysilicon layer 2308, and the gate oxide layer 2306 and the overlying gate oxide layer 2310. Only one of the gates is designated with the reference numbers for the gate polysilicon layer 2308 and the gate oxide layers 2306, 2310 in the FIG. 23. An example photoresist is AZ Electronic Materials photoresist. The steps of patterning and etching to define and form horizontal dimensions of the gate polysilicon layer 2308 and the gate oxide layers 2306, 2310 are well known in the art and will not hereinafter be described in further detail. In an alternative embodiment, the gate polysilicon layer 2308 can include or otherwise be formed with a wide range of materials including various metals, other doped semiconductors, or other conductive materials. It is noted that the horizontal dimensions of the gate polysilicon layer 2308 and the gate oxide layers 2306, 2310 as well as a number of other structures for both a N-LDMOS and P-LDMOS devices formed on the same silicon can be masked and etched in the same processing steps. Additionally, sidewall spacers (one of which is designated 2312) are formed from an insulating layer such as silicon nitride adjacent to the gate polysilicon layer 2308 and the underlying and overlying oxide layers 2306, 2310 in a self-aligned process without the need to mask and etch a photoresist. It should be noted that a portion (about half a gate width, which is about 0.2 µm) of the overlying gate oxide layer 2310 is removed above the gate polysilicon layer 2308.

Within the N-type wells 2305 are heavily doped N-type regions 2314 formed with ion implantation of, for instance, arsenic. In an embodiment, the heavily doped N-type regions 2314 are doped to a density of about $1 \cdot 10^{19}$ to $5 \cdot 10^{20}$ atoms/cm$^{-3}$, and are implanted at a controlled energy of 5 to 50 keV. About the heavily doped N-type regions 2314 are N-type regions 2316 that are ion-implanted with a suitable atomic species such as phosphorus to achieve a usable gate threshold voltage for the P-LDMOS device that is being formed. The N-type regions 2316 have a doping concentration profile in the range of about $5 \cdot 10^{17}$ to $1 \cdot 10^{19}$ atoms/cm3 and are implanted at a controlled energy of about 20 to 100 keV. Above the N-type regions 2316 are heavily doped P-type regions 2318 of P-type ions (e.g., boron). The heavily doped P-type regions 2318 are implanted (e.g., at a controlled energy of about 5 to 50 keV) with a doping concentration profile preferably in a range of $5 \cdot 10^{18}$ to $1 \cdot 10^{20}$ atoms/cm$^3$ to achieve a low source resistance for the P-LDMOS device that is being formed.

Above the heavily doped N-type regions 2314 (and within other locations within the lightly doped N-type well 2304) are heavily doped P-type regions 2320 doped, for instance, with boron to a density in a range of about $1 \cdot 10^{19}$ to $5 \cdot 10^{20}$ atoms/cm$^{-3}$, and implanted at a controlled energy of 10 to 100 keV. The heavily doped P-type regions 2320 above the heavily doped N-type regions 2314 are relatively thin (e.g., about 10 to 100 Å). Also, the gate polysilicon layer 2308 is similarly doped P-type with boron with a doping density in a range of about $1 \cdot 10^{19}$ to $5 \cdot 10^{20}$ to obtain a suitable level of gate conductivity. About the heavily doped P-type regions 2320 (located within the lightly doped N-type well 2304) are lightly doped P-type regions 2322 doped, for instance, with boron to a density in the range of $1 \cdot 10^{17}$ to $1 \cdot 10^{19}$ atoms/cm$^3$, and implanted at a controlled energy of 10 to 200 keV.

Over portions of the gate and the lightly doped P-type regions 2322 are silicon dioxide regions 2324 (an insulating region). Silicide only forms on exposed silicon. In regions where silicon is covered by the silicon dioxide regions 2324, a silicide layer will not be formed. A silicide layer 2326 is then formed over exposed regions of silicon and polysilicon are not substantially reactive to the wet etch and are not removed by the wet etch. An example wet etch is aqua regia, a mixture of nitric and hydrochloric acids. In an embodiment, the silicide layer 2326 that overlies gate polysilicon layer 2308 is electrically coupled to the gate metallic strips 731 formed in a first metallic layer M1 (see, e.g., FIG. 12). The silicide layer 2326 may be formed with refractory metals such as tungsten, titanium, and cobalt having a thickness preferably in the range of 100-800 Å.

An amorphous silicon oxynitride ("$Si_xO_yN_z$") layer 2328 (an insulating layer) is deposited and patterned over the gates and silicon dioxide regions 2324. A first metallic (e.g., aluminum) layer M1 is located (e.g., via a vacuum deposition) between the silicon oxynitride layers 2328 down to portions of the silicide layer 2326 in a region for the source and drain contacts. An etch-stop refractory layer 2330 is deposited over the first metallic layer M1. In an embodiment, the etch-stop refractory layer 2330 is titanium nitride, cobalt nitride, or tungsten nitride. Another silicon oxynitride layer 2332 (an insulating layer) is deposited and patterned over the silicon oxynitride layer 2328. The silicon oxynitride layers 2328, 2332 enable formation of low-resistance, metallic, source and drain contacts for the P-LDMOS in a sequence of processing steps. A second metallic (e.g., aluminum) layer M2 is located (e.g., via a vacuum deposition) between the silicon oxynitride layers 2332 down to the etch-stop refractory layers 2330 above the first metallic layers M1 in a region for the source and drain contacts. An etch-stop refractory layer 2334 is deposited over the second metallic layer M2. In an embodiment, the etch-stop refractory layer 2334 is titanium nitride, cobalt nitride, or tungsten nitride.

Another silicon oxynitride layer 2336 (an insulating layer) is deposited and patterned over the silicon oxynitride layer 2332. The silicon oxynitride layers 2328, 2332, 2336 enable formation of low-resistance, metallic, source and drain contacts for the P-LDMOS in a sequence of processing steps. A third metallic (e.g., aluminum) layer M3 is located (e.g., via a vacuum deposition) between the silicon oxynitride layers 2336 down to the etch-stop refractory layers 2334 above the second metallic layers M2 in a region for the source and drain contacts. A final silicon oxynitride layer 2338 (an insulating layer) is deposited and patterned over the silicon oxynitride layer 2336. The silicon oxynitride layers 2328, 2332, 2336, 2338 enable formation of low-resistance, metallic, source and drain contacts for the P-LDMOS in a sequence of processing steps. A polyimide coating 2340 (an insulating layer) is deposited and patterned over the silicon oxynitride layer 2338 and the third metallic layers M3. A refractory barrier layer 2345 (e.g., titanium nitride, tantalum nitride, or cobalt nitride) is deposited over the semiconductor device.

A thin metallic (e.g., copper) seed layer is then deposited of over the refractory barrier layer 2345, which is then electroplated to form an electroplated copper layer 2350. Another polyimide coating 2355 (an insulating layer) is deposited and patterned above the copper layer 2350 in the regions defined by the polyimide coating 2340. Another thin metallic (e.g., copper) seed layer 2360 is deposited and patterned above the electroplated copper layer 2350 between the another polyimide coating 2355 in the regions of the sources of the P-LDMOS device. Deposition of the copper seed layer 2360 is an optional step to produce a fresh surface for later electrodeposition of metallic (e.g., copper) pillars.

Metallic (e.g., copper) pillars 2365 are formed by an electroplating process employing an acid solution and located over the copper seed layer 2360. The copper pillars 2365 serve as low-resistance source contacts to a conductive, patterned leadframe, traces of which terminals of the completed semiconductor device are solderably attached. Corresponding steps can be employed in conjunction with the steps described hereinabove for construction of the source contacts to form low-resistance drain contacts for the P-LDMOS device. Additionally, an encapsulant (e.g., an epoxy) 2370 can be selectively deposited between the copper pillars 2365 and a patterned leadframe 2375 placed thereabove to create external contacts for a packaged semiconductor device (see, e.g., FIG. 18). For a better understanding of the aforementioned semiconductor devices, see U.S. patent application Ser. No. 14/091,739, entitled "Semiconductor Device including Alternating Source and Drain Regions, and Respective Source and Drain Metallic Strips," filed on Nov. 27, 2013, previously incorporated herein by reference.

Figure 24:
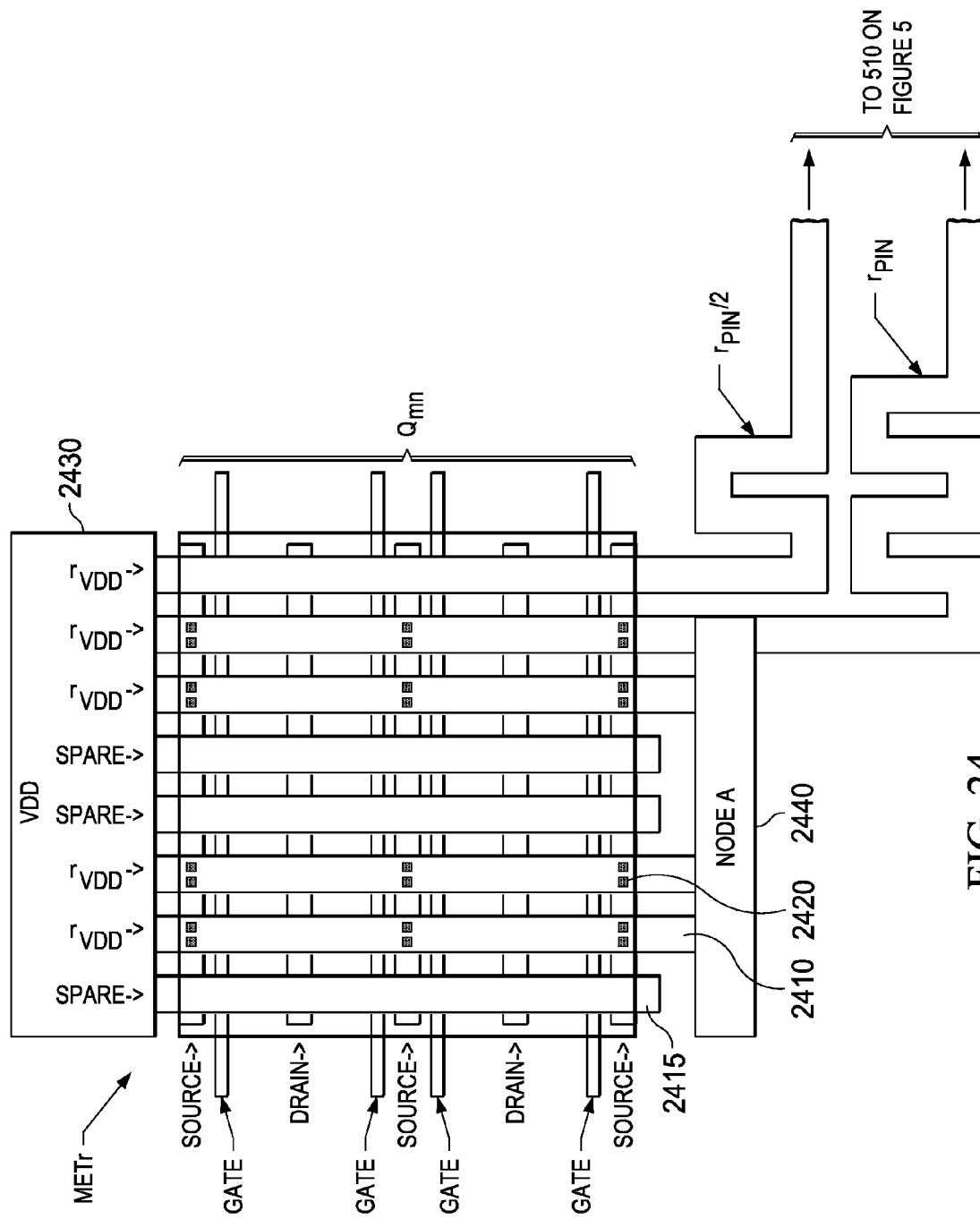
FIGS. 24 and 25 illustrate a plan view and a simplified perspective view, respectively, of an embodiment of portions of a semiconductor device in a region including a resistor metallic layer.

Turning now to FIG. 24, illustrated is a plan view of an embodiment of portions of a semiconductor device in a region including a resistor metallic layer METr. The resistor metallic layer METr is formed above or proximate (e.g., adjacent) at least a portion of a switch such as a main power switch $Q_{mn}$ on a common semiconductor die. The gate (designated "Gate"), source (designated "Source") and drain (designated "Drain") are illustrated as metallic strips for the main power switch $Q_{mn}$. The resistor metallic layer METr is formed by vacuum deposition of an aluminum or copper film over the common semiconductor die and may be located in a second metallic layer M2 as set forth herein. The resistor metallic layer METr is formed with parallel resistor metallic strips (one of which is designated 2410) to form a current sense resistor $r_{VDD}$. The resistor metallic layer METr also includes spare resistor metallic strips (one of which is designated 2415) to select a resistance value for the current sense resistor $r_{VDD}$.

The current sense resistor $r_{VDD}$ is represented by the parallel resistor metallic strips 2410 in the resistor metallic layer METr between a first cross member 2430 that forms a circuit node for an input voltage VDD and a second cross member that forms a circuit node A (see FIG. 5). The value of the current sense resistor $r_{VDD}$ is programmable by adding or removing resistor metallic strips, such as the spare resistor metallic strip 2415. In other words, ones of the spare resistor metallic strips 2415 in the resistor metallic layer METr may be patterned to connect between the first cross member 2430 for the circuit node for the input voltage VDD and the second cross member 2440 for the circuit node A to change the value of the current sense resistor $r_{VDD}$. The current sense resistor $r_{VDD}$ is coupled to the source of the main power switch $Q_{mn}$ by vias (one of which is designated 2420). An input current that flows through the current sense resistor $r_{VDD}$ during the primary portion of the duty cycle of a power converter flows through the main power switch $Q_{mn}$. Similarly, input current that flows through a current sense resistor $r_{GND}$ during the complementary portion of the duty cycle flows through an auxiliary power switch $Q_{aux}$. (See, e.g., FIG. 5.)

The resistor metallic layer METr may be patterned in a serpentine metallic pattern to produce gain resistors (e.g., a pair of first input resistors $r_{PIN}$, $r_{PIN}/2$ (or, alternatively, $r_{MIN}$, $r_{MIN}$)). The geometry of the serpentine metallic pattern for the pair of first input resistors $r_{PIN}$, $r_{PIN}/2$ is selected to produce a particular resistance value. For example, some segments of the serpentine metallic pattern can be lengthened or shortened, and the number of segments can be increased or decreased to alter the resistance for the pair of first input resistors $r_{PIN}$, $r_{PIN}/2$ (or, alternatively, $r_{MIN}$, $r_{MIN}$). The first input resistors $r_{PIN}$, $r_{PIN}/2$ may be coupled to the first transconductance amplifier 510 as described above with respect to FIG. 5. By forming at least a portion of the parallel resistor metallic strips 2410 of the current sense resistor $r_{VDD}$ proximate (e.g., directly over or adjacent to) at least a portion of the body of the main power switch $Q_{mn}$ on the common semiconductor die, temperatures of the circuit elements track substantially identically. By positioning the pair of first input resistors $r_{PIN}$, $r_{PIN}/2$ on the common semiconductor die, preferably adjacent to at least a portion of the main power switch $Q_{mn}$, the temperatures also substantially match those of other circuit elements formed on the common semiconductor die.

Figure 25:
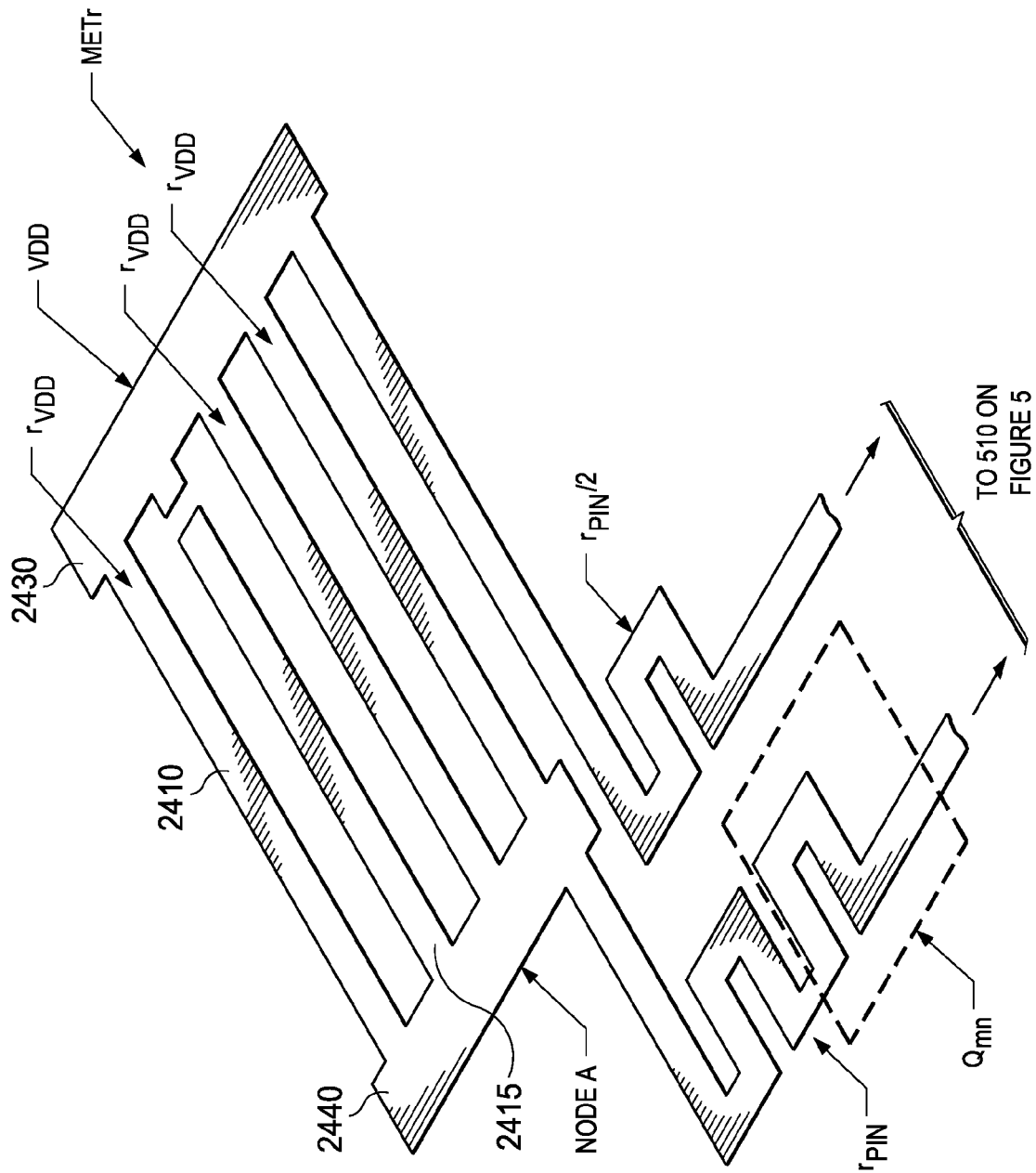

Turning now to FIG. 25, illustrated is a simplified perspective view of the embodiment of portions of the semiconductor device of FIG. 24. As illustrated, the resistor metallic layer METr accommodates the current sense resistor $r_{VDD}$ between the node for the input voltage VDD and the node A. The resistor metallic layer METr also accommodates the gain resistors (i.e., a pair of first input resistors $r_{PIN}$, $r_{PIN}/2$) in a serpentine metallic pattern. The resistor metallic layer METr that may be one of several metallic layers is formed above or proximate (e.g., adjacent) at least a portion of a switch such as a main power switch $Q_{mn}$ on a common semiconductor die. Thus, a semiconductor device includes, without limitation, power switches, resistors and control elements as necessary providing the advantages as set forth herein.

Figure 26:
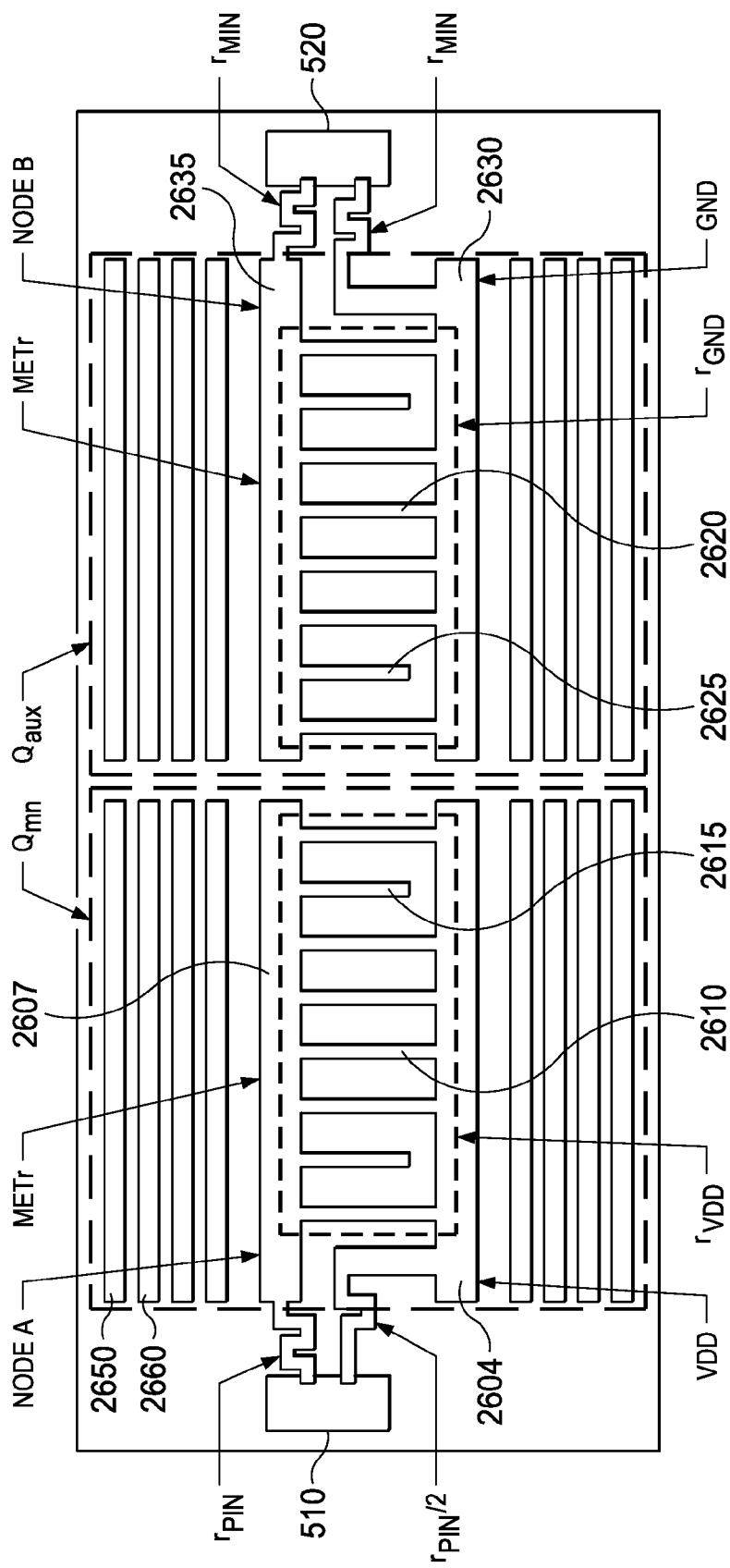
FIG. 26 illustrates a simplified plan view of portions of a semiconductor device in a region including a resistor metallic layer.

Turning now to FIG. 26, illustrated is a simplified plan view of portions of a semiconductor device in a region including a resistor metallic layer METr. The semiconductor device includes a main power switch $Q_{mn}$ (e.g., a P-type laterally diffused metal oxide semiconductor ("P-LDMOS") device) and an auxiliary power switch $Q_{aux}$ (e.g., an N-type laterally diffused metal oxide semiconductor ("N-LDMOS") device). As will become more apparent below, the main power switch $Q_{mn}$ and the auxiliary power switch $Q_{aux}$ are located in layer(s) below a resistor metallic layer METr, which is embedded in a second metallic layer M2 of the semiconductor device.

A first current sense resistor $r_{VDD}$ is represented by the parallel resistor metallic strips 2610 in the resistor metallic layer METr between a first cross member 2604 for a circuit node for an input voltage VDD and a second cross member 2607 for a circuit node A (see FIG. 5). The value of the first current sense resistor $r_{VDD}$ is programmable by adding or removing resistor metallic strips, such as the spare resistor metallic strip 2615. In other words, ones of the spare resistor metallic strips 2615 in the resistor metallic layer METr may be patterned to connect between the first cross member 2604 for the circuit node for the input voltage VDD and the second cross member 2607 for the circuit node A to change the value of the first current sense resistor $r_{VDD}$. The resistor metallic layer METr may be patterned in a serpentine metallic pattern to produce gain resistors (e.g., a pair of first input resistors $r_{PIN}$, $r_{PIN}/2$). The geometry of the serpentine metallic pattern for the pair of first input resistors $r_{PIN}$, $r_{PIN}/2$ is selected to produce a particular resistance value. For example, some segments of the serpentine metallic pattern can be lengthened or shortened, and the number of segments can be increased or decreased to alter the resistance for the pair of first input resistors $r_{PIN}$, $r_{PIN}/2$. The first input resistors $r_{PIN}$, $r_{PIN}/2$ may be coupled to the first transconductance amplifier 510 as described above with respect to FIG. 5.

A second current sense resistor $r_{GND}$ is represented by the parallel resistor metallic strips 2620 in the resistor metallic layer METr between a third cross member 2630 for a circuit node for a ground GND and a fourth cross member 2635 for a circuit node B (see FIG. 5). The value of the second current sense resistor $r_{GND}$ is programmable by adding or removing resistor metallic strips, such as the spare resistor metallic strip 2625. In other words, ones of the spare resistor metallic strips 2625 in the resistor metallic layer METr may be patterned to connect between the third cross member 2630 for the circuit node for a ground GND and the fourth cross member 2635 for the circuit node B to change the value of the second current sense resistor $r_{GND}$. The resistor metallic layer METr may be patterned in a serpentine metallic pattern to produce gain resistors (e.g., a pair of second input resistors $r_{MIN}$, $r_{MIN}$. The geometry of the serpentine metallic pattern for the pair of second input resistors $r_{MIN}$, $r_{MIN}$ is selected to produce a particular resistance value. For example, some segments of the serpentine metallic pattern can be lengthened or shortened, and the number of segments can be increased or decreased to alter the resistance for the pair of second input resistors $r_{MIN}$, $r_{MIN}$. The second input resistors $r_{MIN}$, $r_{MIN}$ may be coupled to the second transconductance amplifier 520 as described above with respect to FIG. 5. The first and second current sensing resistors $r_{VDD}$, $r_{GND}$ lie over at least a portion of the main power switch $Q_{mn}$ and the auxiliary power switch $Q_{aux}$, respectively, to obtain close thermal coupling therebetween.

As also illustrated, source metallic strips (one of which is designated 2650) and drain metallic strips (one of which is designated 2660) for the main power switch $Q_{mn}$ and the auxiliary power switch $Q_{aux}$ are arranged in an alternating pattern in the second metallic layer M2 of the semiconductor device. The source and drain metallic strips 2650, 2660 are formed over the layers of the main power switch $Q_{mn}$ and the auxiliary power switch $Q_{aux}$ as set forth herein.

Figure 27:
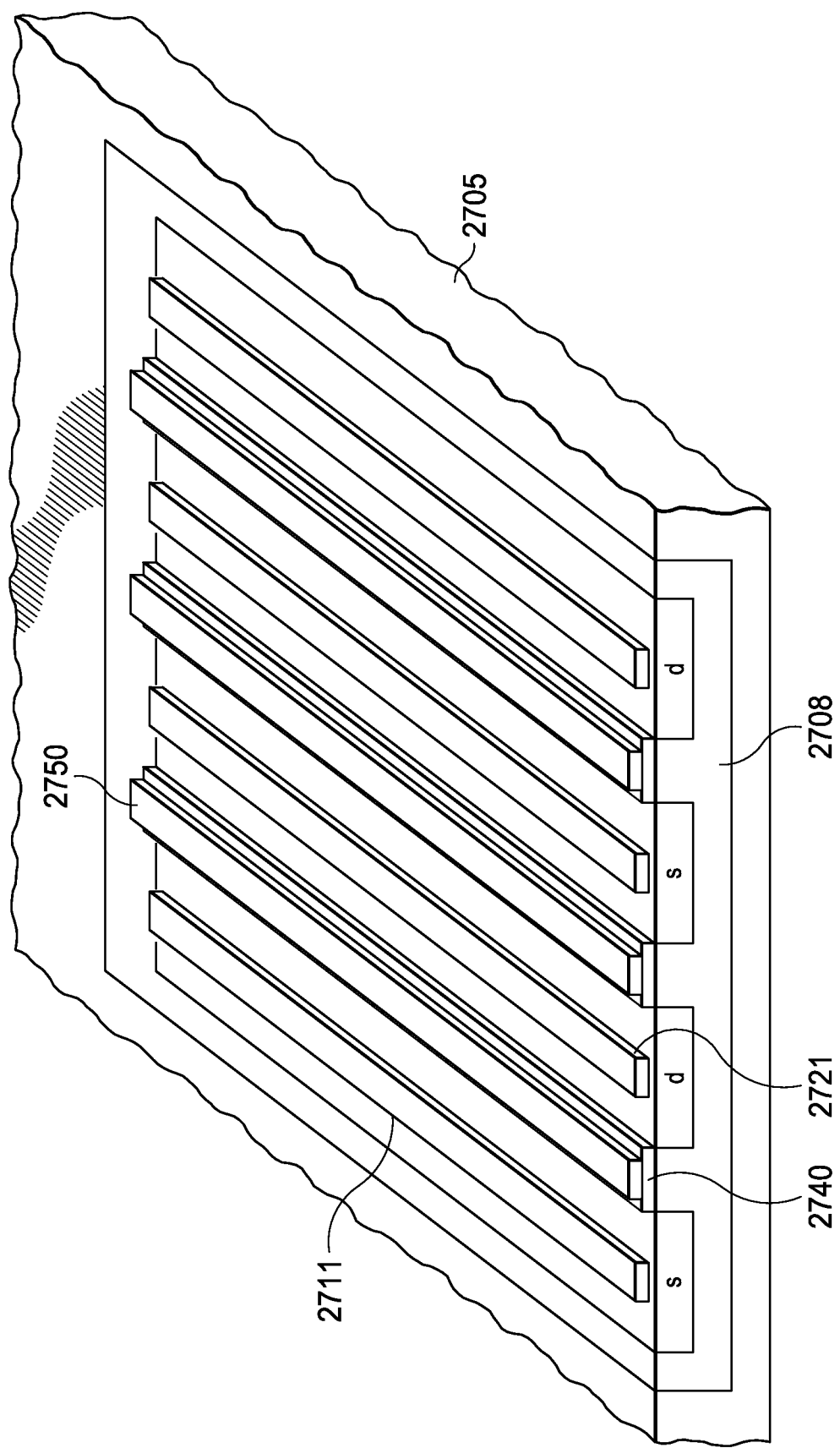
FIG. 27 illustrated is a simplified three-dimensional view of an embodiment of a portion of a partially constructed N-LDMOS device embodied in a semiconductor device, or portions thereof.

Turning now to FIG. 27, illustrated is a simplified three-dimensional view of an embodiment of a portion of a partially constructed N-LDMOS device embodied in a semiconductor device, or portions thereof. The portion of the partially constructed N-LDMOS device illustrated in FIG. 27 lies under a resistor metallic layer METr illustrated and described hereinabove with reference to FIG. 26.

The N-LDMOS device is formed in a semiconductor die including the lightly doped P substrate 2705 and a P-well 2708 implanted in the lightly doped P substrate 2705. The P-well 2708 includes a sequence of doped source regions "s" and drain regions "d" in an alternating pattern, laid out as parallel strips in the P-well 2708 or directly on the lightly doped P substrate 2705 when the optional P-well 2708 is not implanted. Source metallic (e.g., aluminum) strips (ones of which are designated 2711) are formed in a substantially planar first metallic (e.g., aluminum) layer M1 and lie over and electrically contact the doped source regions "s," but not to each other. Correspondingly, drain metallic (e.g., aluminum) strips (ones of which are designated 2721) are also formed in the first metallic layer M1 and lie over and electrically contact the doped drain regions "d," but not to each other. Thus, a plurality of alternating source and drain metallic strips 2711, 2721 are formed in the first metallic layer M1 above the lightly doped P substrate 2705 and parallel to and forming an electrical contact (e.g., through a silicide layer) with respective ones of a plurality of source and drain regions. Gate oxide strips (one of which is designated 2740) isolate polysilicon gate strips (one of which is designated 2750) from the underlying P-well 2708 or from the lightly doped P substrate 2705 when the optional P-well 2708 is not implanted. Thus, a plurality of gate polysilicon strips such as the gate polysilicon strip 2750 are formed over the lightly doped P substrate 2705 between and parallel to ones of the plurality of source and drain regions and oriented parallel to the plurality of alternating source and drain metallic strips 2711, 2721.

Figure 28:
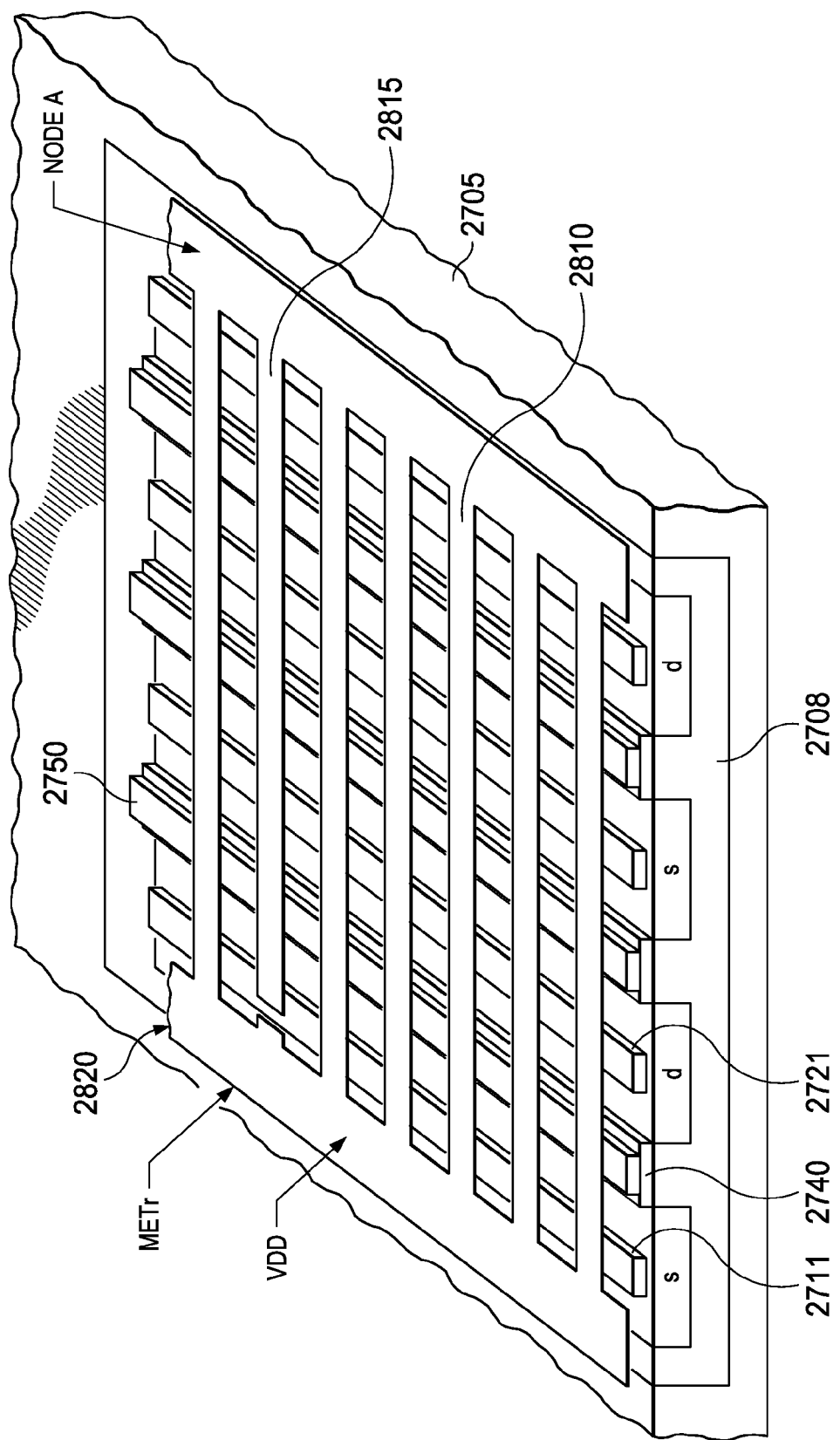
FIG. 28 illustrates a simplified three-dimensional view of an embodiment of a portion of the partially constructed N-LDMOS device in a region including a resistor metallic layer embodied in a semiconductor device.

Turning now to FIG. 28, illustrated is a simplified three-dimensional view of an embodiment of a portion of the partially constructed N-LDMOS device in a region including a resistor metallic layer METr embodied in a semiconductor device. The simplified three-dimensional view of the partially constructed N-LDMOS device is illustrated after formation of the substantially planar second metallic (e.g., aluminum) layer M2 with resistor metallic strips (one of which is designated 2810) electrically coupled between cross members (one of which is designated 2820) for circuit nodes, such as a circuit node A and a circuit node for an input voltage VDD, that is employed to form a resistor such as the first current sense resistor $r_{VDD}$ that overlies portions of the main power switch $Q_{mn}$ as introduced above. The value of the first current sense resistor $r_{VDD}$ is programmable by adding or removing resistor metallic strips, such as the spare resistor metallic strip 2815. In other words, ones of the spare resistor metallic stripes 2815 in the resistor metallic layer METr may be patterned to connect between the cross members 2820 for the circuit node for the input voltage VDD and the circuit node A to change the value of the first current sense resistor $r_{VDD}$.

The resistor metallic strips 2810 lie perpendicular to the source and drain metallic strips 2711, 2721 formed in the first metallic layer M1. An isolation or insulating layer of silicon oxynitride (see, e.g., FIG. 38) separates and electrically isolates the first metallic layer M1 from the second metallic layer M2. The resistor metallic strips 2810 are coupled to the source metallic strips 2711 formed in the first metallic layer M1 by electrically conductive vias as illustrated and described hereinbelow with reference to FIG. 29. Thus, a plurality of resistor metallic strips 2810 are formed in the second metallic layer M2 above the first metallic layer M1 overlying and perpendicular to ones of the first plurality of alternating source and drain metallic strips 2711, 2721 to form a resistor such as the first current sense resistor $r_{VDD}$.

Figure 29:
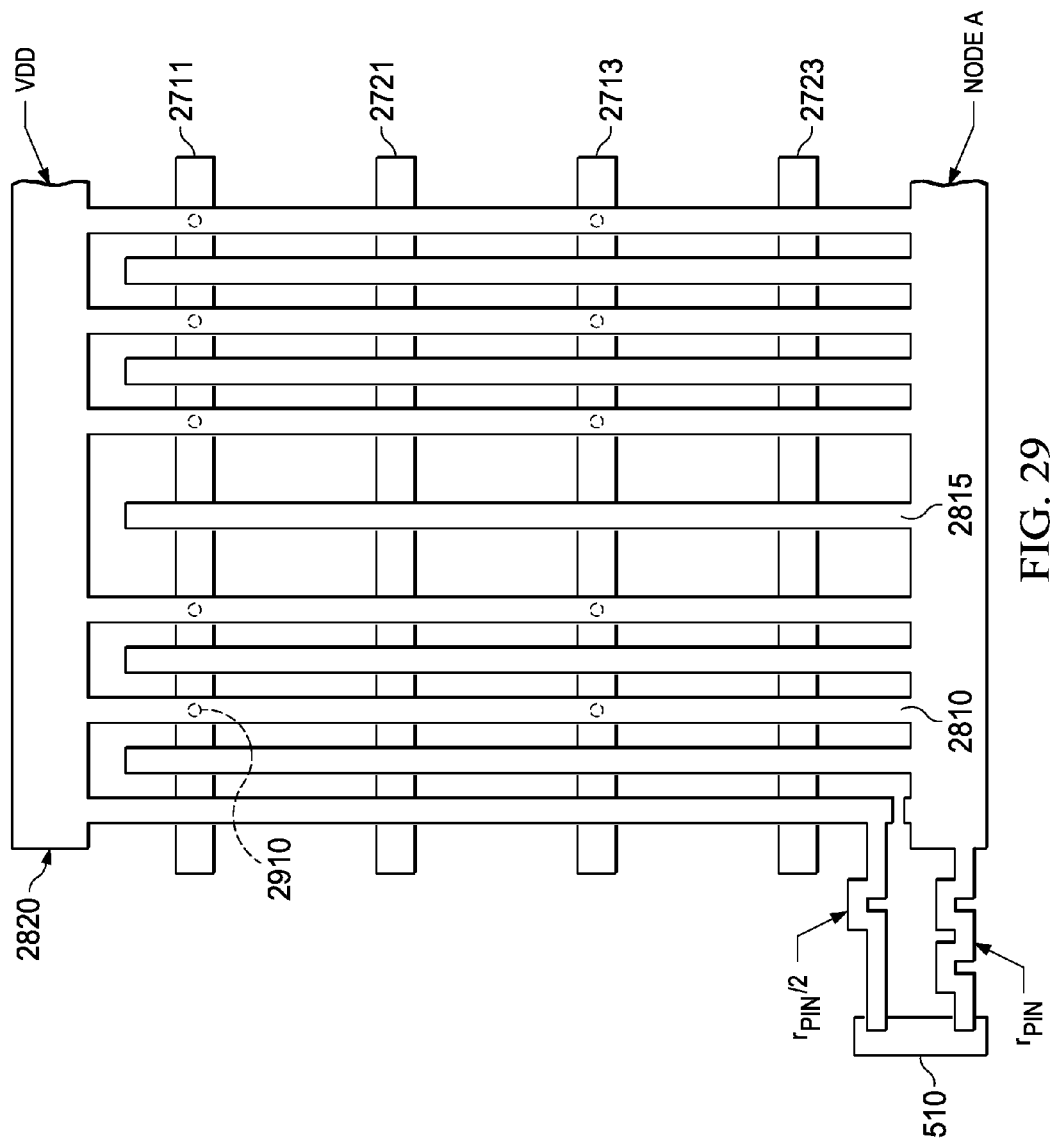
FIG. 29 illustrates a simplified plan view of an embodiment of a portion of the partially constructed N-LDMOS device in a region including a resistor metallic layer embodied in a semiconductor device.

Turning now to FIG. 29, illustrated is a simplified plan view of an embodiment of a portion of the partially constructed N-LDMOS device in a region including a resistor metallic layer METr embodied in a semiconductor device. The simplified plan view of the partially constructed N-LDMOS device is illustrated after formation of the substantially planar second metallic (e.g., aluminum) layer M2 with resistor metallic strips (one of which is designated 2810) electrically coupled between cross members (one of which is designated 2820) for the circuit nodes, such as a circuit node A and a circuit node for an input voltage VDD, that is employed to form a resistor such as the first current sense resistor $r_{VDD}$ that overlies portions of the main power switch $Q_{mn}$ as introduced above. The value of the first current sense resistor $r_{VDD}$ is programmable by adding or removing resistor metallic strips, such as the spare resistor metallic strip 2815. In other words, ones of the spare resistor metallic stripes 2815 in the resistor metallic layer METr may be patterned to connect between the cross members 2820 for the circuit node for the input voltage VDD and the circuit node A to change the value of the first current sense resistor $r_{VDD}$.

Vias (one of which is designated 2910) that electrically couple source metallic strips 2711, 2713 in the first metallic layer M1 to the resistor metallic stripes 2810 in the second metallic layer M2. The vias 2910 penetrate an isolation or insulating layer (see, e.g., insulating layers 3815 in FIG. 38) that separate and electrically isolate (insulate) the first metallic layer M1 from the second metallic layer M2. For purposes of clarity, drain metallic strips 2721, 2723 and gain resistors such as first input resistors $r_{PIN}$, $r_{PIN}/2$ are illustrated in FIG. 29. The first input resistors $r_{PIN}$, $r_{PIN}/2$ may be patterned in a serpentine metallic pattern to produce a particular resistance value. For example, some segments of the serpentine metallic pattern can be lengthened or shortened, and the number of segments can be increased or decreased to alter the resistance for the pair of first input resistors $r_{PIN}$, $r_{PIN}/2$. The first input resistors $r_{PIN}$, $r_{PIN}/2$ may be coupled to the first transconductance amplifier 510 as described above with respect to FIG. 5.

Figure 30:
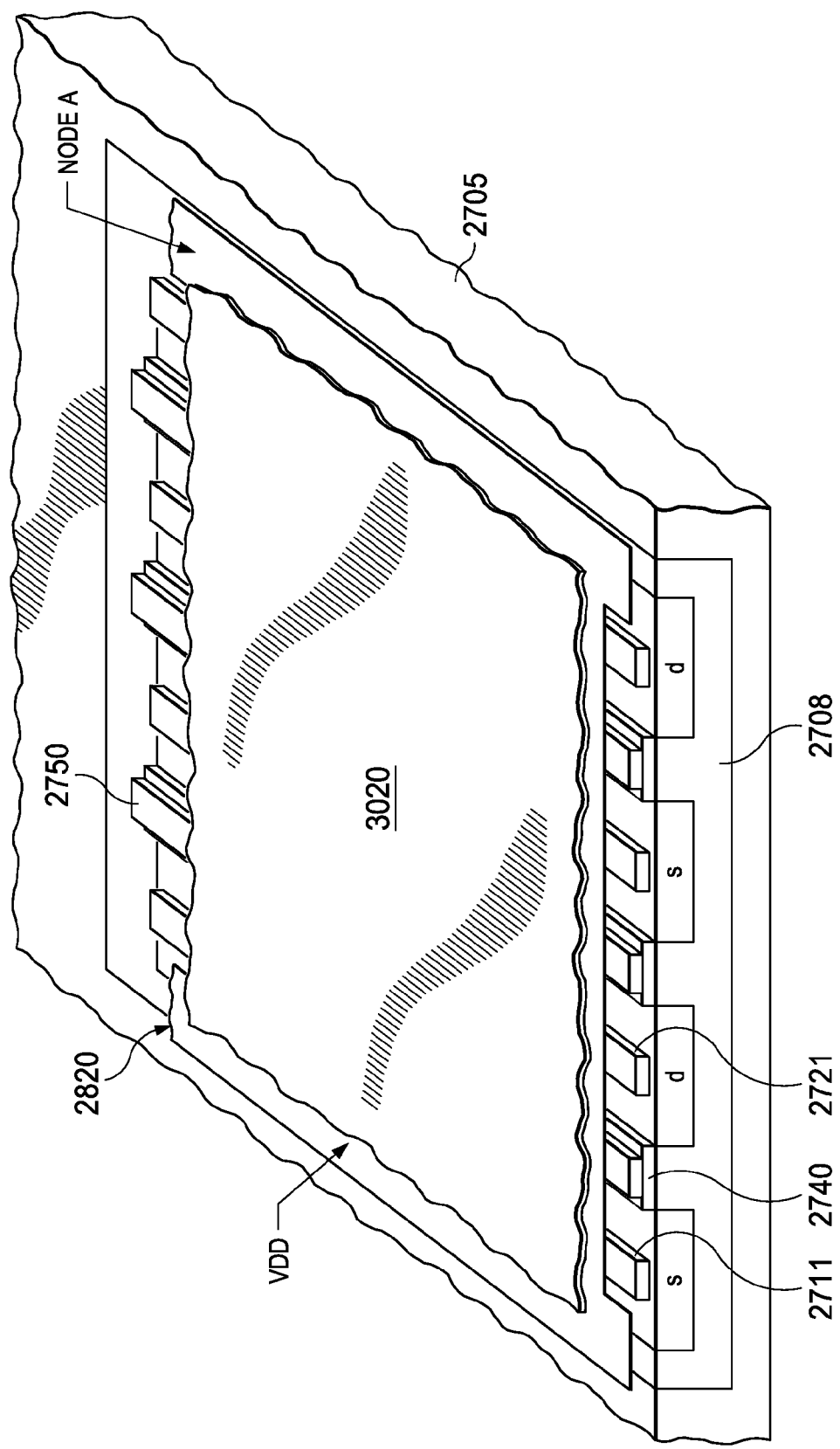
FIG. 30 illustrates a simplified three-dimensional view of an embodiment of a portion of the partially constructed N-LDMOS device in a region including a resistor metallic layer embodied in a semiconductor device.

Turning now to FIG. 30, illustrated is a simplified three-dimensional view of an embodiment of a portion of the partially constructed N-LDMOS device in a region including a resistor metallic layer METr embodied in a semiconductor device. The simplified three-dimensional view of the partially constructed N-LDMOS device is illustrated after formation of a substantially planar third metallic (e.g., aluminum) layer M3. The third metallic layer M3 overlies the second metallic layer M2. FIG. 30 illustrates N-LDMOS device drain contact 3020 formed in the third metallic layer M3. An isolation or insulating layer of silicon oxynitride (see, e.g., FIG. 38) separates and electrically isolates the second metallic layer M2 from the third metallic layer M3. The N-LDMOS device drain contact 3020 is shared with a P-LDMOS device drain contact formed on the same die (also referred to as an "N-LDMOS/P-LDMOS device drain contact" 3020). The N-LDMOS/P-LDMOS device drain contact 3020 is electrically coupled to drain metallic strips (one of which is illustrated 2721) in the second metallic layer M2 by vias (e.g., aluminum vias not shown in FIG. 30). Thus, source and drain contacts formed in the third metallic layer M3 are electrically coupled by vias to ones of the second plurality of alternating source and drain metallic strips in the second metallic layer M2 and together substantially cover the plurality of source and drain regions.

Figure 31:
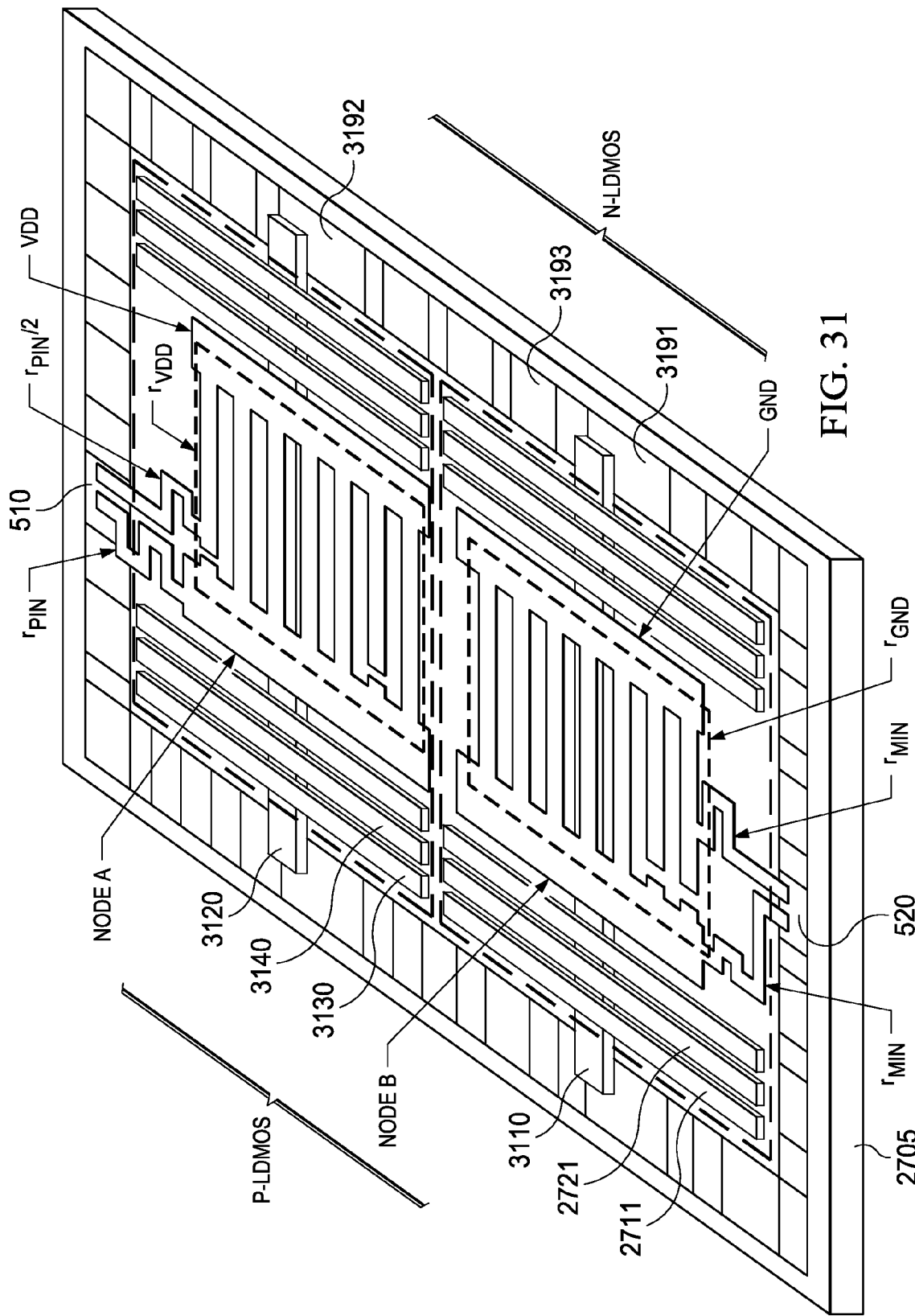
FIG. 31 illustrates a simplified three-dimensional view of an embodiment of a portion of the partially constructed N-LDMOS device and P-LDMOS device in a region including a resistor metallic layer embodied in a semiconductor device.

Turning now to FIG. 31, illustrated is a simplified three-dimensional view of an embodiment of a portion of the partially constructed N-LDMOS device and P-LDMOS device in a region including a resistor metallic layer METr embodied in a semiconductor device. The P-LDMOS and N-LDMOS devices may represent the main and auxiliary power switches $Q_{mn}$, $Q_{aux}$ of a power converter as set forth above. In the first metallic layer M1, gate metallic strips 3110, 3120 are illustrated for the N-LDMOS device and P-LDMOS device, respectively. In the second metallic layer M2, the N-LDMOS includes source metallic strips (one of which is designated 2711) and drain metallic strips (one of which is designated 2721). In the second metallic layer M2, the P-LDMOS includes source metallic strips (one of which is designated 3130) and drain metallic strips (one of which is designated 3140).

FIG. 31 also illustrates gate drivers at the periphery of the semiconductor die coupled to the N-LDMOS and P-LDMOS devices such as an N-gate driver 3191 and P-gate driver 3192. Thus, the N-LDMOS device has a plurality of N-gate drivers (such as N-gate driver 3191) and P-LDMOS device has a plurality of P-gate drivers (such as P-gate driver 3192) around the periphery of the semiconductor die. Also illustrated in FIG. 31 are logic circuit elements located at the periphery of the semiconductor die such as logic circuit element 3193. The metallizations on the second metallic layer M2 overlie and are electrically coupled to respective metallizations on the first metallic layer M1 by vias. For simplicity of illustration, portions of the first metallic layer M1 underlying the second metallic layer M2 are not illustrated in FIG. 31.

The second metallic layer M2 also includes the resistor metallic layer METr analogous to the resistor metallic layer METr illustrated and described with respect to FIG. 26. The gain resistors (e.g., a pair of first input resistors $r_{PIN}$, $r_{PIN}/2$) are coupled to the first transconductance amplifier 510 (a logic circuit element located at the periphery of the semiconductor die) and the gain resistors (e.g., a pair of second input resistors $r_{MIN}$, $r_{MIN}$) are coupled to the second transconductance amplifier 520 (a logic circuit element located at the periphery of the semiconductor die).

Figure 32:
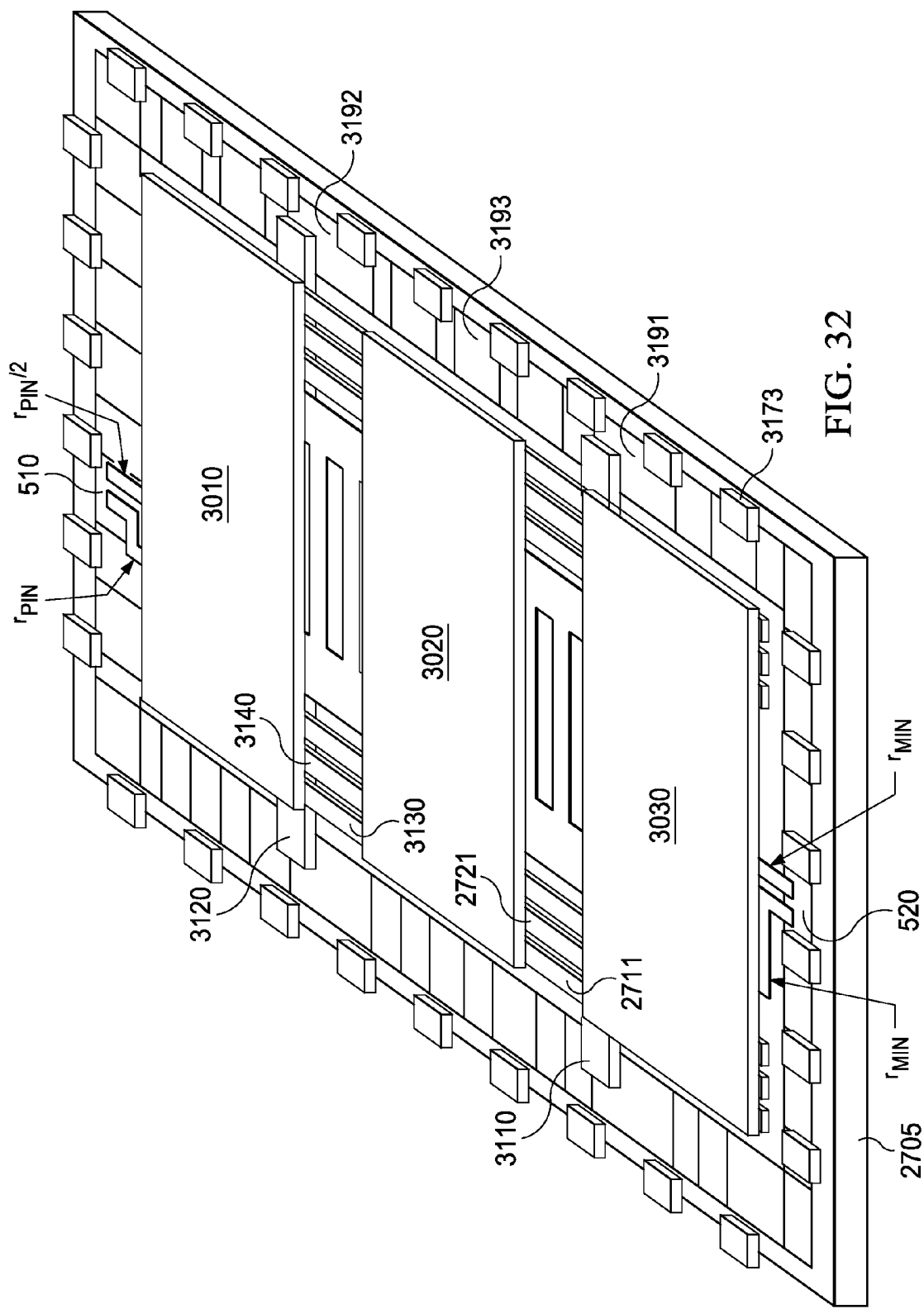
FIG. 32 illustrates a simplified three-dimensional view of the partially constructed semiconductor device including N-LDMOS and P-LDMOS devices illustrating geometry of source contacts and shared drain contact in a third metallic layer.

Turning now to FIG. 32, illustrated is a simplified three-dimensional view of the partially constructed semiconductor device including N-LDMOS and P-LDMOS devices illustrating geometry of source contacts 3010, 3030 and shared drain contact 3020 (i.e., conductive regions) in the third metallic layer M3. Akin to FIG. 31, the lightly P-doped substrate 2705 is illustrated in FIG. 32, but the optional P-well located in an upper portion thereof is not shown. The shared N-LDMOS/P-LDMOS device drain contact 3020 is positioned between the N-LDMOS device source contact 3030 and a P-LDMOS device source contact 3010 in the third metallic layer M3. FIG. 32 also illustrates gate driver and logic circuit element contacts (one of which is designated 3173) that are located at the periphery of the semiconductor device in the third metallic layer M3.

Figure 33:
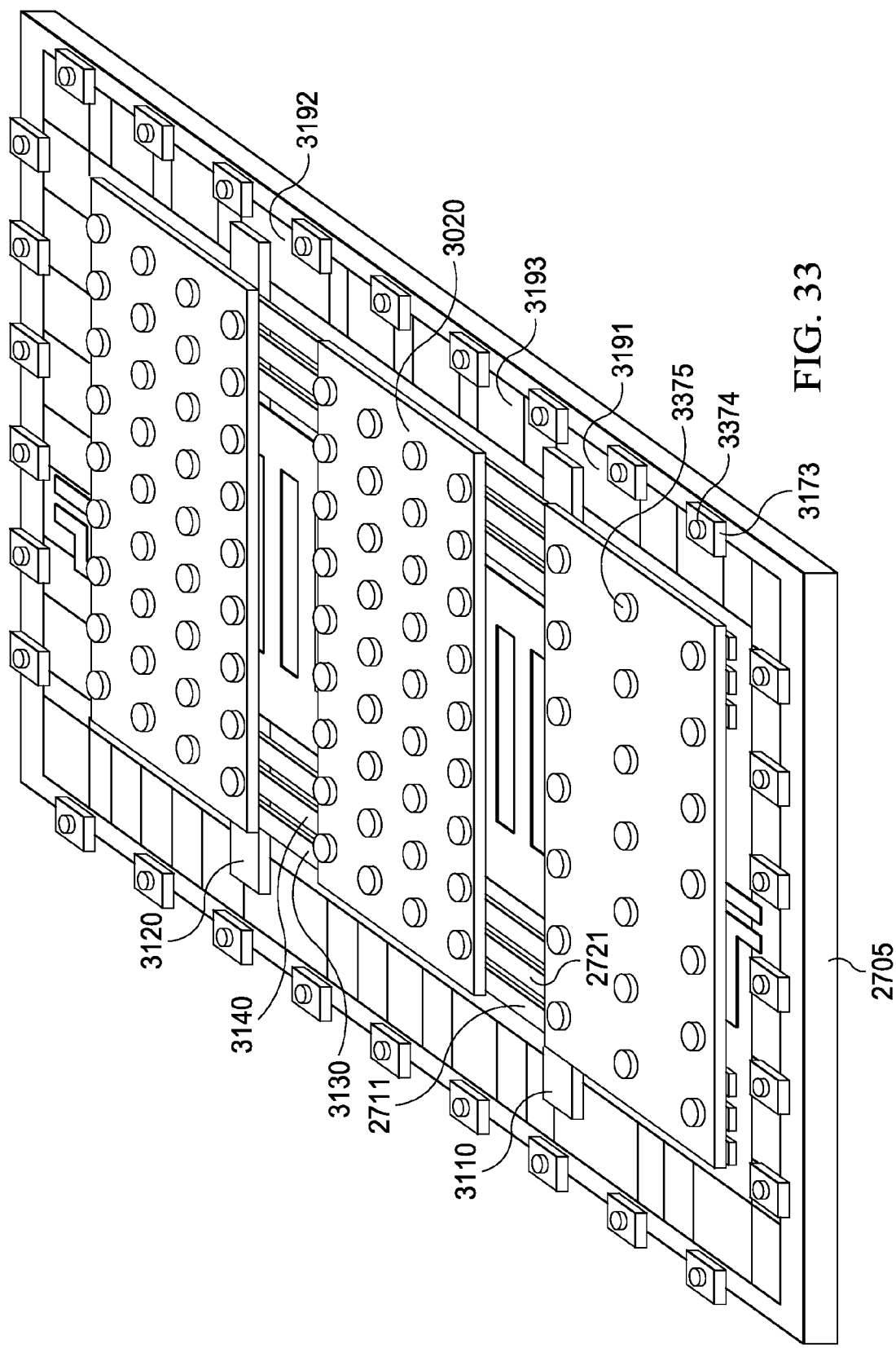
FIG. 33 illustrates a simplified three-dimensional view of the partially constructed semiconductor device including N-LDMOS and P-LDMOS devices illustrating geometry of vias for a redistribution layer.

Turning now to FIG. 33, illustrated is a simplified three-dimensional view of the partially constructed semiconductor device including N-LDMOS and P-LDMOS devices illustrating geometry of vias (e.g., copper vias ones of which are designated 3374, 3375) for a redistribution layer (e.g., a copper redistribution layer). The copper vias such as 3374, 3375 provide electrical contact between the third metallic layer M3 and the redistribution layer as described later hereinbelow. The copper vias 3374, 3375 penetrate an isolation or insulating layer (see, e.g., first polyimide layer 3835 in FIG. 38) that separates and electrically isolates (insulates) the third metallic layer M3 from the redistribution layer.

Figure 34:
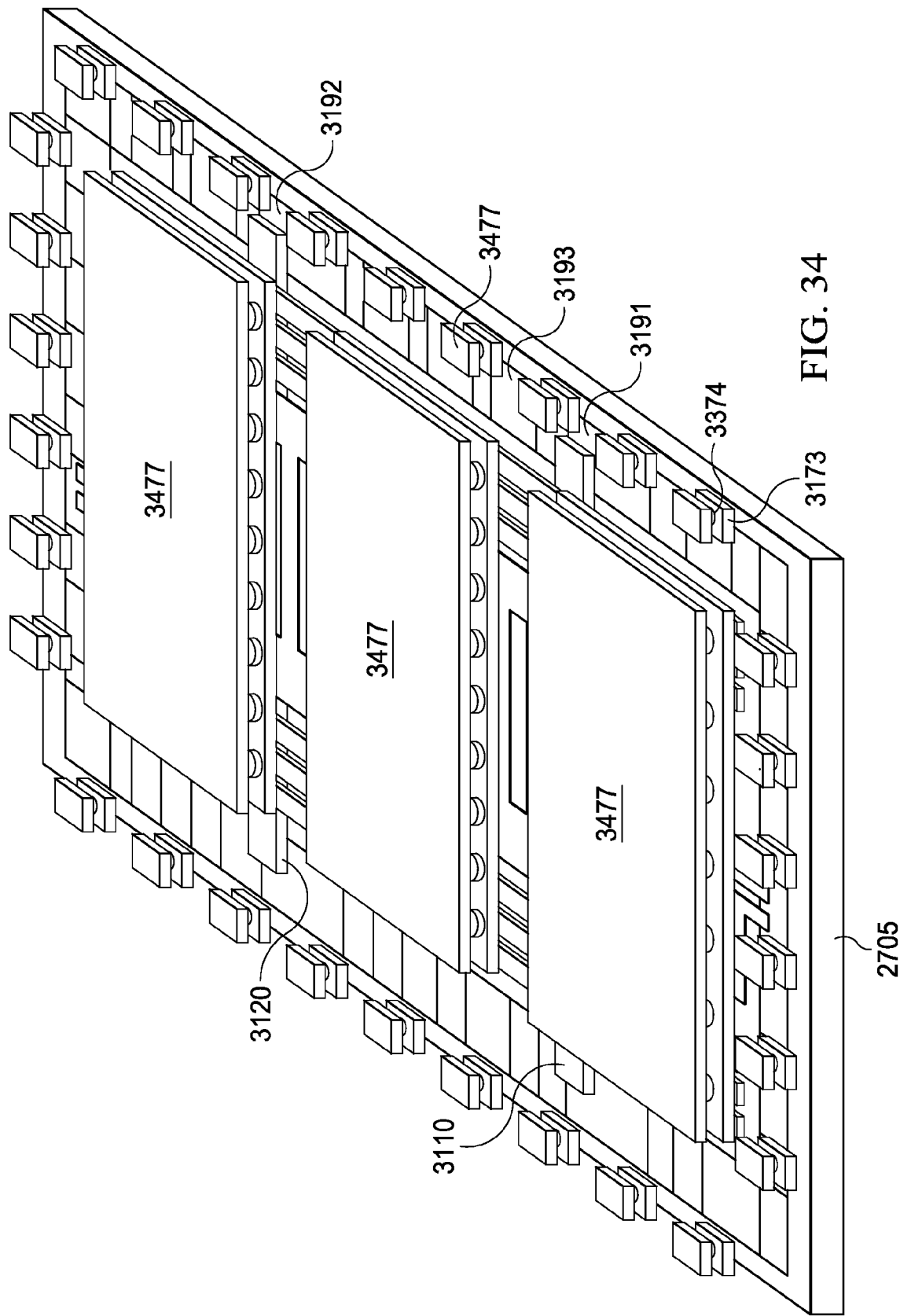
FIG. 34 illustrates a simplified three-dimensional view of the partially constructed semiconductor device including N-LDMOS and P-LDMOS devices illustrating geometry of a redistribution layer.

Turning now to FIG. 34, illustrated is a simplified three-dimensional view of the partially constructed semiconductor device including N-LDMOS and P-LDMOS devices illustrating geometry of a redistribution layer (e.g., a copper redistribution layer) 3477. The redistribution layer 3477 is shown as patterned over respective metallizations on the third metallic layer M3 and electrically coupled to the metallizations on the third metallic layer M3 by the copper vias such as the copper vias 3374, 3375 (see FIG. 33). Again, the redistribution layer 3477 is separated from the third metallic layer M3 by an isolation or insulating layer (see FIG. 38).

Figure 35:
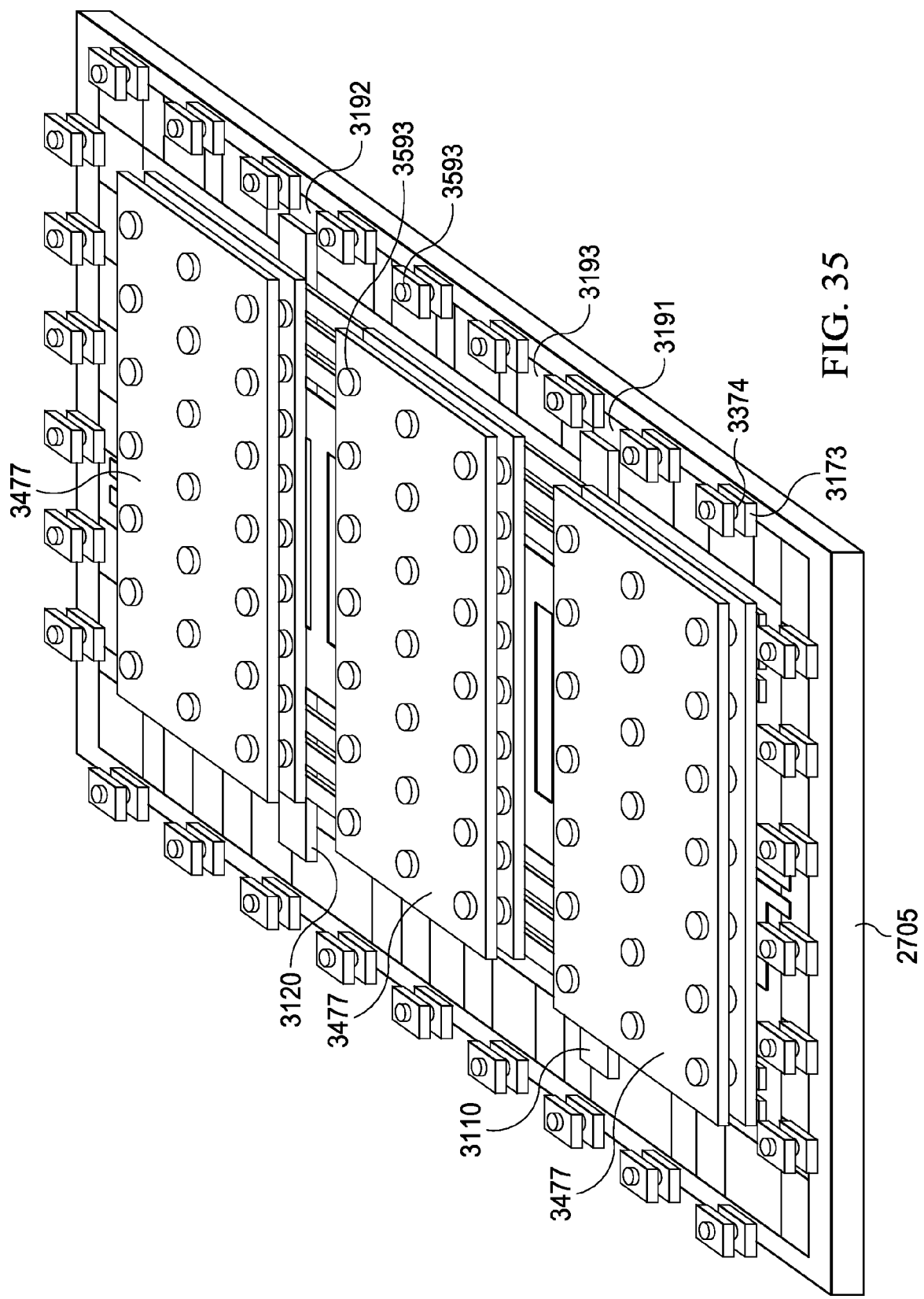
FIG. 35 illustrates a simplified three-dimensional view of the partially constructed semiconductor device including N-LDMOS and P-LDMOS devices illustrating geometry of pillars for the redistribution layer.

Turning now to FIG. 35, illustrated is a simplified three-dimensional view of the partially constructed semiconductor device including N-LDMOS and P-LDMOS devices illustrating geometry of pillars (e.g., copper pillars ones of which are designated 3593) for the redistribution layer 3477. The copper pillars 3593 provide electrical contact between the redistribution layer 3477 and a conductive patterned leadframe.

Figure 36:
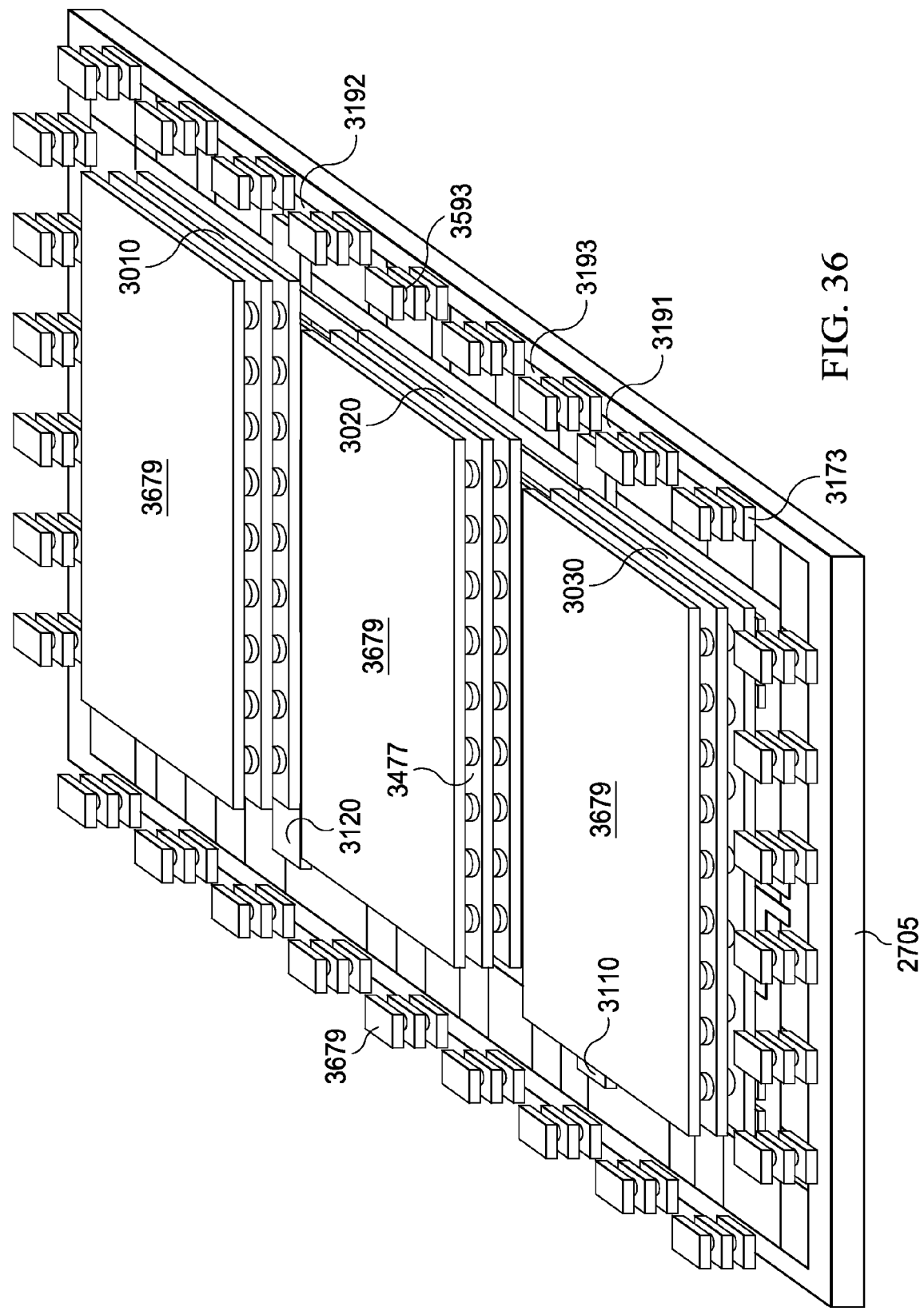
FIG. 36 illustrates a simplified three-dimensional view of the partially constructed semiconductor device including N-LDMOS and P-LDMOS devices illustrating geometry of a conductive patterned leadframe.

Turning now to FIG. 36, illustrated is a simplified three-dimensional view of the partially constructed semiconductor device including N-LDMOS and P-LDMOS devices illustrating geometry of a conductive patterned leadframe 3679. The conductive patterned leadframe 3679 is shown as patterned over the redistribution layer 3477 and electrically coupled to the redistribution layer 3477 by the copper pillars 3593 (see FIG. 35).

Figure 37:
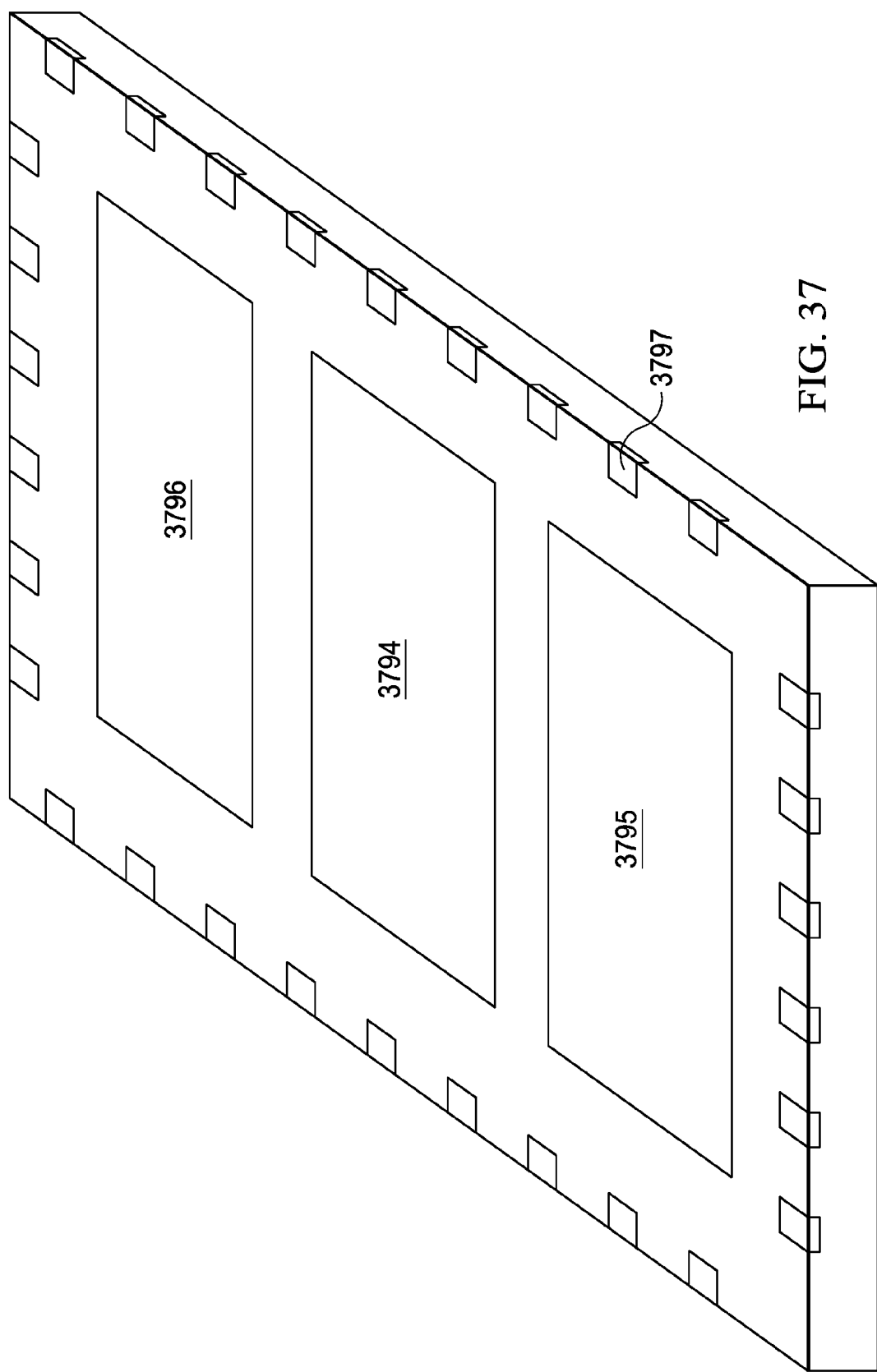
FIG. 37 illustrates a three-dimensional external view of an embodiment of a potted semiconductor device including N-LDMOS and P-LDMOS devices.
Figure 38:
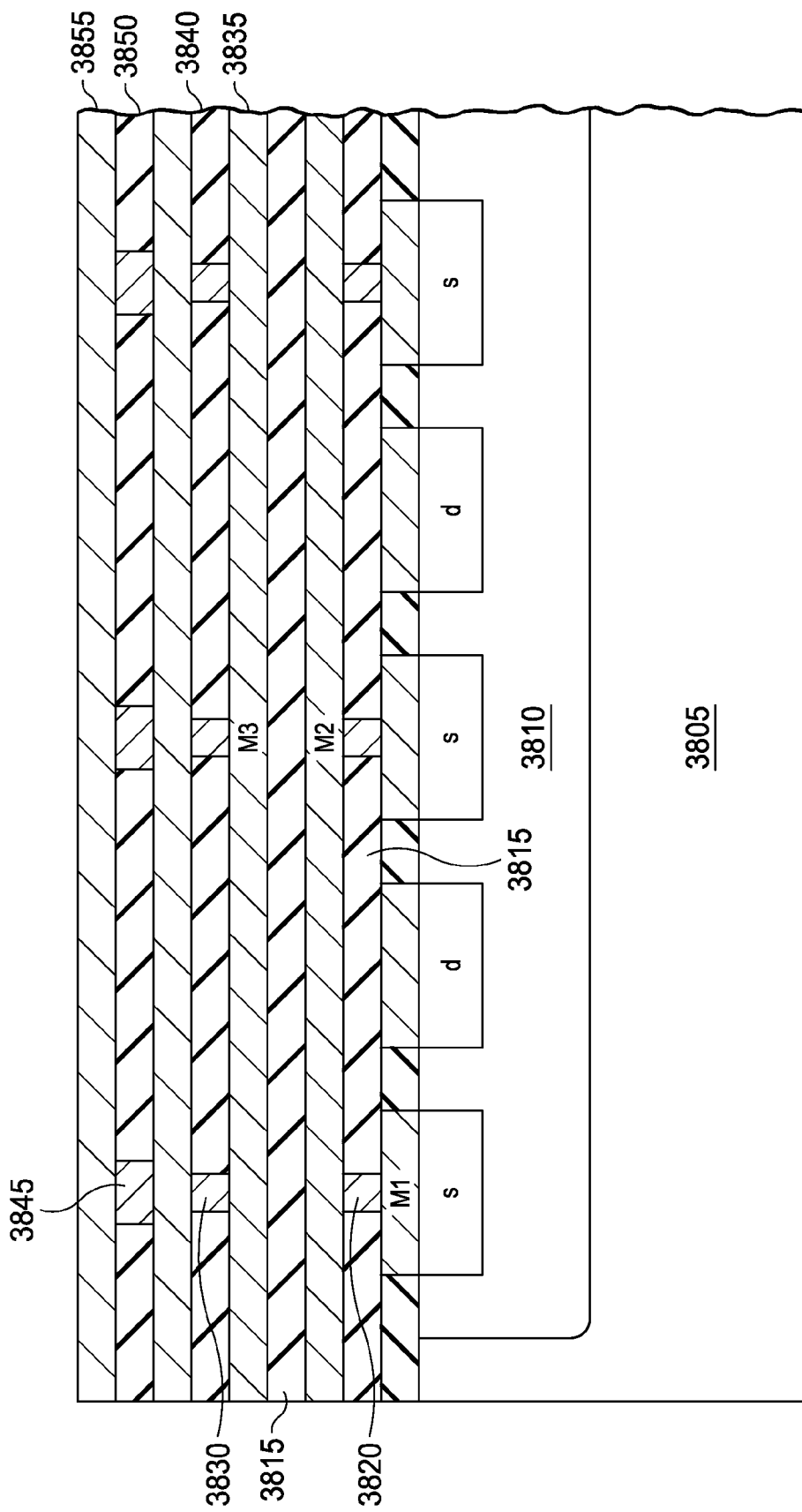
FIG. 38 illustrates an elevational view of an embodiment of a portion of a semiconductor device including N-LDMOS and/or P-LDMOS devices in a region including a resistor metallic layer.

Turning now to FIG. 37, illustrated is a three-dimensional external view of an embodiment of a potted semiconductor device (with an encapsulant such as epoxy) including N-LDMOS and P-LDMOS devices. Portions of the leadframe 3679 (see FIG. 36) are exposed to serve as external contacts for the semiconductor device. An external N-LDMOS/P-LDMOS device drain contact 3794 is positioned between an external N-LDMOS device source contact 3795 and an external P-LDMOS device source contact 3796, and external gate driver and logic circuit element contacts (one of which is designated 3797 and formed on the leadframe 3679) are located about a periphery of the semiconductor device. A potting material employable in an embodiment is an encapsulant such as epoxy, but other potting materials including potting materials with enhanced thermal characteristics are contemplated within the broad scope of the present invention. The external electrical contact surfaces of the semiconductor device can be coated with a copper flash/seed layer and then electroplated with copper to form an easily solderable metallic surface. The external surface can also be plated with a thin layer of gold or other inert metal or alloy to provide a further level of passivation for a soldering or other attachment process. As illustrated and described with respect to FIG. 1, the potted or packaged semiconductor device illustrated in FIG. 37 may be placed on a printed circuit board proximate a decoupling device such as a decoupling capacitor to provide the advantages as set forth above Turning now to FIG. 38, illustrated is an elevational view of an embodiment of a portion of a semiconductor device including N-LDMOS and/or P-LDMOS devices in a region including a resistor metallic layer METr. The N-LDMOS and/or P-LDMOS devices are formed in a semiconductor die including a well 3810 located above a lightly doped substrate 3805 with the doped source regions "s" and drain regions "d" located therein. First, second and third metallic layers M1, M2, M3 are separated and insulated from one another by silicon oxynitride layers (generally designated 3815) and lie above the doped source regions "s" and doped drain regions "d". Vias (one of which is designated 3820) provide electrical contact between metallizations on the first and second metallic layers M1, M2. Copper vias (one of which is designated 3830) are formed in a first polyimide layer 3835 to provide electrical contact between the third metallic layer M3 and a copper redistribution layer 3840 that is formed above the first polyimide layer 3835. Copper pillars (one of which is designated 3845) are formed in a second polyimide layer 3850 to provide electrical contact between the copper redistribution layer 3840 and a copper leadframe 3855 that is formed above the second polyimide layer 3850. It should be understood that the specified materials for the respective layers are only examples and other materials bearing similar or related properties may be employed to advantage.

Thus, a semiconductor device including a resistor metallic layer has been introduced herein. In one embodiment, the semiconductor device includes a source region and a drain region of a semiconductor switch on a substrate and a resistor metallic layer over the source region and the drain region of the semiconductor switch. The resistor metallic layer includes a first resistor including a first resistor metallic strip coupled between a first cross member and a second cross member of the resistor metallic layer. The semiconductor device also includes a source metallic strip between the source region and the resistor metallic layer and the first resistor metallic strip is coupled to the source region through the source metallic strip. The semiconductor device also includes an insulating layer between the source metallic strip and the resistor metallic layer and the first resistor metallic strip is coupled to the source metallic strip by a via through the insulating layer.

In a related embodiment, the resistor metallic layer includes a second resistor metallic strip coupled between the first cross member and the second cross member. The second resistor metallic strip contributes to and/or selectively changes a resistance value of the first resistor. The resistor metallic layer may also include a second resistor including a second resistor metallic strip coupled to the first cross member. The second resistor metallic strip includes a first serpentine metallic pattern. The second resistor may also be coupled to a logic circuit element located at a periphery of the semiconductor device. The resistor metallic layer may also include a third resistor including a third resistor metallic strip coupled to the second cross member. The second resistor metallic strip includes the first serpentine metallic pattern and the third resistor metallic strip includes a second serpentine metallic pattern.

In another embodiment, the semiconductor device includes a source region and a drain region of a power switch on a substrate, and a resistor metallic layer over the source region and the drain region of the power switch. The resistor metallic layer includes a current sense resistor with a first current sense resistor metallic strip coupled between a first cross member and a second cross member, and a first gain resistor including a first gain resistor metallic strip coupled to the first cross member. The semiconductor device also includes an amplifier over the substrate (e.g., located at a periphery of the semiconductor device) and coupled to the first gain resistor metallic strip. The semiconductor device also includes a second gain resistor with a second gain resistor metallic strip coupled to the second cross member. The amplifier is coupled to the second gain resistor metallic strip. The first gain resistor metallic strip may include a first serpentine metallic pattern and the second gain resistor metallic strip may include a second serpentine metallic pattern.

In a related embodiment, the semiconductor device includes a source metallic strip between the source region and the resistor metallic layer. The first current sense resistor metallic strip is coupled to the source region through the source metallic strip. The semiconductor device also includes an insulating layer between the source metallic strip and the resistor metallic layer. The first current sense resistor metallic strip is coupled to the source metallic strip by a via through the insulating layer. The resistor metallic layer may include a second current sense resistor metallic strip coupled between the first cross member and the second cross member. The second current sense resistor metallic strip contributes to and/or selectively changes a resistance value of the current sense resistor.

In another embodiment, the semiconductor device includes a first source region and a first drain region of a first power switch on a substrate, and a second source region and a second drain region of a second power switch on the substrate. The semiconductor device also includes a resistor metallic layer over the first source region and the first drain region of the first power switch and over the second source region and the second drain region of the second power switch. The resistor metallic layer includes a first current sense resistor with a first current sense resistor metallic strip coupled between a first cross member and a second cross member, and a first gain resistor with a first gain resistor metallic strip coupled to the first cross member. The resistor metallic layer also includes a second current sense resistor with a second current resistor metallic strip coupled between a third cross member and a fourth cross member, and a second gain resistor with a second gain resistor metallic strip coupled to the third cross member. The semiconductor device also includes a first amplifier over the substrate (e.g., located at a periphery of the semiconductor device) and coupled to the first gain resistor metallic strip, and a second amplifier over the substrate (e.g., located at a periphery of the semiconductor device) and coupled to the second gain resistor metallic strip.

In a related embodiment, the resistor metallic layer further includes third and fourth gain resistors with third and fourth gain resistor metallic strips, respectively, coupled to the second and fourth cross members, respectively. The first and second amplifiers are coupled to the third and fourth gain resistor metallic strips, respectively. Ones of the first, second, third and fourth gain resistor metallic strips include different serpentine metallic patterns to vary a resistance thereof. The semiconductor device also includes a first source metallic strip between the first source region and the resistor metallic layer and a second source metallic strip between the second source region and the resistor metallic layer. The first current sense resistor metallic strip is coupled to the first source region through the first source metallic strip and the second current sense resistor metallic strip is coupled to the second source region through the second source metallic strip. The semiconductor device may also include an insulating layer between the first and second source metallic strips and the resistor metallic layer. The first current sense resistor metallic strip is coupled to the first source metallic strip by a via through the insulating layer and the second current sense resistor metallic strip is coupled to the second source metallic strip by another via through the insulating layer. The resistor metallic layer may also include a third current sense resistor metallic strip coupled between the first cross member and the second cross member. The third current sense resistor metallic strip contributes to and/or selectively changes a resistance value of the first current sense resistor.

In another embodiment, the semiconductor device includes a first resistor formed in a resistor metallic layer (e.g., aluminum) on a semiconductor die and positioned above a power switch of a power converter. The first resistor is configured to sense a first input current to the power converter. The semiconductor device also includes a second resistor formed in the resistor metallic layer and electrically coupled between the first current sense resistor and an input to a first transconductance amplifier. The first resistor includes a plurality of resistor metallic strips formed in parallel in the resistor metallic layer and extending between two nodes formed therein, and the second resistor includes a serpentine pattern in the resistor metallic layer. The semiconductor device also includes a metallic strip formed in another metallic layer above and in electrical contact with a source region of the power switch. The metallic strip is electrically coupled to at least one of the plurality of resistor metallic strips by vias. A number of the plurality of resistor metallic strips may be selectively opened to produce a resistance value for the first current sense resistor. A geometry of the serpentine pattern for the second resistor is selected to produce a resistance value for the second resistor.

The semiconductor device also includes a third resistor formed in the resistor metallic layer and positioned above another power switch of the power converter. The third resistor includes another plurality of parallel resistor metallic strips formed in the resistor metallic layer and extending between two other nodes formed therein the metallic layer. The third resistor is configured to sense a second input current to the power converter. semiconductor device also includes a fourth resistor formed in the resistor metallic layer, and electrically coupled between the third resistor and an input to a second transconductance amplifier.

Those skilled in the art should understand that the previously described embodiments of an integrated current replicator and related methods of operating and constructing the same are submitted for illustrative purposes only. While the integrated current replicator has been described in the environment of power electronics, other applications are well within the broad scope of the present invention.

For a better understanding of integrated circuits, semiconductor devices and methods of manufacture therefor see "Semiconductor Device Fundamentals," by R. F. Pierret, Addison-Wesley (1996), and "Handbook of Sputter Deposition Technology," by K. Wasa and S. Hayakawa, Noyes Publications (1992). For a better understanding of power converters, see "Modern DC-to-DC Switchmode Power Converter Circuits," by Rudolph P. Severns and Gordon Bloom, Van Nostrand Reinhold Company, New York, N.Y. (1985) and "Principles of Power Electronics," by J. G.

Kassakian, M. F. Schlecht, and G. C. Verghese, Addison-Wesley (1991). The aforementioned references are incorporated herein by reference in their entirety.

Also, although the present invention and its advantages have been described in detail, it should be understood that various changes, substitutions, and alterations can be made herein without departing from the spirit and scope of the invention as defined by claims on embodiments. For example, many of the processes discussed above can be implemented in different methodologies and replaced by other processes, or a combination thereof. In accordance with standard practices in the semiconductor industry, various features in this and subsequent drawings are not drawn to scale. The dimensions of the various features may be arbitrarily increased or decreased for clarity of the discussion herein, and like reference numbers may be employed for analogous features of different devices that make up the semiconductor device.

Moreover, the scope of the present application is not intended to be limited to the particular embodiments of the process, machine, manufacture, composition of matter, means, methods, and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, claims on embodiments are intended to include within their scope such processes, machines, manufacture, compositions of matter, means, methods, or steps.

What is claimed is:

1. A semiconductor device, comprising:
    a source region and a drain region of a semiconductor switch on a substrate; and
    a resistor metallic layer over said source region and said drain region of said semiconductor switch, said resistor metallic layer comprising a first resistor including a first resistor metallic strip coupled between a first cross member and a second cross member.

2. The semiconductor device as recited in claim 1 further comprising a source metallic strip between said source region and said resistor metallic layer, said first resistor metallic strip being coupled to said source region through said source metallic strip.

3. The semiconductor device as recited in claim 2 further comprising an insulating layer between said source metallic strip and said resistor metallic layer, said first resistor metallic strip being coupled to said source metallic strip by a via through said insulating layer.

4. The semiconductor device as recited in claim 1 wherein said resistor metallic layer includes a second resistor metallic strip coupled between said first cross member and said second cross member.

5. The semiconductor device as recited in claim 4 wherein said second resistor metallic strip contributes to a resistance value of said first resistor.

6. The semiconductor device as recited in claim 1 wherein said resistor metallic layer comprises a second resistor including a second resistor metallic strip coupled to said first cross member.

7. The semiconductor device as recited in claim 6 wherein said second resistor metallic strip comprises a first serpentine metallic pattern.

8. The semiconductor device as recited in claim 6 wherein said second resistor is coupled to a logic circuit element located at a periphery of said semiconductor device.

9. The semiconductor device as recited in claim 6 wherein said resistor metallic layer comprises a third resistor including a third resistor metallic strip coupled to said second cross member.

10. The semiconductor device as recited in claim 9 wherein said second resistor metallic strip comprises a first serpentine metallic pattern and said third resistor metallic strip comprises a second serpentine metallic pattern.

11. A semiconductor device, comprising:
    a source region and a drain region of a semiconductor switch on a substrate;
    a first metallic layer comprising a source metallic strip over said source region and a drain metallic strip over said drain region;
    an insulating layer over said first metallic layer; and
    a second metallic layer over said insulating layer, said second metallic layer comprising a resistor metallic layer over said source metallic strip and said drain metallic strip, said resistor metallic layer comprising a first resistor including a first resistor metallic strip coupled between a first cross member and a second cross member.

12. The semiconductor device as recited in claim 11 wherein said first resistor metallic strip is coupled to said source region through said source metallic strip.

13. The semiconductor device as recited in claim 11 wherein said first resistor metallic strip is coupled to said source metallic strip by a via through said insulating layer.

14. The semiconductor device as recited in claim 11 wherein said resistor metallic layer includes a second resistor metallic strip coupled between said first cross member and said second cross member.

15. The semiconductor device as recited in claim 14 wherein said second resistor metallic strip contributes to a resistance value of said first resistor.

16. The semiconductor device as recited in claim 11 wherein said resistor metallic layer comprises a second resistor including a second resistor metallic strip coupled to said first cross member.

17. The semiconductor device as recited in claim 16 wherein said second resistor metallic strip comprises a first serpentine metallic pattern.

18. The semiconductor device as recited in claim 16 wherein said second resistor is coupled to a logic circuit element located at a periphery of said semiconductor device.

19. The semiconductor device as recited in claim 16 wherein said resistor metallic layer comprises a third resistor including a third resistor metallic strip coupled to said second cross member.

20. The semiconductor device as recited in claim 19 wherein said second resistor metallic strip comprises a first serpentine metallic pattern and said third resistor metallic strip comprises a second serpentine metallic pattern.

* * * * *

UNITED STATES PATENT AND TRADEMARK OFFICE
CERTIFICATE OF CORRECTION

PATENT NO. : 9,536,938 B1  
APPLICATION NO. : 14/671956  
DATED : January 3, 2017  
INVENTOR(S) : Douglas Dean Lopata et al.

Page 1 of 1

It is certified that error appears in the above-identified patent and that said Letters Patent is hereby corrected as shown below:

On the Title Page

Inventor name, "Miguel Angel Rojas-Gonzales," should be revised to read --Miguel Angel Rojas-Gonzalez."

Signed and Sealed this  
Fourteenth Day of March, 2017

Michelle K. Lee  
*Director of the United States Patent and Trademark Office*